(12) United States Patent
Yamada et al.

(10) Patent No.: US 9,921,479 B2
(45) Date of Patent: Mar. 20, 2018

(54) RESIST COMPOSITION AND PATTERNING PROCESS

(71) Applicant: Shin-Etsu Chemical Co., Ltd., Tokyo (JP)

(72) Inventors: Kenji Yamada, Joetsu (JP); Satoshi Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/139,831

(22) Filed: Apr. 27, 2016

(65) Prior Publication Data

US 2016/0320699 A1 Nov. 3, 2016

(30) Foreign Application Priority Data

Apr. 28, 2015 (JP) ................. 2015-091338

(51) Int. Cl.
| | |
|---|---|
| *G03F 7/039* | (2006.01) |
| *G03F 7/32* | (2006.01) |
| *G03F 7/16* | (2006.01) |
| *G03F 7/38* | (2006.01) |
| *G03F 7/20* | (2006.01) |

(Continued)

(52) U.S. Cl.
CPC .......... *G03F 7/0397* (2013.01); *G03F 7/0045* (2013.01); *G03F 7/0046* (2013.01); *G03F 7/0048* (2013.01); *G03F 7/0392* (2013.01); *G03F 7/11* (2013.01); *G03F 7/168* (2013.01); *G03F 7/2041* (2013.01); *G03F 7/2059* (2013.01); *G03F 7/325* (2013.01); *G03F 7/38* (2013.01)

(58) Field of Classification Search
None
See application file for complete search history.

(56) References Cited

U.S. PATENT DOCUMENTS

| | | | |
|---|---|---|---|
| 6,395,453 B1 * | 5/2002 | Kaneko | C08G 59/1466 430/280.1 |
| 7,998,655 B2 | 8/2011 | Tsubaki | |

(Continued)

FOREIGN PATENT DOCUMENTS

| | | |
|---|---|---|
| JP | 09-297401 A | 11/1997 |
| JP | 2008-281974 A | 11/2008 |

(Continued)

OTHER PUBLICATIONS

Machine-assisted English translation of JP 2010-152068 provided by JPO (2010).*

(Continued)

*Primary Examiner* — Sin J Lee
(74) *Attorney, Agent, or Firm* — Westerman, Hattori, Daniels & Adrian, LLP

(57) ABSTRACT

A pattern is formed by coating a resist composition comprising (A) a PPD inhibitor, (B) a polymer adapted to change its solubility in an organic solvent under the action of acid, (C) a photoacid generator, and (D) an organic solvent onto a substrate, baking, exposing the resist film, PEB, and developing in an organic solvent developer. The resist composition ensures to form a pattern in a consistent manner while inhibiting any CD shrinkage and pattern profile change due to a delay from PEB to development.

12 Claims, 1 Drawing Sheet

(51) Int. Cl.
　　　*G03F 7/11*　　(2006.01)
　　　*G03F 7/004*　(2006.01)

(56) References Cited

U.S. PATENT DOCUMENTS

| | | | |
|---|---|---|---|
| 8,017,198 B2 | 9/2011 | Ovshinsky | |
| 8,034,547 B2 | 10/2011 | Tsubaki et al. | |
| 8,227,183 B2 | 7/2012 | Tsubaki et al. | |
| 8,241,840 B2 | 8/2012 | Tsubaki et al. | |
| 2005/0233242 A1* | 10/2005 | Yamanaka | G03F 7/0045 430/270.1 |
| 2008/0081288 A1* | 4/2008 | Kawanishi | C07D 333/76 430/281.1 |
| 2010/0209827 A1 | 8/2010 | Ohashi et al. | |
| 2010/0221659 A1* | 9/2010 | Ebata | C07C 309/19 430/270.1 |
| 2010/0304295 A1* | 12/2010 | Kinsho | C07C 69/54 430/270.1 |
| 2012/0052449 A1* | 3/2012 | Kato | G03F 7/0045 430/325 |
| 2013/0101812 A1* | 4/2013 | Kamimura | G03F 7/32 428/195.1 |
| 2014/0045123 A1* | 2/2014 | Sagehashi | G03F 7/038 430/285.1 |

FOREIGN PATENT DOCUMENTS

| | | | |
|---|---|---|---|
| JP | 2008-281975 | A | 11/2008 |
| JP | 2008-309879 | A | 12/2008 |
| JP | 2010-152068 | * | 7/2010 |
| JP | 2010-215608 | A | 9/2010 |
| JP | 4554665 | B2 | 9/2010 |
| JP | 4590431 | B2 | 12/2010 |

OTHER PUBLICATIONS

Tarutani et al., "Process parameter influence to negative tone development process for double patterning", Proc. or SPIE, 2010, vol. 7639, 76391Q, (8 pages).

Chen et al., "PEB to Development Delay Influence on Contact Patterning by Negative Tone Development Process", Proc. of SPIE, 2013, vol. 8682, 86821P, (10 pages).

Extended European Search Report dated May 16, 2017, issued in counterpart European Patent Application No. 16164164.2. (8 pages).

* cited by examiner

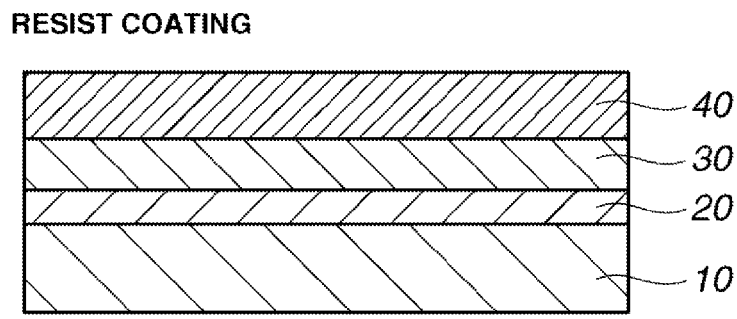
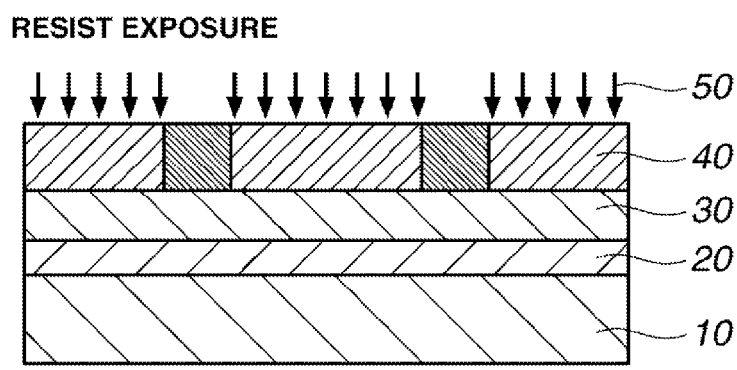
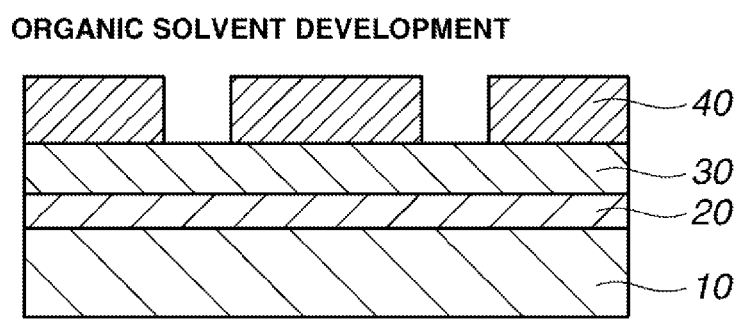

RESIST COMPOSITION AND PATTERNING PROCESS

CROSS-REFERENCE TO RELATED APPLICATION

This non-provisional application claims priority under 35 U.S.C. § 119(a) on Patent Application No. 2015-091338 filed in Japan on Apr. 28, 2015, the entire contents of which are in hereby incorporated by reference.

TECHNICAL FIELD

This invention relates to a resist composition and a pattern forming process. More particularly, it relates to a resist composition which even when there is a delay between post-exposure bake (PEB) and organic solvent development, is effective for suppressing the profile change of a late developed pattern from an immediately developed pattern, and a pattern forming process.

BACKGROUND ART

In the lithography art, a highlight is recently put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the resist composition for negative tone development with organic solvent, positive resist compositions of the prior art design may be used. Such pattern forming processes are described in Patent Documents 1 to 3. These patent documents disclose resist compositions for organic solvent development comprising a copolymer of hydroxyadamantane methacrylate, a copolymer of norbornane lactone methacrylate, and a copolymer of methacrylate having acidic groups including carboxyl, sulfo, phenol and thiol groups substituted with two or more acid labile groups, and pattern forming processes using the same.

Further, Patent Document 4 discloses a process for forming a pattern through organic solvent development in which a protective film is applied onto a resist film. Patent Document 5 discloses a topcoat less process for forming a pattern through organic solvent development in which an additive is added to a resist composition so that the additive may segregate at the resist film surface after spin coating to provide the surface with improved water repellency.

The negative tone pattern forming process is also useful in enhancing the resolution of trench patterns. Since a high optical contrast is available where the pattern design on the mask is isolated lines (i.e., bright-field mask), as compared with where the pattern design on the mask is isolated trenches (i.e., dark-field mask), the negative tone patterning process involving reversal of line image is more advantageous in forming trench patterns. See Non-Patent Document 1.

However, since the organic solvent development is unlike the conventional positive tone development, at a device supplier's manufacturing site or the like, the negative tone pattern forming process has not completed transition to the in-line development system wherein the exposure tool is directly connected to the organic solvent developing unit. In such cases, the negative tone development is performed by an off-line development system. Namely, after PEB, the wafer is transferred to a separate development unit where development is carried out.

In the off-line development system, there is a lapse of time, known as post exposure bake to development delay (PEBDD) or post PEB delay (PPD), until the wafer is transferred to the separate development unit. Since the acid generated in the exposed region of resist film is kept in the state that it has been diffused by PEB, the acid will diffuse into the unexposed region during the delay, until the start of development.

It is pointed out in Non-Patent Document 2 that the diffusion of acid into the unexposed region during PPD causes shrinkage of the critical dimension (CD) of a pattern. It is also empirically known that a change of pattern profile concomitant with the shrinkage of CD leads to the degradation of lithography performance as evidenced by an edge roughness increase.

The amount of CD shrinkage due to PPD varies with a lapse of time. The PPD is not consistent depending on a particular progress of operation at a manufacturing site. It is important how to reduce a change with the lapse of time. There is a strong demand for a resist composition which is satisfactory in lithography performance and experiences a minimal CD shrinkage and a minimal change of pattern profile during PPD.

Citation List

| | |
|---|---|
| Patent Document 1: | JP-A 2008-281974 |
| Patent Document 2: | JP-A 2008-281975 |
| Patent Document 3: | JP 4554665 |
| Patent Document 4: | JP 4590431 |
| Patent Document 5: | JP-A 2008-309879 |
| Patent Document 6: | JP-A 2010-215608 (US 20100209827) |
| Non-Patent Document 1: | Proc. SPIE Vol. 7639, 76391Q (2010) |
| Non-Patent Document 2: | Proc. SPIE Vol. 8682, 86821P (2013) |

DISCLOSURE OF INVENTION

An object of the invention is to provide a resist composition which can form a pattern in a consistent manner while suppressing a CD shrinkage and a change of pattern profile with a lapse of time. Another object is to provide a process for forming a pattern using the resist composition.

The inventors have found that by adding a compound of specific structure for suppressing acid diffusion during PPD to a resist composition, the CD shrinkage and pattern profile change during PPD can be reduced without significantly affecting lithography performance.

In one aspect, the invention provides a resist composition comprising (A) a compound, (B) a resin adapted to change its solubility in an organic solvent base developer under the action of acid, and (C) a photoacid generator. The compound (A) has the formula (1):

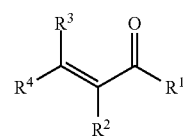

(1)

wherein $R^1$ to $R^4$ are each independently hydrogen, hydroxyl, or a straight, branched or cyclic $C_1$-$C_{20}$ monovalent hydrocarbon group which may contain a heteroatom, $R^1$ to $R^4$ may bond together to form a ring with the carbon atom to which they are attached and any intervening carbon atom.

The resin (B) comprises recurring units having the formula (2) and recurring units having the formula (3):

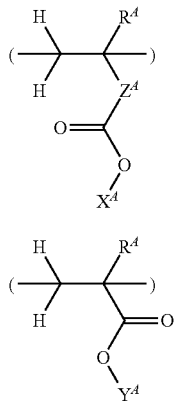
(2)

(3)

wherein $R^A$ is hydrogen, fluorine, methyl or trifluoromethyl, $Z^A$ is a single bond, phenylene, naphthylene, or —C(=O)—O—Z'—, Z' is a straight, branched or cyclic $C_1$-$C_{10}$ alkylene group which may contain a hydroxy moiety, ether bond, ester bond or lactone ring, or phenylene or naphthylene group, $X^A$ is an acid labile group, and $Y^A$ is hydrogen or a polar group having at least one structure selected from the group consisting of hydroxy, cyano, carbonyl, carboxyl, ether bond, ester bond, sulfonic acid ester bond, carbonate bond, lactone ring, sultone ring, and carboxylic acid anhydride.

In a preferred embodiment, the photoacid generator (C) has the formula (4) or (5):

$$M^+X^- \quad (4)$$

wherein $M^+$ is a sulfonium cation of the formula (4a) or iodonium cation of the formula (4b):

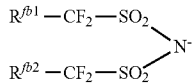
(4a)

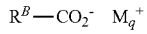
(4b)

wherein $R^{100}$, $R^{200}$ and $R^{300}$ are each independently a straight, branched or cyclic $C_1$-$C_{20}$ monovalent hydrocarbon group which may contain a heteroatom, any two or more of $R^{100}$, $R^{200}$ and $R^{300}$ may bond together to form a ring with the sulfur atom to which they are attached, $R^{400}$ and $R^{500}$ are each independently a straight, branched or cyclic $C_1$-$C_{20}$ monovalent hydrocarbon group which may contain a heteroatom, and $X^-$ is an anion selected from the formulae (4c) to (4f):

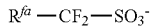
(4c)

(4d)

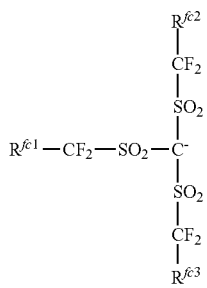
(4e)

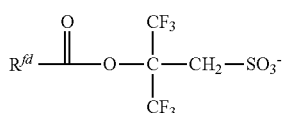
(4f)

wherein $R^{fa}$, $R^{fb1}$, $R^{fb2}$, $R^{fc1}$, $R^{fc2}$ and $R^{fc3}$ are each independently fluorine or a straight, branched or cyclic $C_1$-$C_{40}$ monovalent hydrocarbon group which may contain a heteroatom, or a pair of $R^{fb1}$ and $R^{fb2}$, or $R^{fc1}$ and $R^{fc2}$ may bond together to form a ring with the carbon atom to which they are attached and any intervening atoms, $R^{fd}$ is a straight, branched or cyclic $C_1$-$C_{40}$ monovalent hydrocarbon group which may contain a heteroatom,

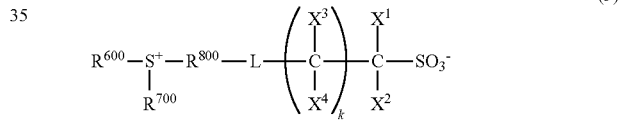
(5)

wherein $R^{600}$ and $R^{700}$ are each independently a straight, branched or cyclic $C_1$-$C_{20}$ monovalent hydrocarbon group which may contain a heteroatom, $R^{800}$ is a straight, branched or cyclic $C_1$-$C_{20}$ divalent hydrocarbon group which may contain a heteroatom, any two or more of $R^{600}$, $R^{700}$ and $R^{800}$ may bond together to form a ring with the sulfur atom to which they are attached, L is a single bond or linking group, $X^1$ and $X^2$ are each independently fluorine or trifluoromethyl, $X^3$ and $X^4$ are each independently hydrogen, fluorine or trifluoromethyl, and k is an integer of 0 to 3.

In a preferred embodiment, the resist composition further comprises (D) an organic solvent, (E) a hydrophobic fluororesin, and/or (F) at least one compound selected from the formulae (6a), (6b) and (6c).

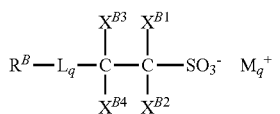
(6a)

$$Ar-SO_3^- \quad M_q^+ \quad (6b)$$

$$R^B-CO_2^- \quad M_q^+ \quad (6c)$$

Herein Mq⁺ is a sulfonium cation of the formula (4a), iodonium cation of the formula (4b), or ammonium cation, $R^B$ is a straight, branched or cyclic $C_1$-$C_{40}$ monovalent hydrocarbon group which may contain a heteroatom, $X^{81}$, $X^{82}$, $X^{83}$ and $X^{84}$ are each independently hydrogen or a straight, branched or cyclic $C_1$-$C_{40}$ monovalent hydrocarbon group which may contain a heteroatom, exclusive of trifluoromethyl, Lq is a single bond or linking group, and Ar is an optionally substituted aromatic ring,

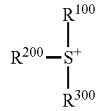

(4a)

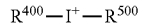

(4b)

wherein $R^{100}$, $R^{200}$ and $R^{300}$ are each independently a straight, branched or cyclic $C_1$-$C_{20}$ monovalent hydrocarbon group which may contain a heteroatom, any two or more of $R^{100}$, $R^{200}$ and $R^{300}$ may bond together to form a ring with the sulfur atom to which they are attached, $R^{400}$ and $R^{500}$ are each independently a straight, branched or cyclic $C_1$-$C_{20}$ monovalent hydrocarbon group which may contain a heteroatom.

The resist composition may further comprise a basic compound selected from the group consisting of primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and mixtures thereof.

In another aspect, the invention provides a process for forming a pattern, comprising the steps of coating the resist composition defined above onto a substrate, prebaking the coating to form a resist film, exposing the resist film to ArF excimer laser, EB or EUV, baking, and developing the resist film in a developer.

In a preferred embodiment, the exposure step is performed by immersion lithography while keeping a liquid having a refractive index of at least 1.0 between the resist film and a projection lens. In this embodiment, the process may further comprise the step of coating a protective film on the resist film, wherein the liquid is kept between the protective film and the projection lens.

In a preferred embodiment, the developer comprises an organic solvent and the development step is to form a negative pattern.

In a preferred embodiment, the organic solvent is selected from the group consisting of 2-octanone, 3-octanone, 4-octanone, 2-nonanone, 3-nonanone, 4-nonanone, 5-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, 2-ethylcyclohexanone, 3-ethylcyclohexanone, 4-ethylcyclohexanone, acetophenone, 2'-methylacetophenone, 4'-methylacetophenone, 2'-ethylacetophenone, 4'-ethylacetophenone, ethyl n-butyl ketone, di-n-butyl ketone, propyl acetate, butyl acetate, isobutyl acetate, pentyl acetate, isopentyl acetate, butenyl acetate, phenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, 2-phenylethyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, t-butyl valerate, pentyl valerate, isopentyl valerate, ethyl isovalerate, propyl isovalerate, isopropyl isovalerate, butyl isovalerate, isobutyl isovalerate, t-butyl isovalerate, isopentyl isovalerate, ethyl 2-methylvalerate, butyl 2-methylvalerate, ethyl pivalate, propyl pivalate, isopropyl pivalate, butyl pivalate, t-butyl pivalate, ethyl pentenoate, propyl pentenoate, isopropyl pentenoate, butyl pentenoate, t-butyl pentenoate, propyl crotonate, isopropyl crotonate, butyl crotonate, t-butyl crotonate, butyl propionate, isobutyl propionate, t-butyl propionate, ethyl hexanoate, allyl hexanoate, propyl butyrate, butyl butyrate, isobutyl butyrate, 3-methylbutyl butyrate, t-butyl butyrate, ethyl 2-methylbutyrate, isopropyl 2-methylbutyrate, propyl benzoate, butyl benzoate, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 4-methyl-1-pentanol, 4-methyl-2-pentanol, 4-methyl-3-pentanol, cyclohexanol, 1-octanol, and mixtures thereof.

Advantageous Effects of Invention

The resist composition comprising a compound of formula (1) is successful in reducing the CD shrinkage and pattern profile change during a delay from PEB to organic solvent development.

BRIEF DESCRIPTION OF DRAWINGS

FIGS. 1A, 1B and 1C show in cross-sectional view a patterning process according one embodiment of the invention, FIG. 1A showing a resist film disposed on a substrate, FIG. 1B showing the resist film during exposure, and FIG. 1C showing the resist film during organic solvent development.

DESCRIPTION OF EMBODIMENTS

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. As used herein, the term "film" is used interchangeably with "coating" or "layer." In the chemical formulae, Me stands for methyl, Ac for acetyl, and Ph for phenyl.

The abbreviations and acronyms have the following meaning.

Mw: weight average molecular weight
Mn: number average molecular weight
Mw/Mn: molecular weight distribution or dispersity
GPC: gel permeation chromatography
PAG: photoacid generator
PEB: post-exposure bake
PPD: post PEB delay Briefly stated, the resist composition is defined as comprising (A) a compound, (B) a resin adapted to change its solubility in an organic solvent base developer under the action of acid, and (C) a photoacid generator.

Component A

Component (A) is a compound having the following formula (1).

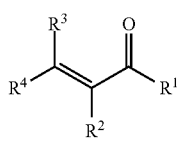
(1)

The compound of formula (1) has a function of mitigating CD shrinkage and pattern profile change during PPD. In this sense, the compound of formula (1) is also referred to as "PPD inhibitor."

In formula (1), $R^1$ to $R^4$ are each independently hydrogen, hydroxyl, or a straight, branched or cyclic $C_1$-$C_{20}$ monovalent hydrocarbon group which may contain a heteroatom. $R^1$ to $R^4$ may bond together to form a ring with the carbon atom to which they are attached and an intervening carbon atom (s) if any.

Typical of the monovalent hydrocarbon group are alkyl groups such as methyl, ethyl, propyl, isopropyl, n-butyl, s-butyl, t-butyl, t-pentyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclodecanyl, tetracyclododecanyl, and adamantyl. The monovalent hydrocarbon group may contain a heteroatom such as oxygen, nitrogen or sulfur. Exemplary such groups are the foregoing monovalent hydrocarbon groups in which —O—, —NH— or —S— intervenes between carbon atoms or in which one or more hydrogen is replaced by hydroxyl, alkoxy, oxo, amino, alkylamino or cyano.

When $R^1$ to $R^4$ bond together to form a ring with the carbon atom to which they are attached and any intervening carbon atom, ring structures having the following formulae (1a) to (1d) are exemplary.

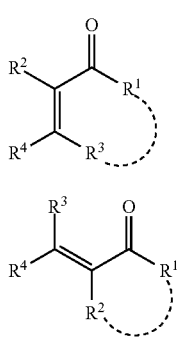
(1a)
(1b)
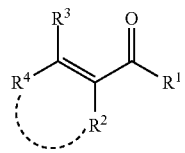
(1c)
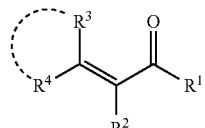
(1d)

Herein $R^1$ to $R^4$ are as defined above, and the broken line designates that the substituent groups bond together to form a ring.

Examples of the ring structure having formula (1a) are given below, but not limited thereto.

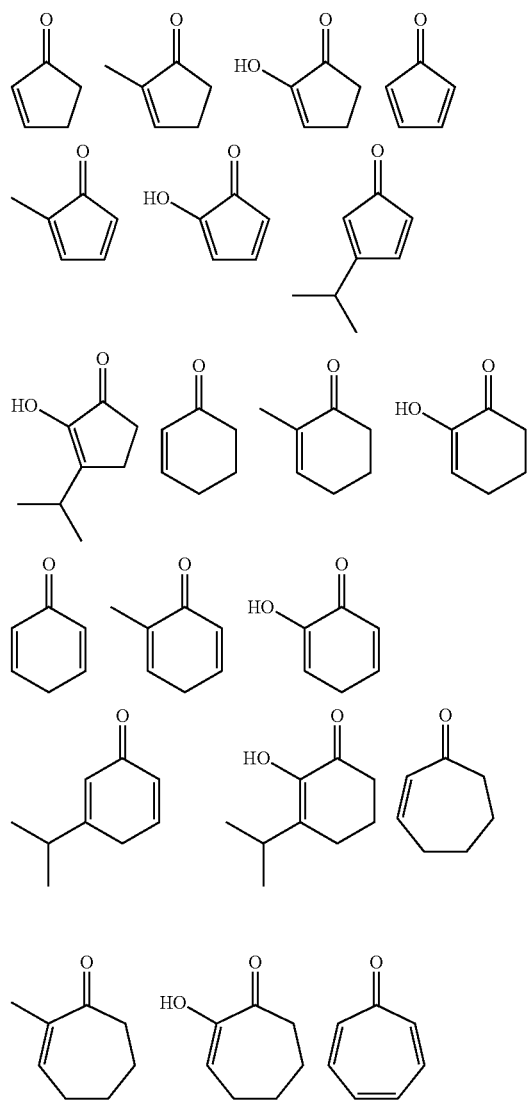

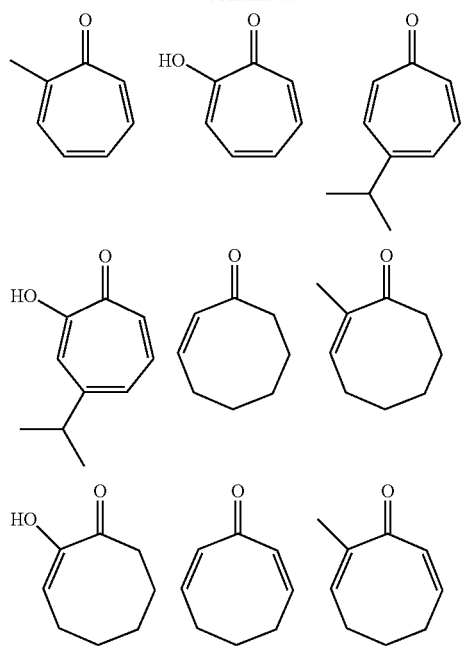
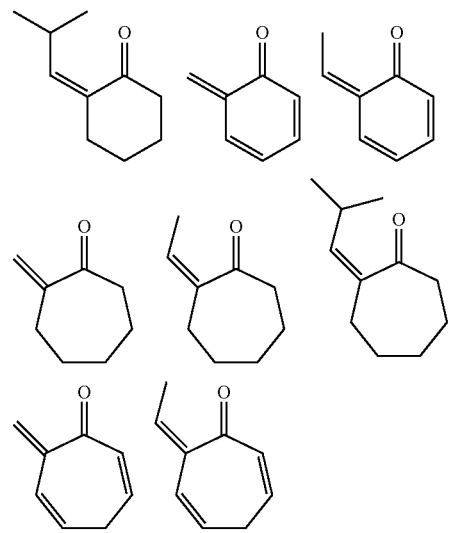
Examples of the ring structure having formula (1b) are given below, but not limited thereto.
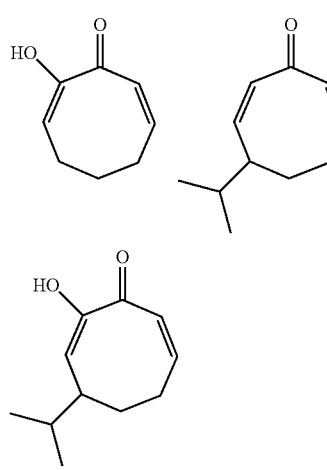
Examples of the ring structure having formula (1c) are given below, but not limited thereto.
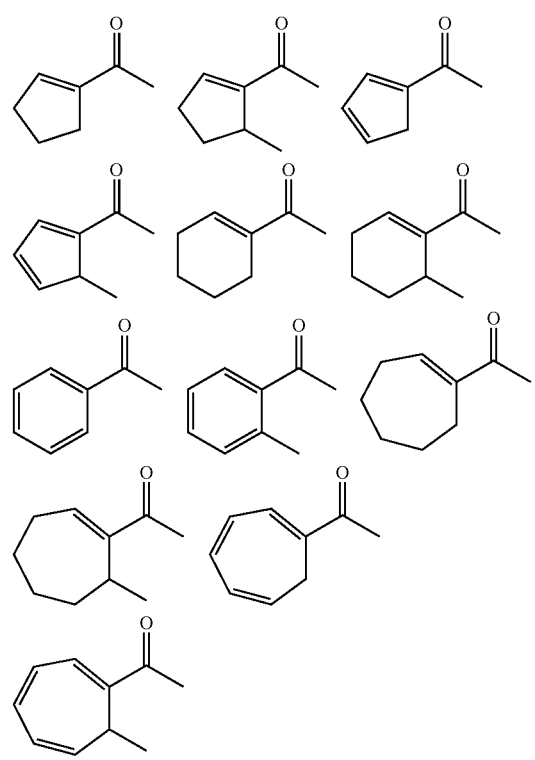
Examples of the ring structure having formula (1d) are given below, but not limited thereto.
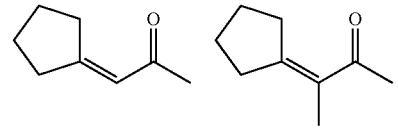

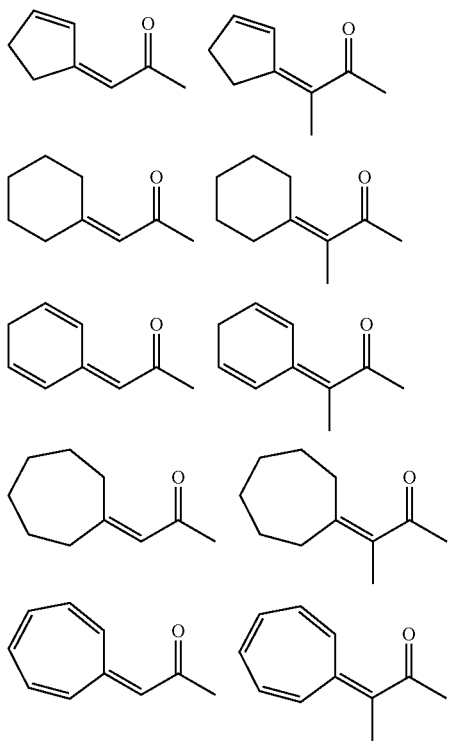

Preferred examples of the compound having formula (1) include methyl vinyl ketone, 3-buten-2-one, 4-methyl-3-penten-2-one, 3-methyl-3-buten-2-one, pent-3-en-2-one, 3-octen-2-one, 4-isopropyl-3-buten-2-one, 3-hepten-2-one, 2-hepten-4-one, 3-octen-2-one, 5-isopropyl-2-hepten-4-one, 3-nonen-2-one, 3-nonen-5-one, 3-decen-2-one, 4-phenyl-3-buten-2-one, 2-cyclohepten-1-one, 3-methyl-3-penten-2-one, 2-(2-ethylhexylidene)-1-cyclohexanone, 1-acetyl-1-cyclopentene, 1,4-benzoquinone, pyrone, duroquinone, phorone, tropolone, hinokitiol, chalcone, and ionone.

Component (A) is preferably added in an amount of 0.01 to 40 parts by weight, more preferably 0.1 to 40 parts by weight, and even more preferably 0.1 to 20 parts by weight per 100 parts by weight of the base resin (B). Within the range, a satisfactory PPD inhibitory effect is exerted while maintaining lithography performance.

Component B

Component (B) is a resin adapted to change its solubility in an organic solvent base developer under the action of acid, the resin comprising recurring units having the formula (2) and recurring units having the formula (3). The resin is often referred to as "base resin."

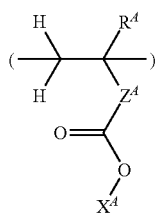
(2)

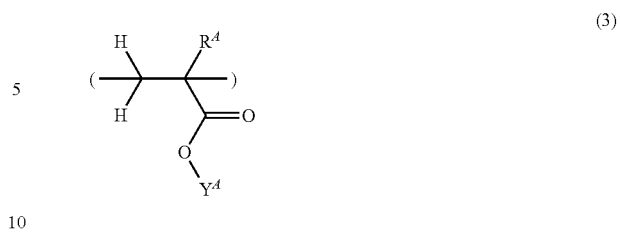

In formulae (2) and (3), $R^A$ is hydrogen, fluorine, methyl or trifluoromethyl, with hydrogen or methyl being preferred. $Z^A$ is a single bond, phenylene, naphthylene, or —C(=O)—O—Z'—, wherein Z' is a straight, branched or cyclic $C_1$-$C_{10}$ alkylene group which may contain a hydroxy moiety, ether bond, ester bond or lactone ring, or a phenylene or naphthylene group. $X^A$ is an acid labile group. $Y^A$ is hydrogen or a polar group having at least one structure selected from the group consisting of hydroxy, cyano, carbonyl, carboxyl, ether bond, ester bond, sulfonic acid ester bond, carbonate bond, lactone ring, sultone ring, and carboxylic acid anhydride.

Examples of the structure having formula (2) wherein $Z^A$ is a variant are shown below, but not limited thereto. Notably, $R^A$ and $X^A$ are as defined above.

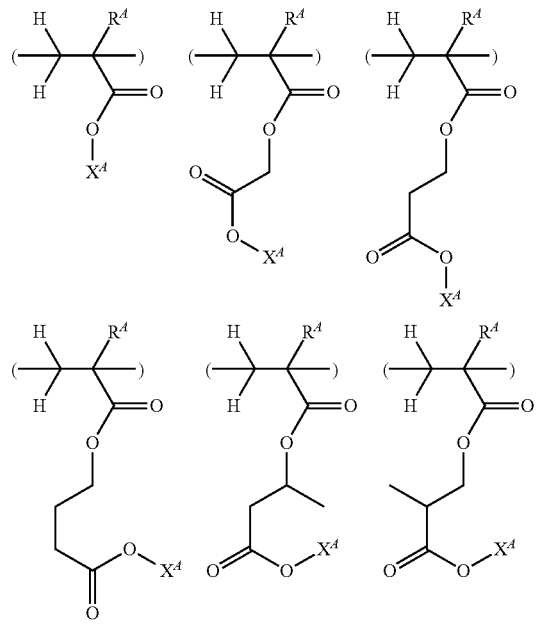

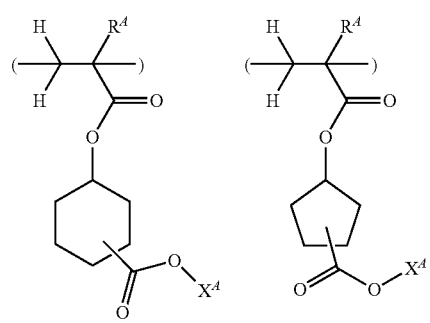

-continued
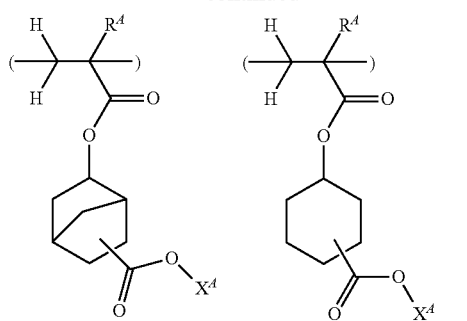
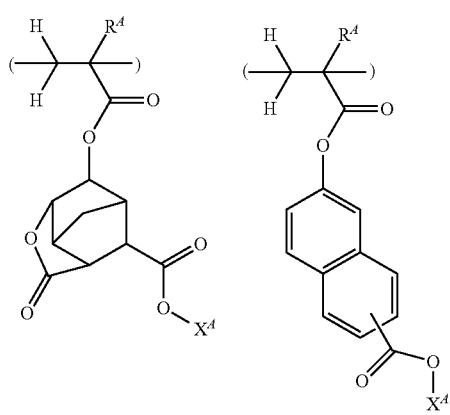
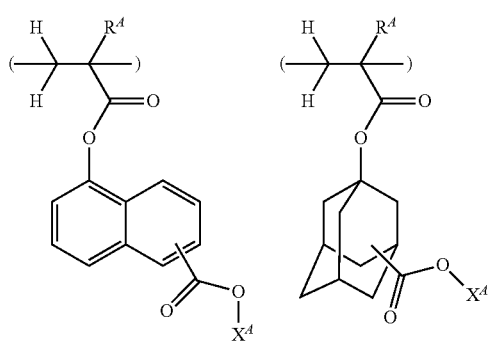
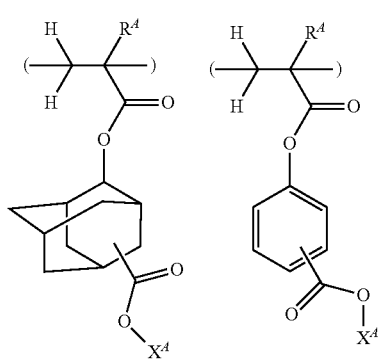
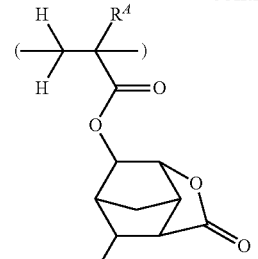
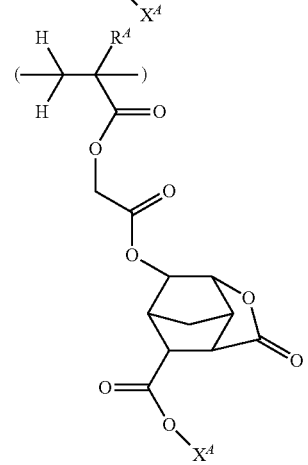
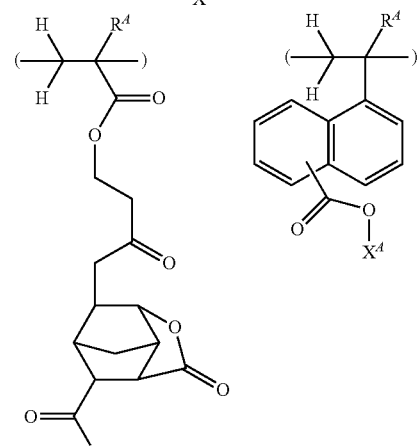
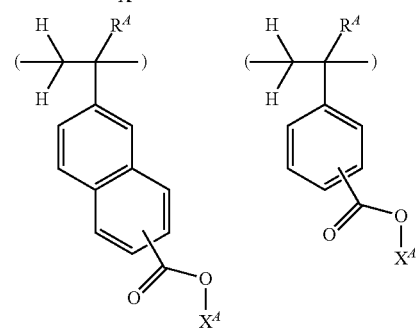
Under the action of acid, a polymer comprising recurring units of formula (2) is decomposed to generate carboxylic acid and to change its solubility in an organic solvent base developer.

The acid labile group represented by may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

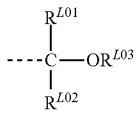

(L1)

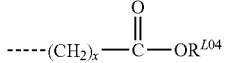

(L2)

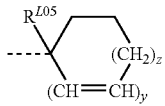

(L3)

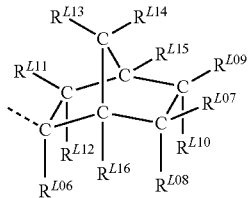

(L4)

In these formulae (and throughout the disclosure), the broken line denotes a valence bond.

In formula (L1), $R^{L01}$ and $R^{L02}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, s-butyl, t-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are substituted by hydroxyl, alkoxy, oxo, amino, alkylamino or the like, or in which a heteroatom such as oxygen intervenes between carbon atoms. Exemplary alkyl groups are as exemplified above for $R^{L01}$ and $R^{L02}$. Illustrative examples of the substituted alkyl groups are shown below.

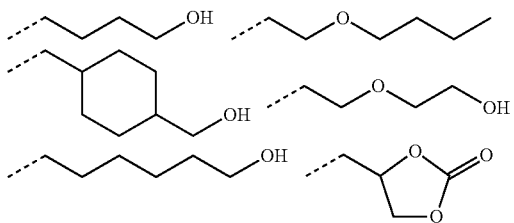

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are t-butyl, t-pentyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter x is an integer of 0 to 6.

In formula (L3), $R^{L05}$ is a substituted or unsubstituted, straight, branched or cyclic $C_1$-$C_8$ alkyl group or a substituted or unsubstituted $C_6$-$C_{20}$ aryl group. Examples of the optionally substituted alkyl group include straight, branched or cyclic alkyl, groups such as methyl, ethyl, propyl, isopropyl, n-butyl, s-butyl, t-butyl, t-pentyl, n-pentyl, n-hexyl, cyclopentyl, and cyclohexyl, and substituted forms of such groups in which some hydrogen atoms are substituted by hydroxyl, alkoxy, carboxyl, alkoxycarbonyl, oxo, amino, alkylamino, cyano, mercapto, alkylthio, sulfo or other groups. Examples of the optionally substituted aryl groups include phenyl, methylphenyl, naphthyl, anthryl, phenanthryl, and pyrenyl, and substituted forms of such groups in which some hydrogen atoms are substituted by hydroxyl, alkoxy, carboxyl, alkoxycarbonyl, oxo, amino, alkylamino, cyano, mercapto, alkylthio, sulfo or other groups. Letter y is equal to 0 or 1, z is an integer of 0 to 3, and 2y+z is equal to 2 or 3.

In formula (L4), $R^{L08}$ is a substituted or unsubstituted, straight, branched or cyclic $C_1$-$C_8$ alkyl group or a substituted or unsubstituted $C_6$-$C_{20}$ aryl group. Examples of these groups are the same as exemplified for $R^{L05}$. $R^{L09}$ to $R^{L16}$ independently represent hydrogen or optionally substituted $C_1$-$C_{15}$ monovalent hydrocarbon groups. Exemplary hydrocarbon groups are straight, branched or cyclic alkyl groups such as methyl, ethyl, propyl, isopropyl, n-butyl, s-butyl, t-butyl, t-pentyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$, taken together, form a ring with the carbon atom to which they are attached (for example, a pair of $R^{L07}$ and $R^{L08}$, $R^{L07}$ and $R^{L09}$, $R^{L07}$ and $R^{L10}$, $R^{L09}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a $C_1$-$C_{15}$ divalent hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, and $R^{L15}$, $R^{L13}$ and $R^{L15}$, or $R^{L14}$ and $R^{L15}$).

Of the acid labile groups of formula (L1), the straight and branched ones are exemplified by the following groups.

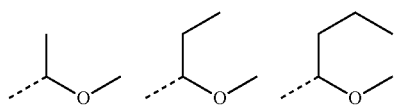

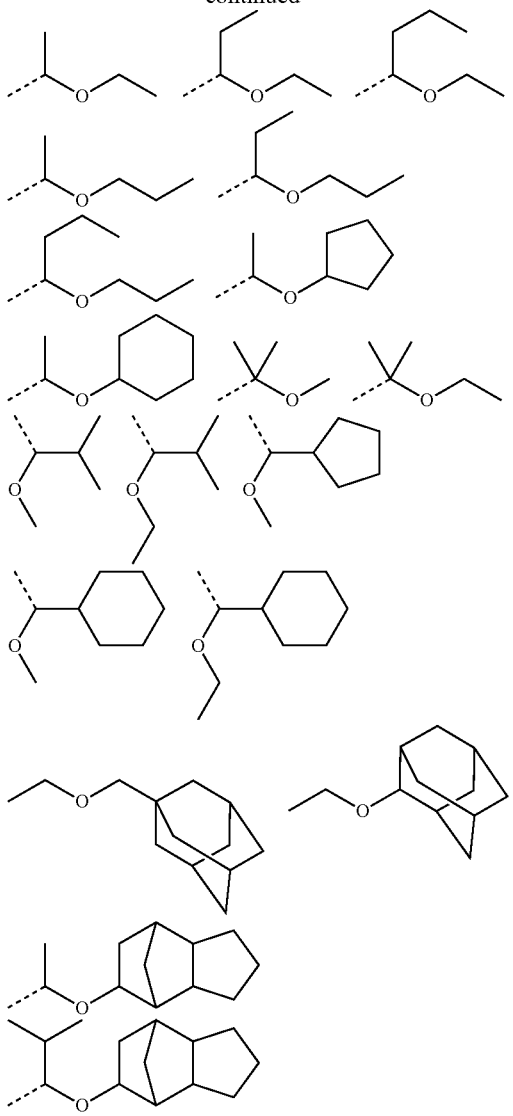

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include t-butoxycarbonyl, t-butoxycarbonylmethyl, t-pentyloxycarbonyl, t-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-s-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4), groups having the following formulas (L4-1) to (L4-4) are preferred.

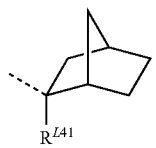
(L4-1)

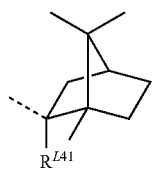
(L4-2)

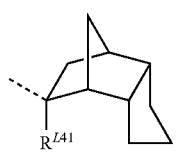
(L4-3)

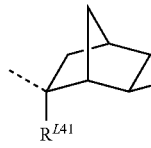
(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, s-butyl, t-butyl, t-pentyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Where the acid labile group $X^A$ is of formula (L4), it may be a mixture of stereoisomers.

For example, the general formula (L4-3) represents one or a mixture of two selected from groups having the following general formulas (L4-3-1) and (L4-3-2).

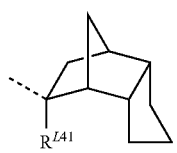
(L4-3-1)

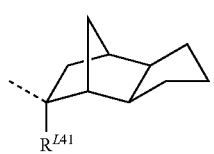
(L4-3-2)

Similarly, the general formula (L4-4) represents one or a mixture of two or more selected from groups having the following general formulas (L4-4-1) to (L4-4-4).

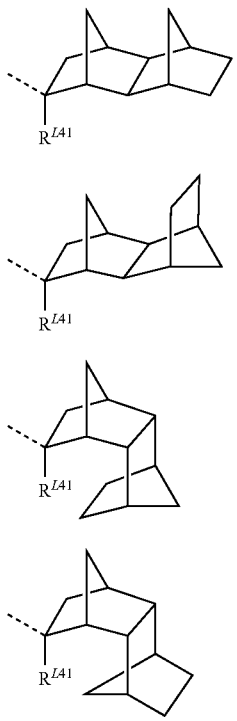

(L4-4-1)

(L4-4-2)

(L4-4-3)

(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121).

In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

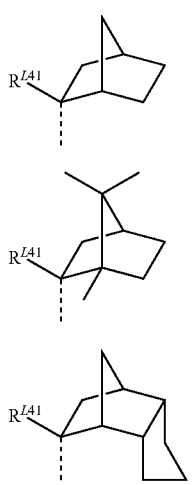

(L4-1-endo)

(L4-2-endo)

(L4-3-endo)

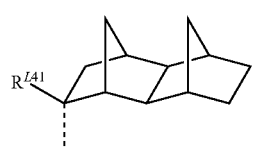

(L4-4-endo)

Herein $R^{L41}$ is as defined above.

Illustrative examples of the acid labile group of formula (L4) are given below, but not limited thereto.

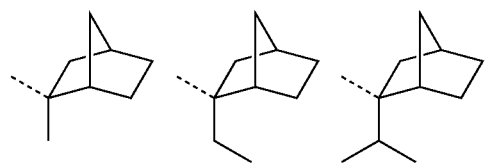

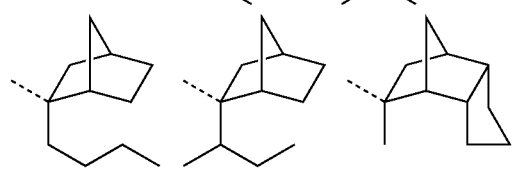

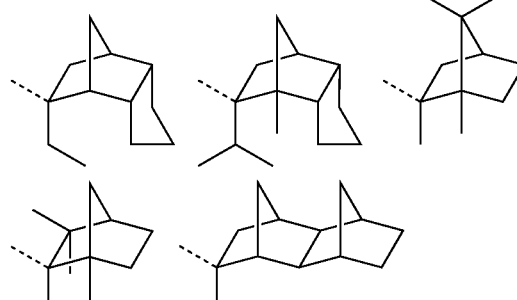

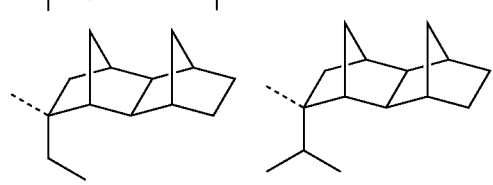

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $X^4$, are as exemplified for $R^{LO4}$.

Illustrative examples of the recurring units of formula (2) are given below, but not limited thereto. Notably $R^A$ is as defined above.

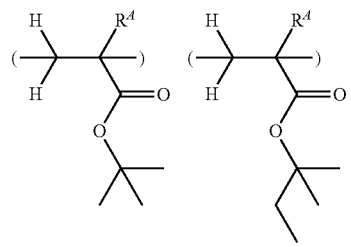

-continued
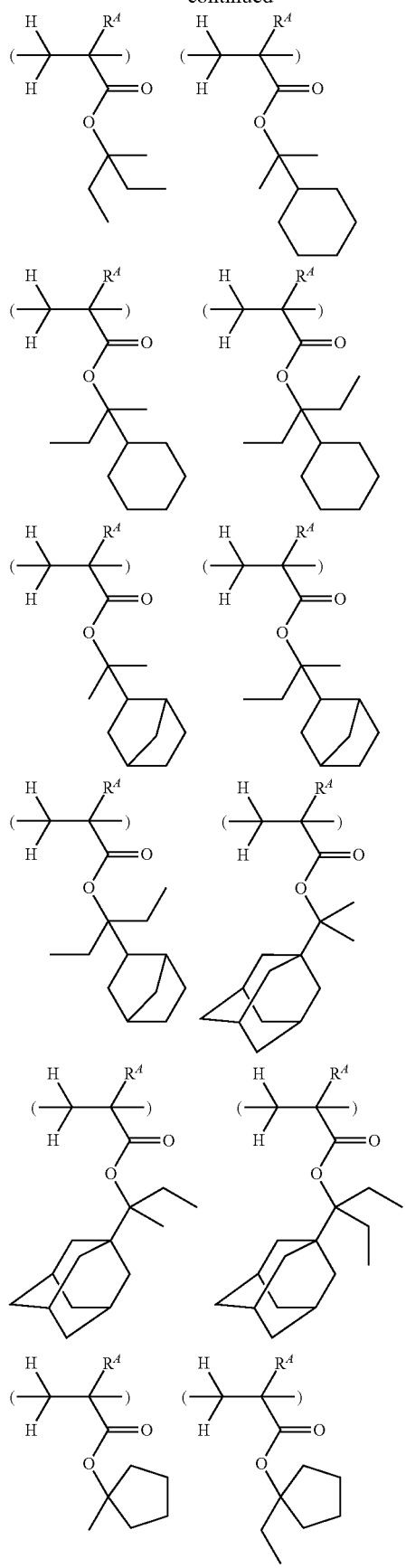
-continued
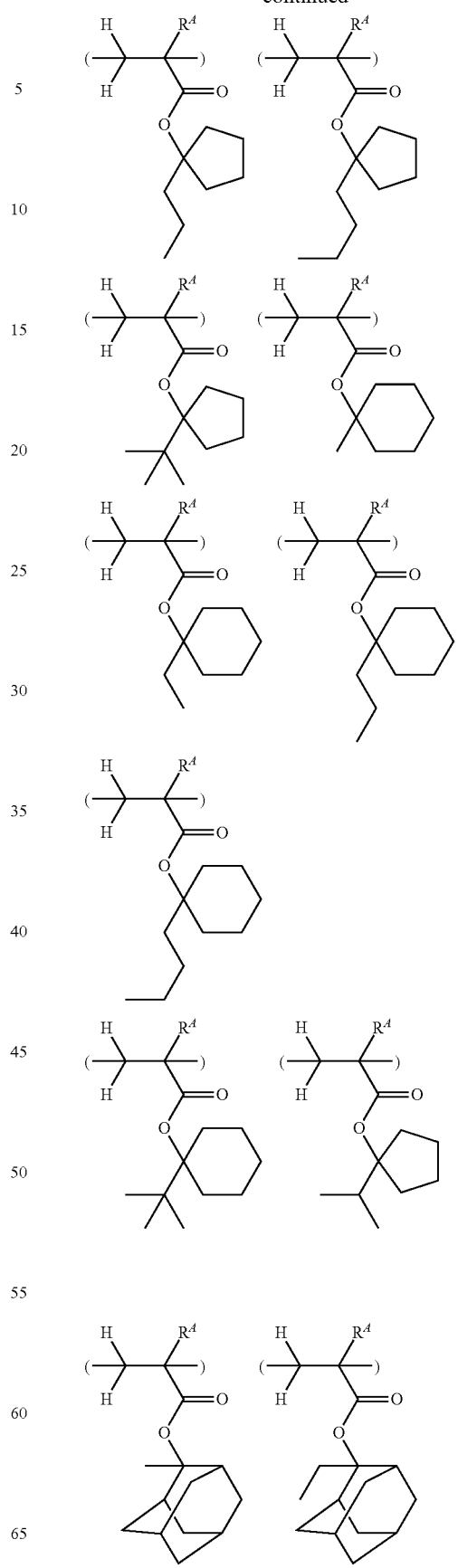

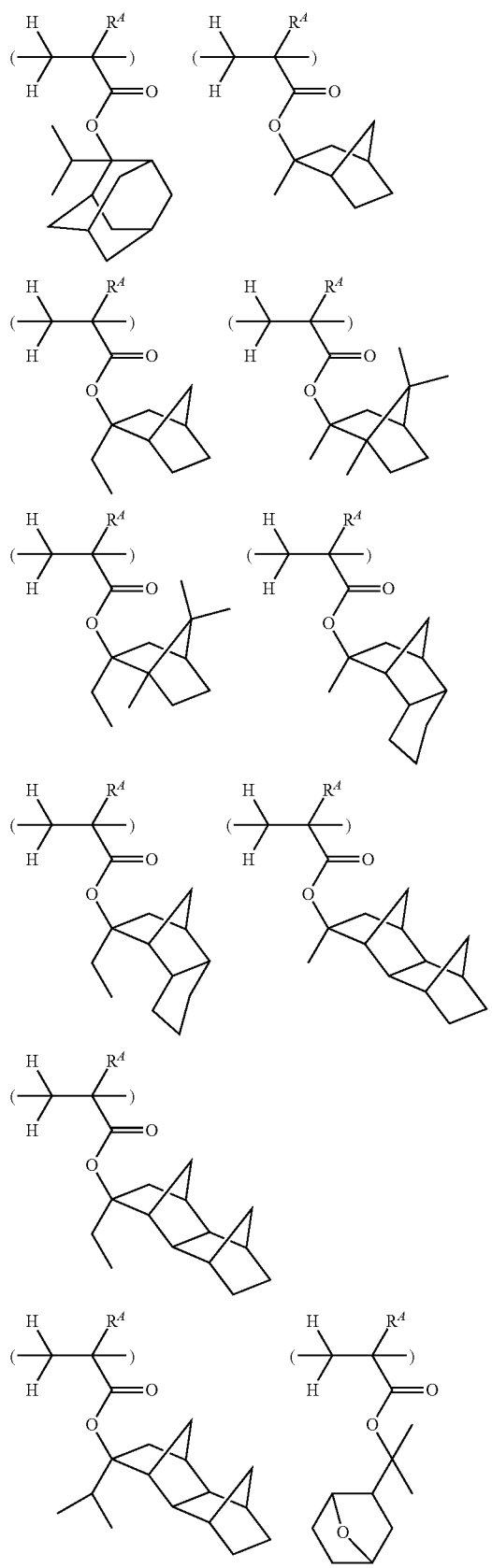
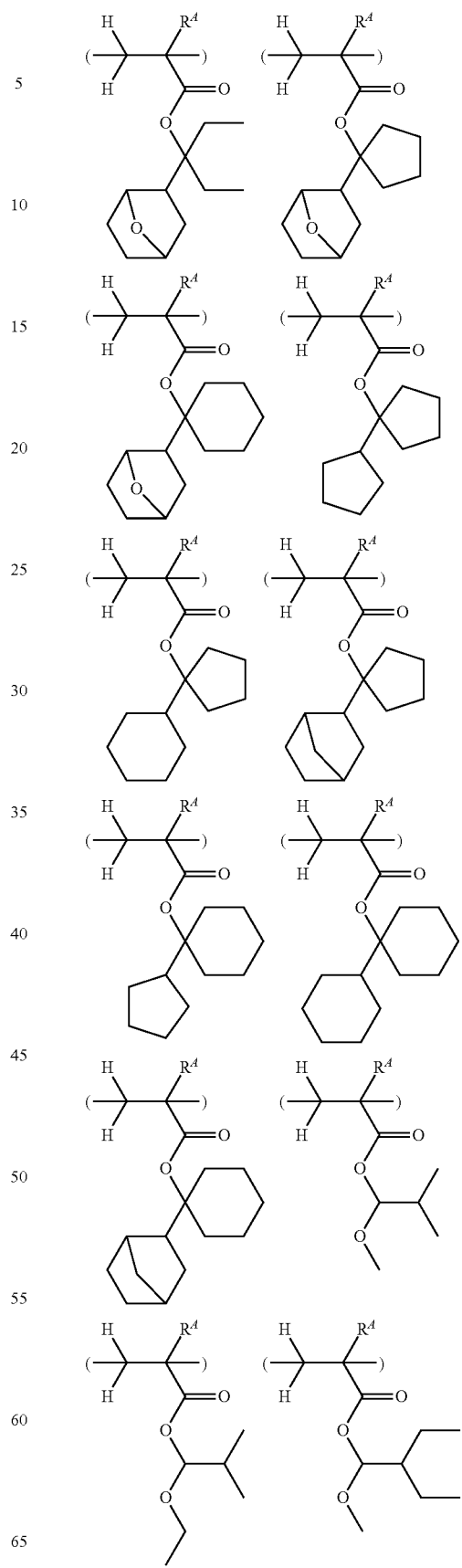

-continued

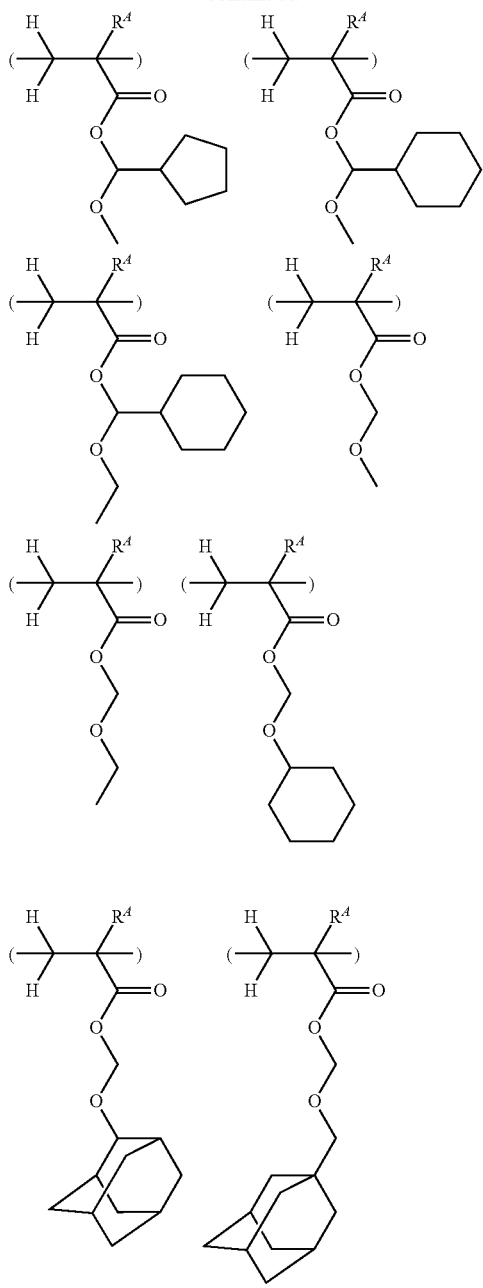
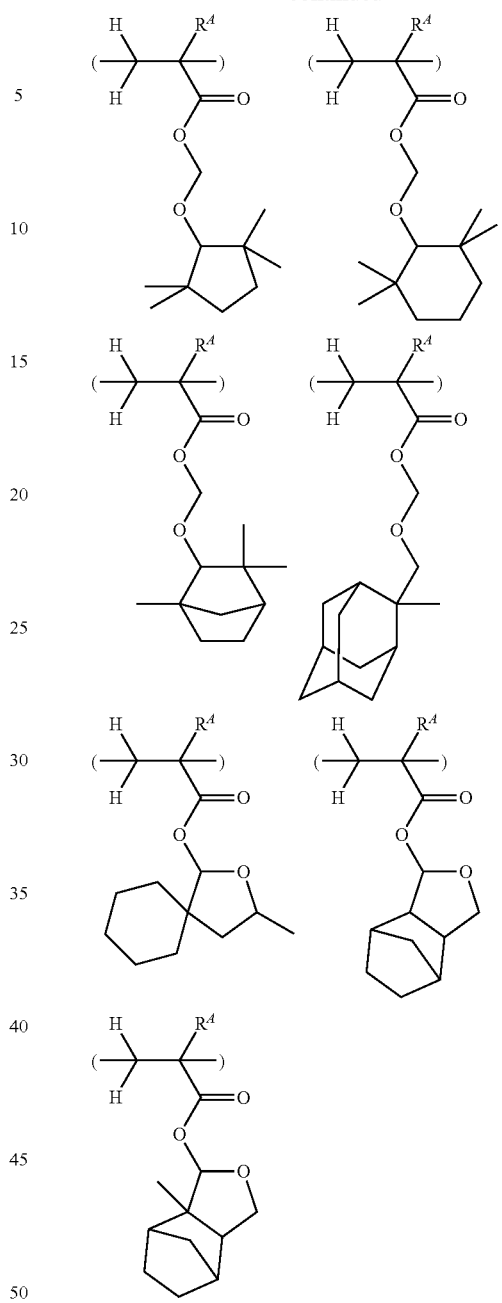

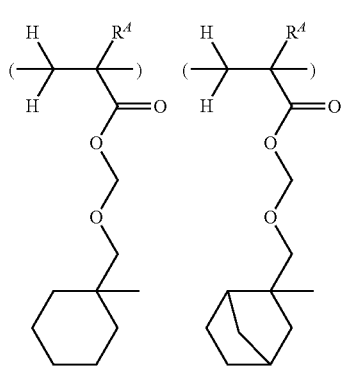

While the foregoing examples correspond to those units wherein $Z^A$ is a single bond, $Z^A$ which is other than a single bond may be combined with similar acid labile groups. Examples of units wherein $Z^A$ is other than a single bond are substantially the same as illustrated above.

In formula (3), $R^A$ is as defined above. $Y^A$ is hydrogen, or a polar group having at least one structure selected from among hydroxyl, cyano, carbonyl, carboxyl, ether bond, ester bond, sulfonic acid ester bond, carbonate bond, lactone ring, sultone ring, and carboxylic anhydride.

Illustrative, non-limiting examples of the recurring units having formula (3) are shown below. Notably $R^A$ is as defined above.

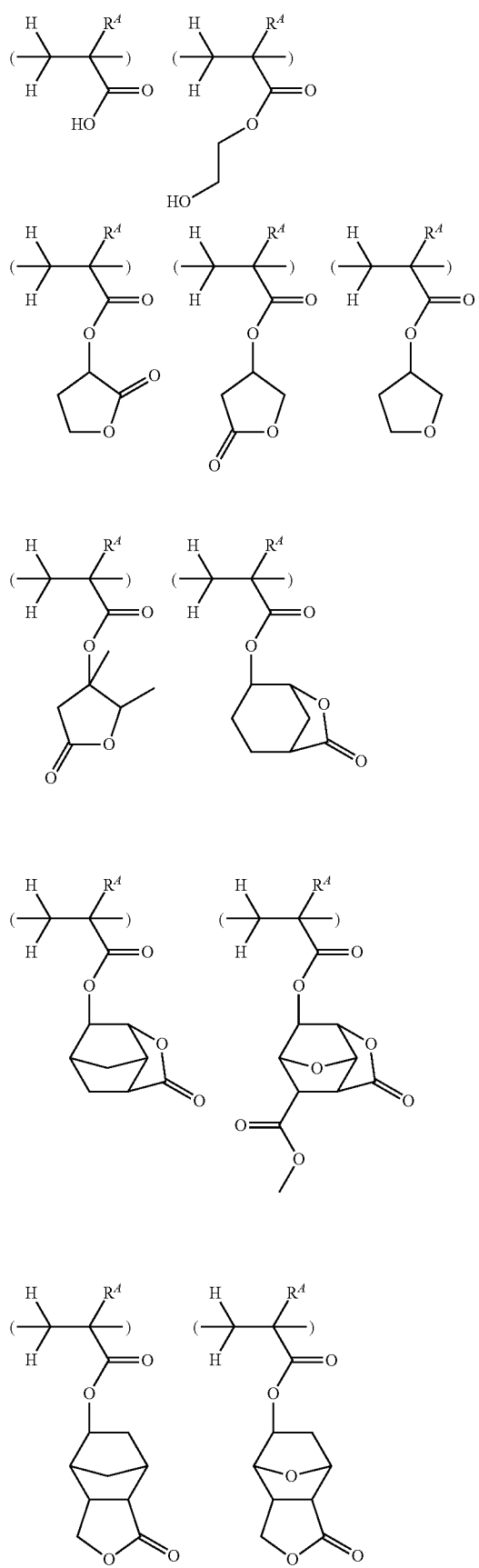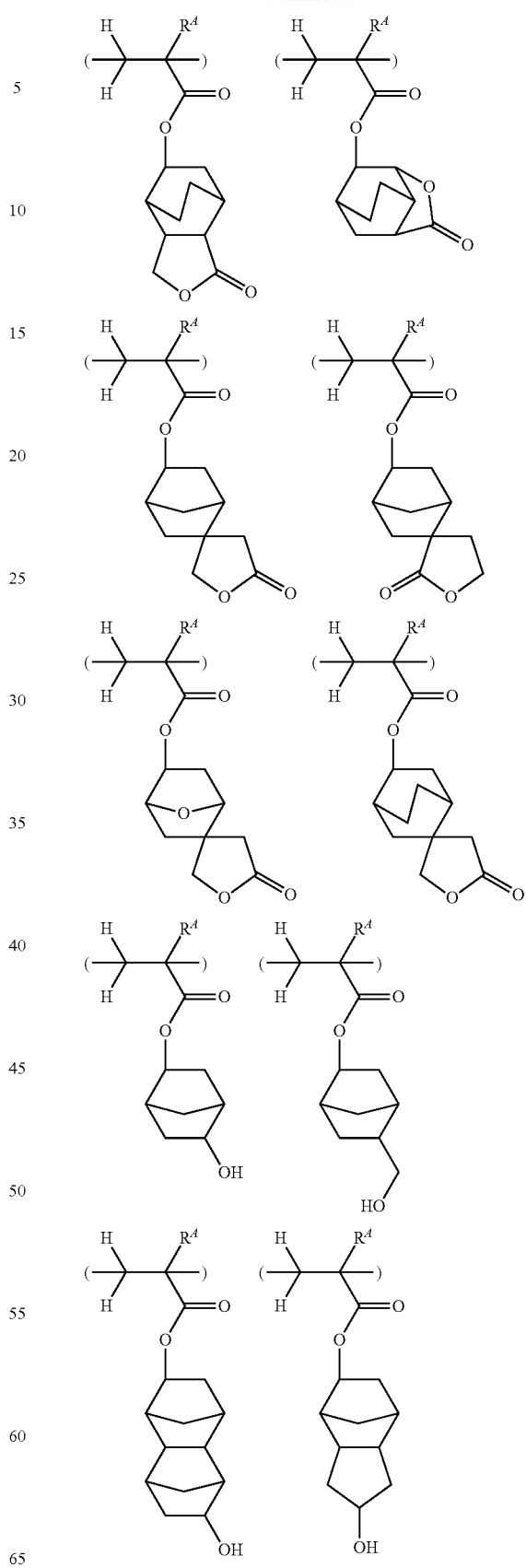

-continued
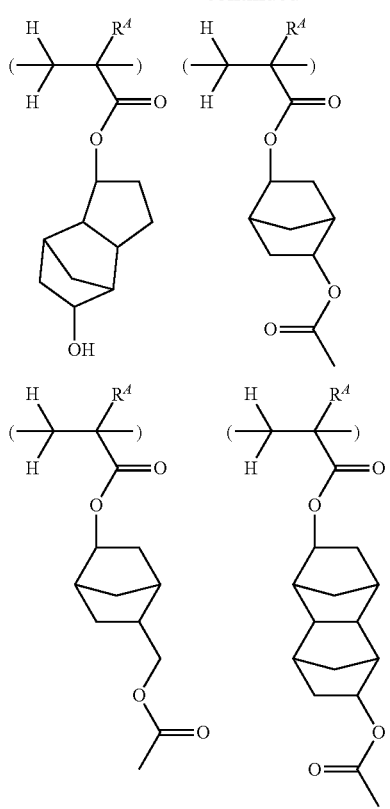
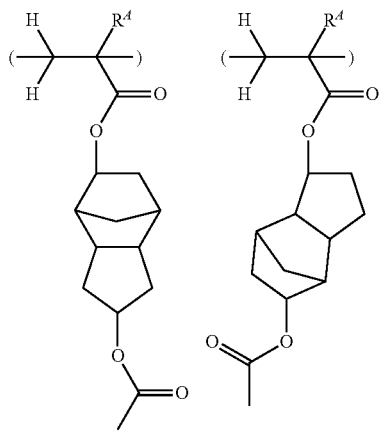
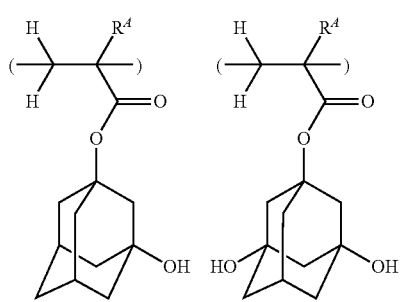
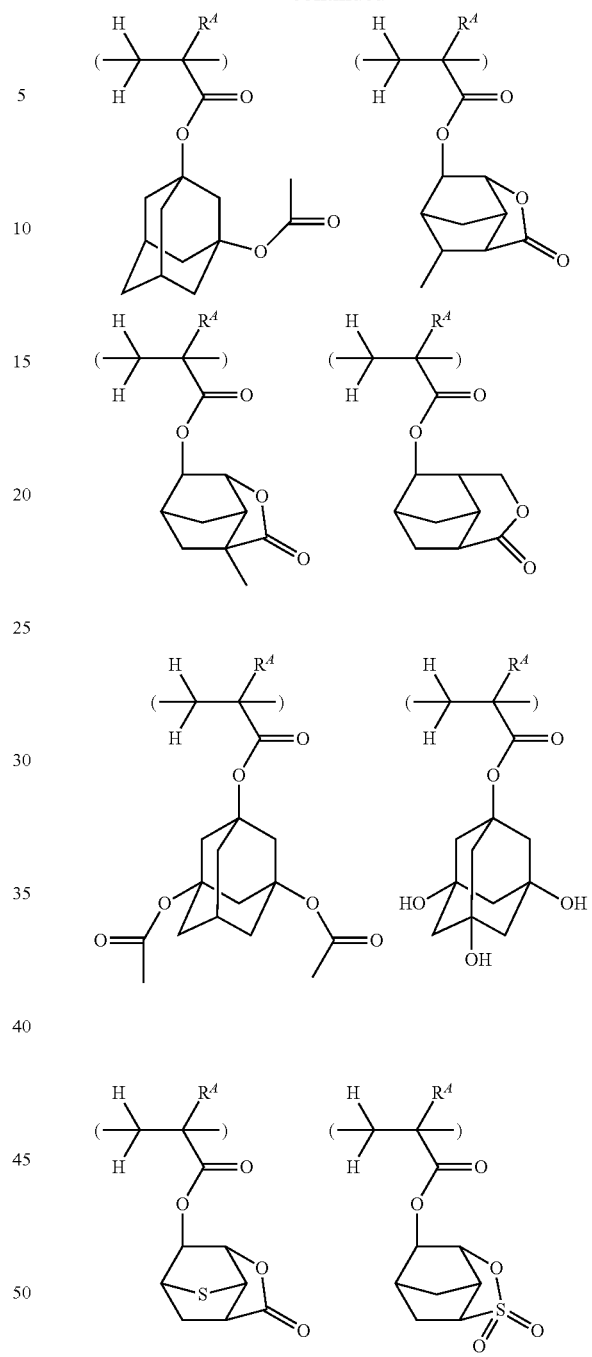
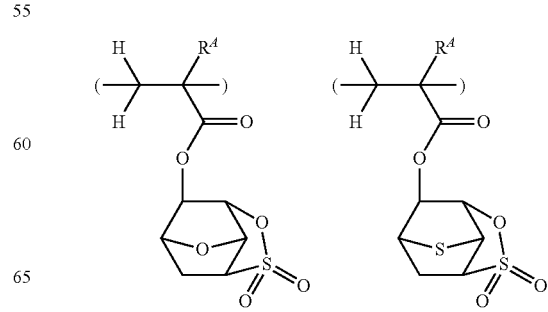

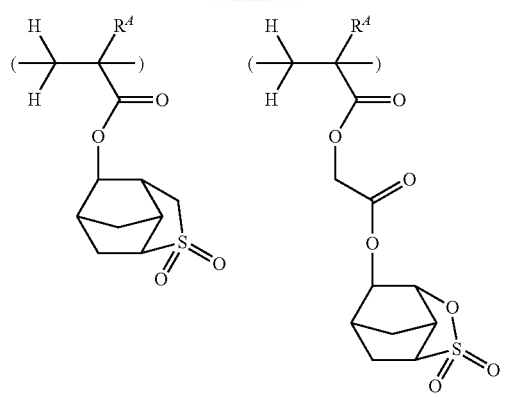
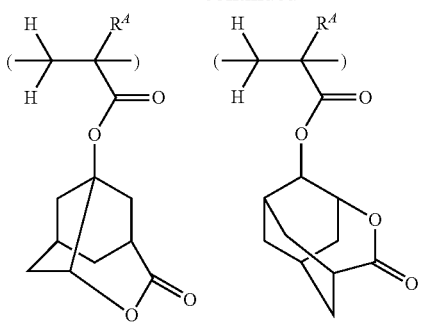
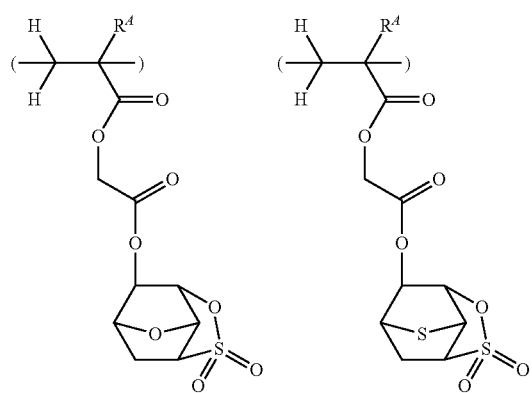
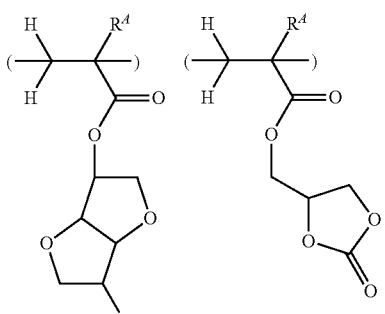
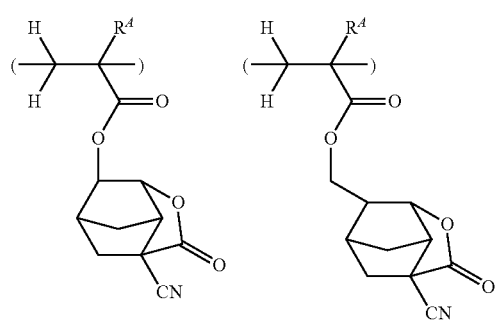
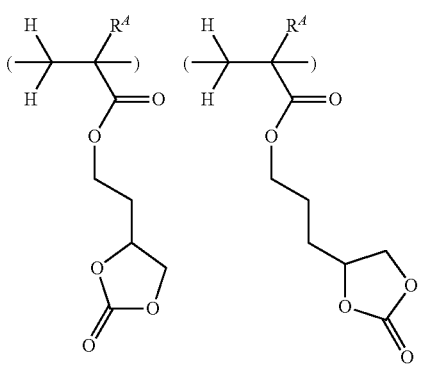
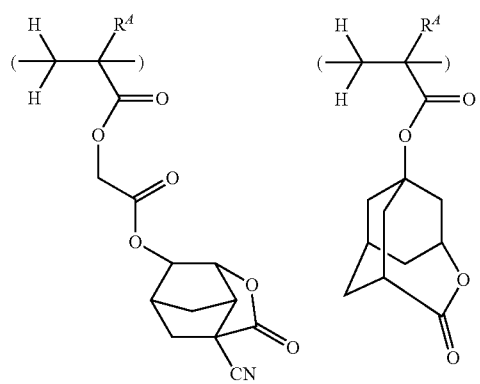
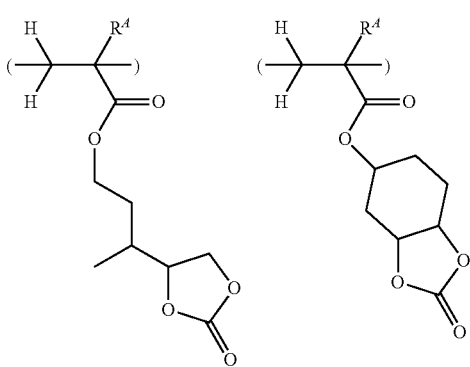

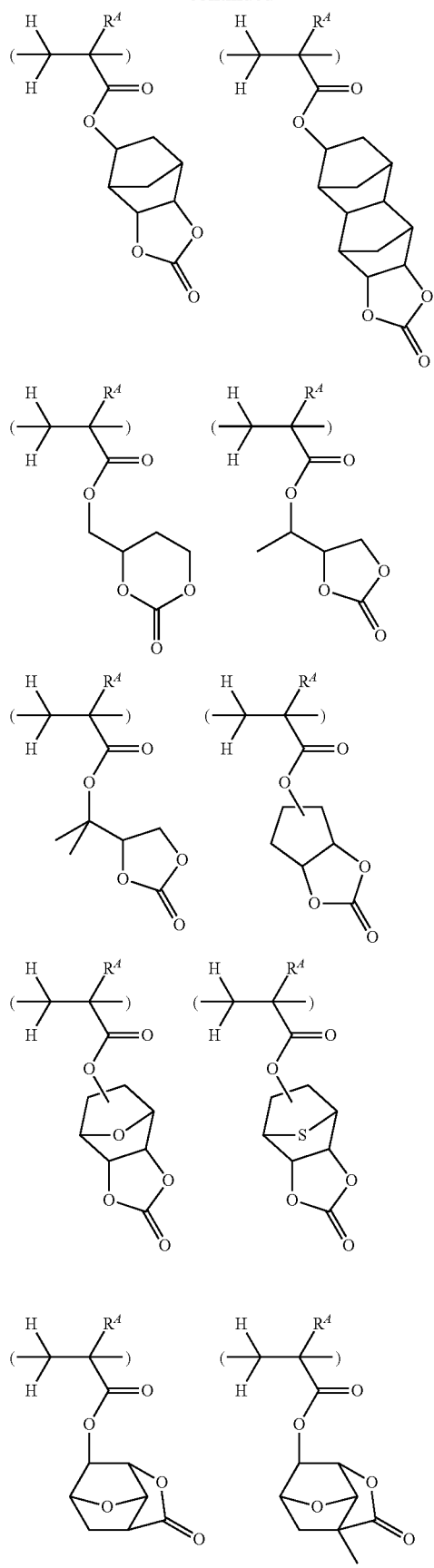
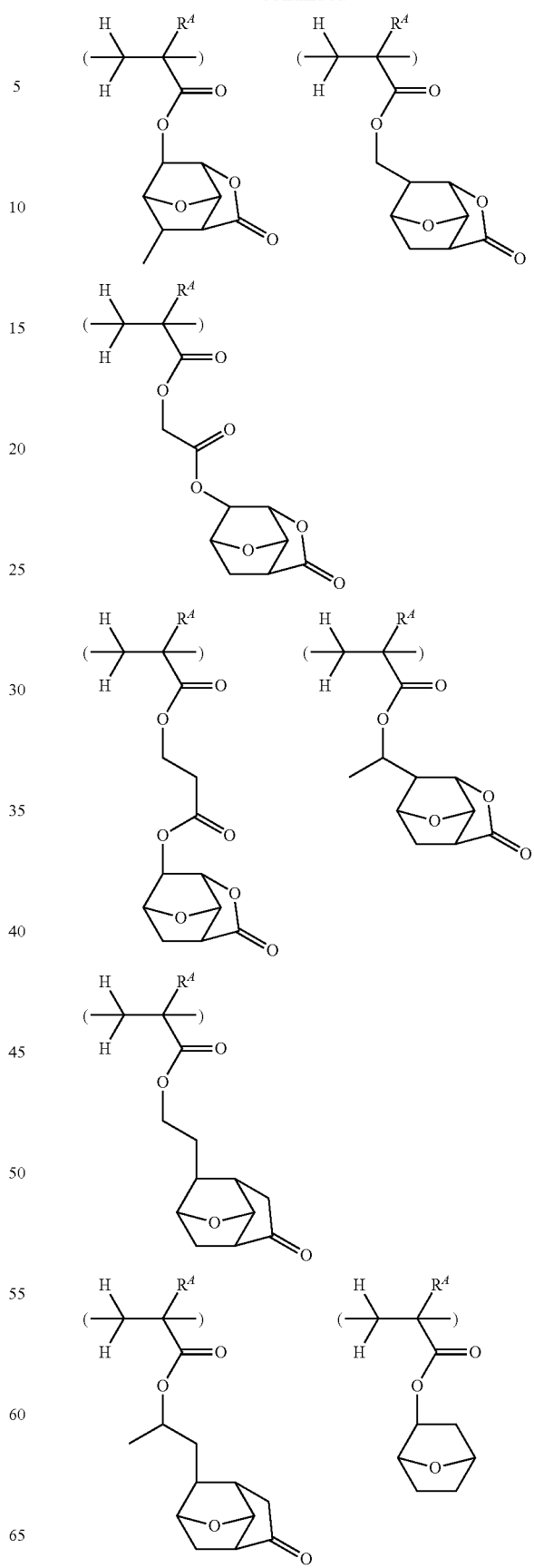

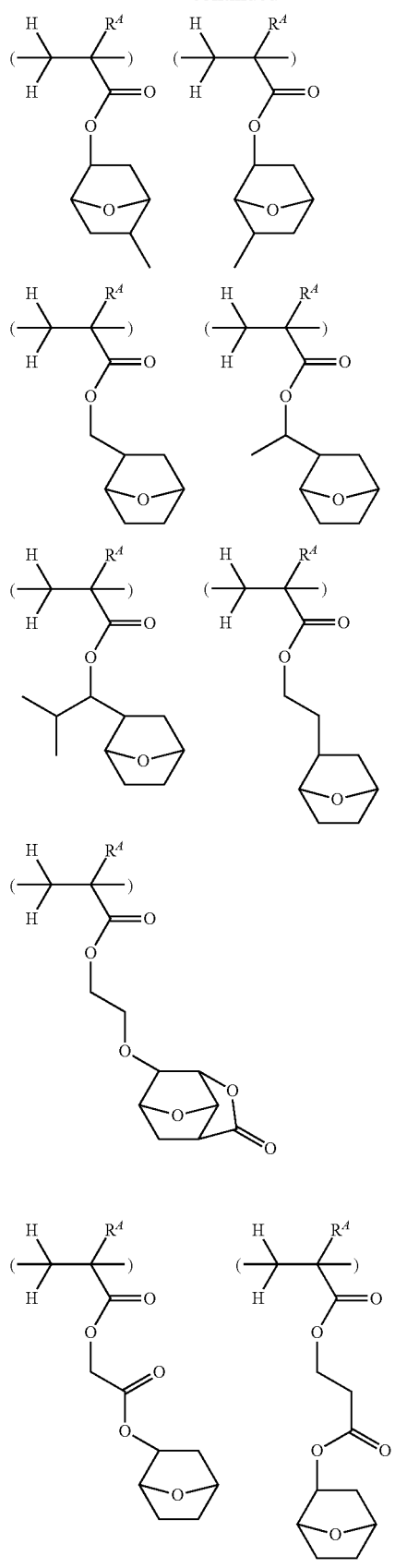

-continued
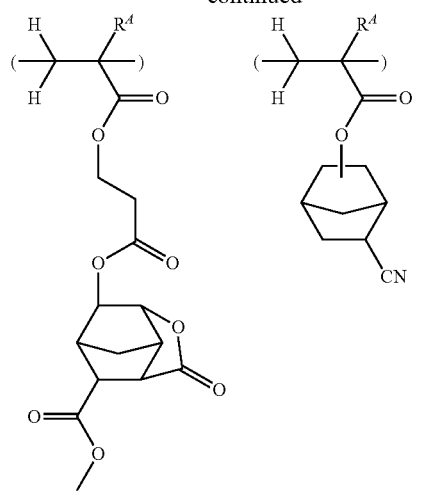
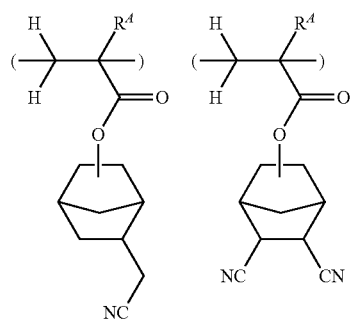
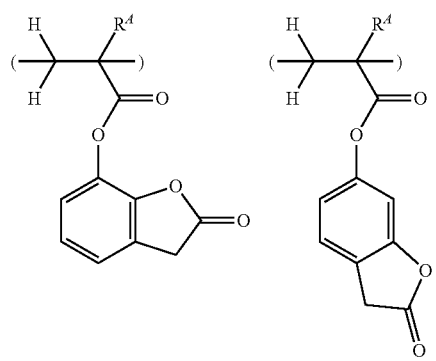
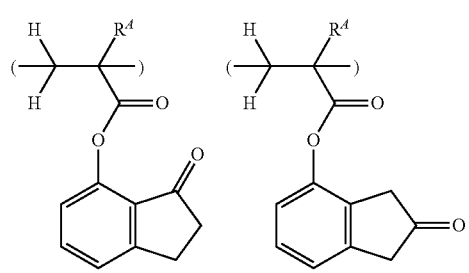
-continued
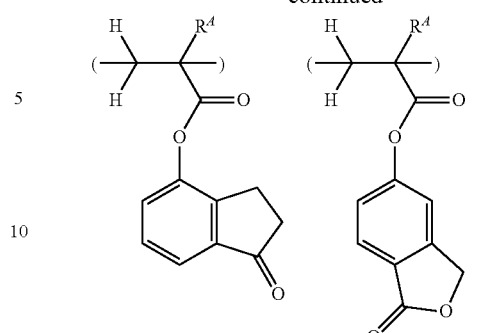
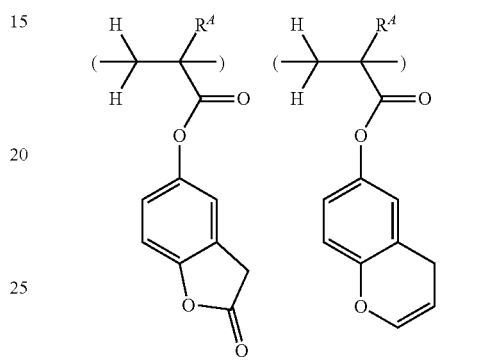
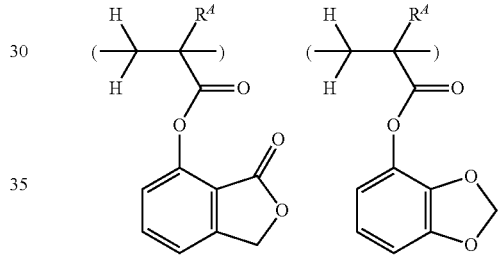
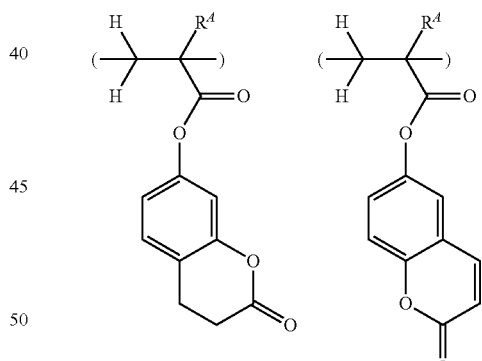
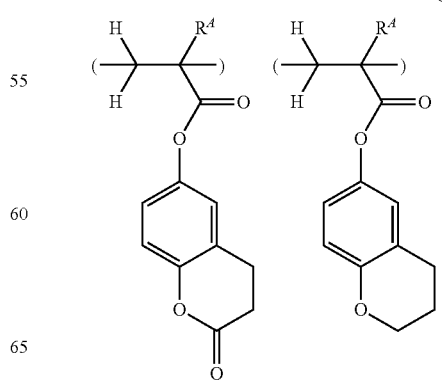

-continued
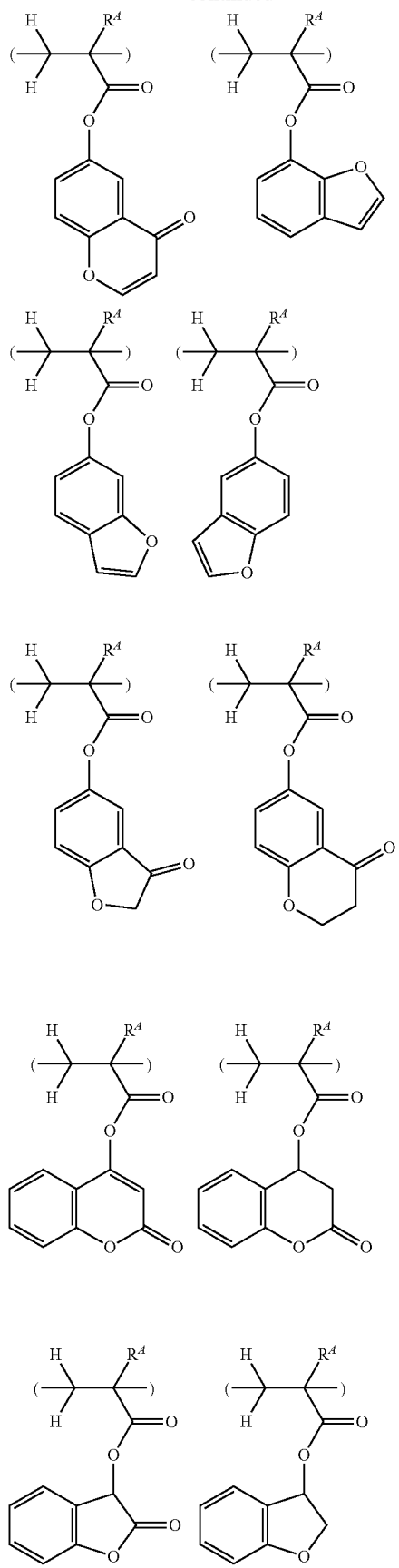
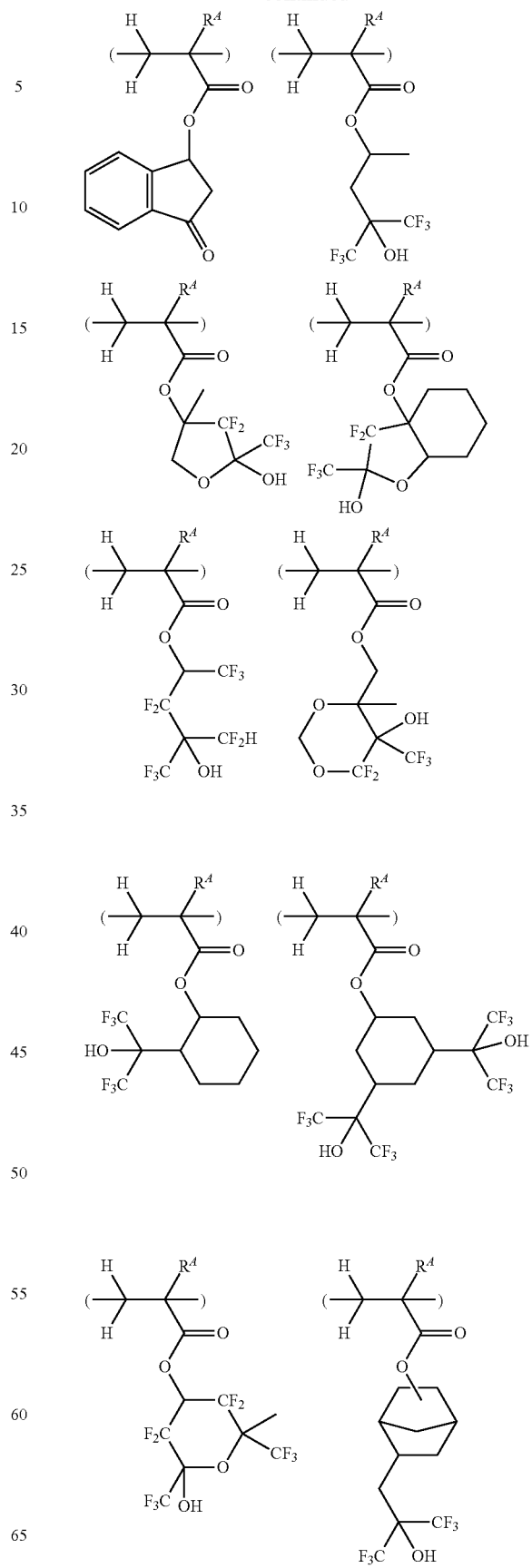

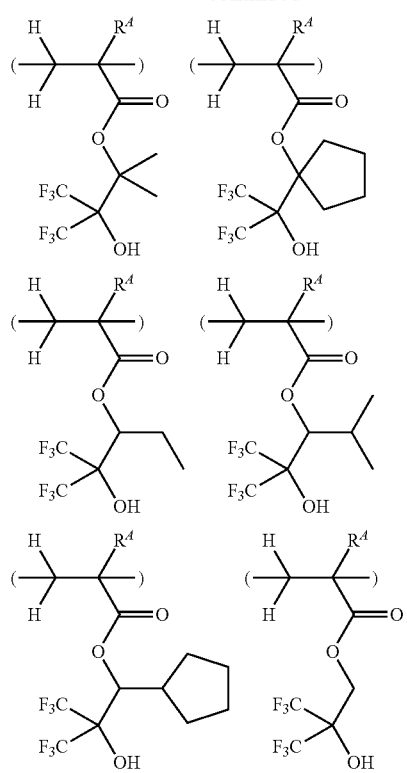
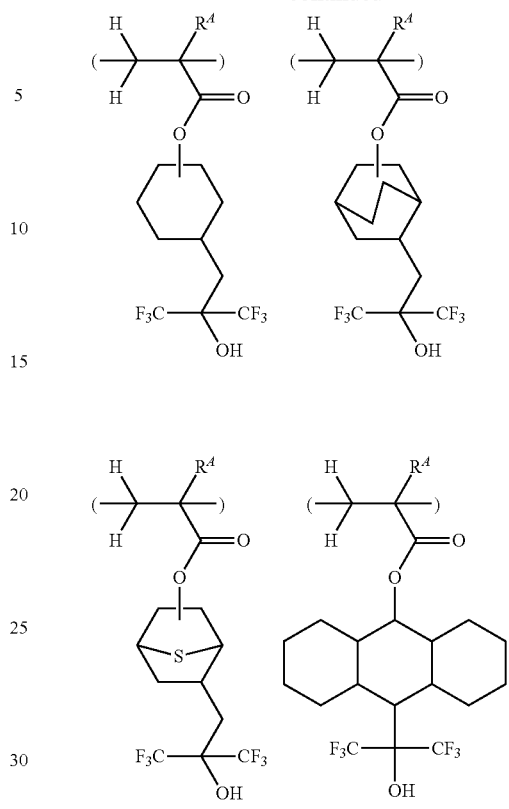
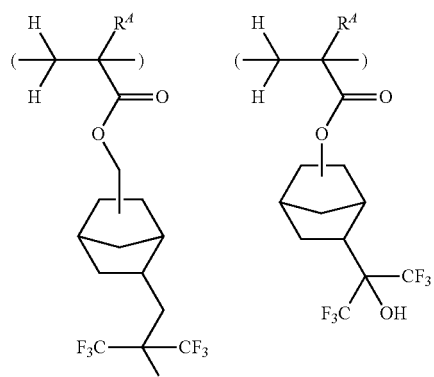
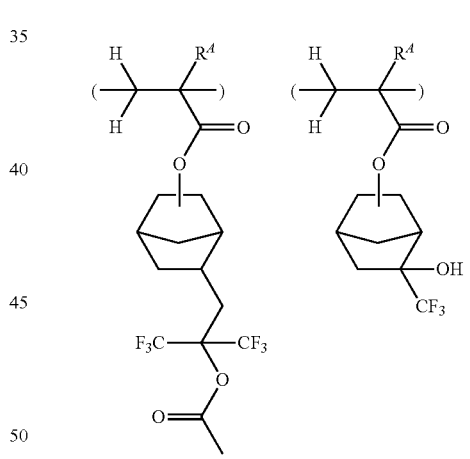
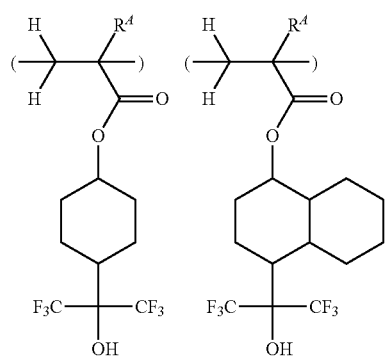
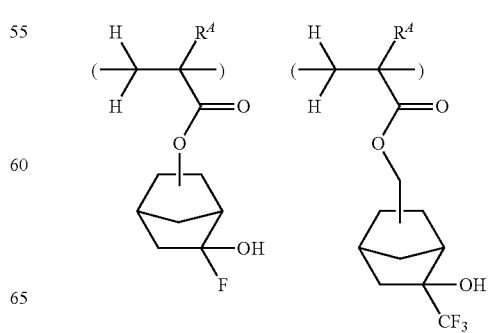

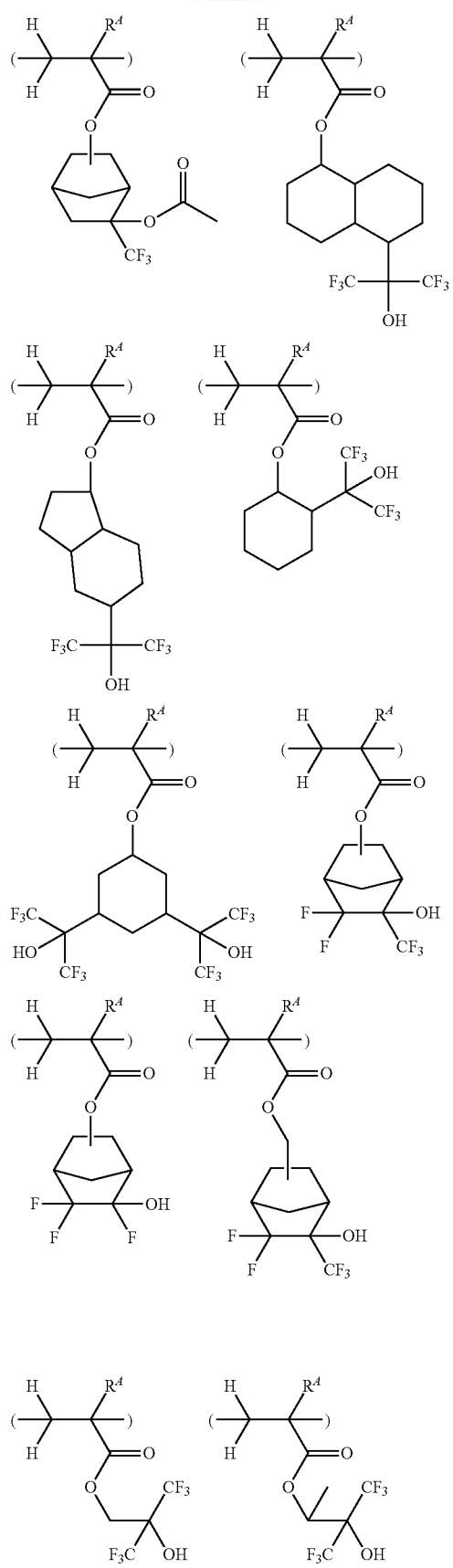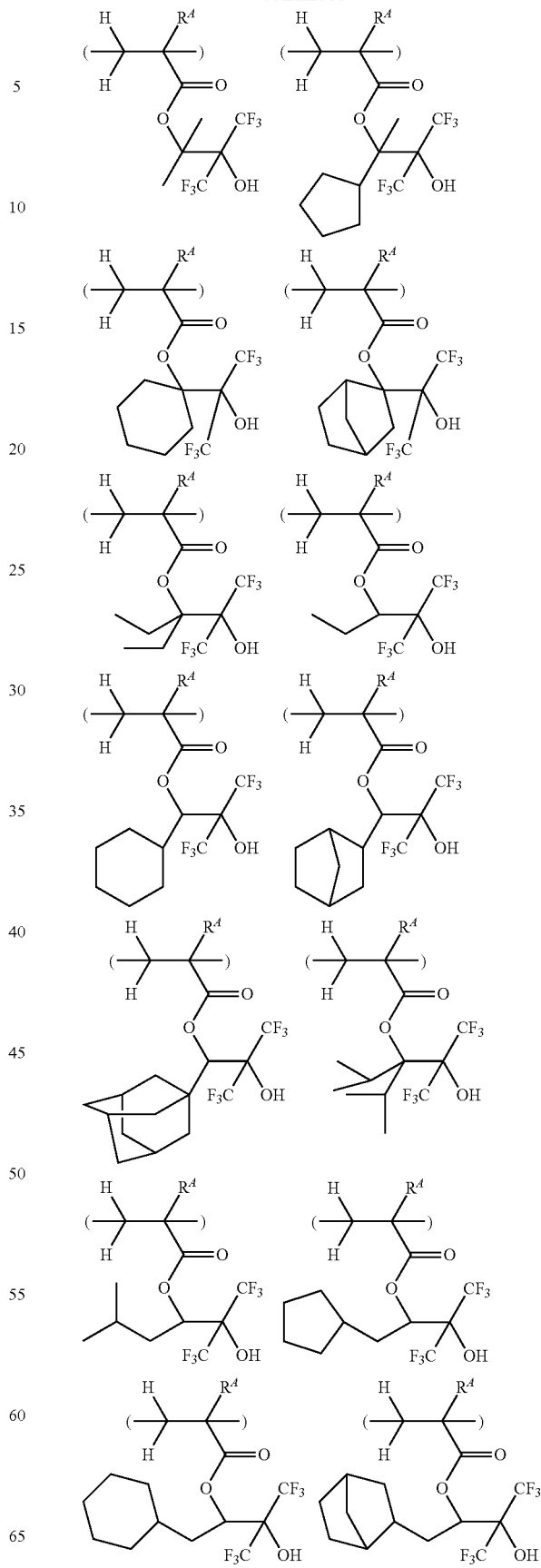

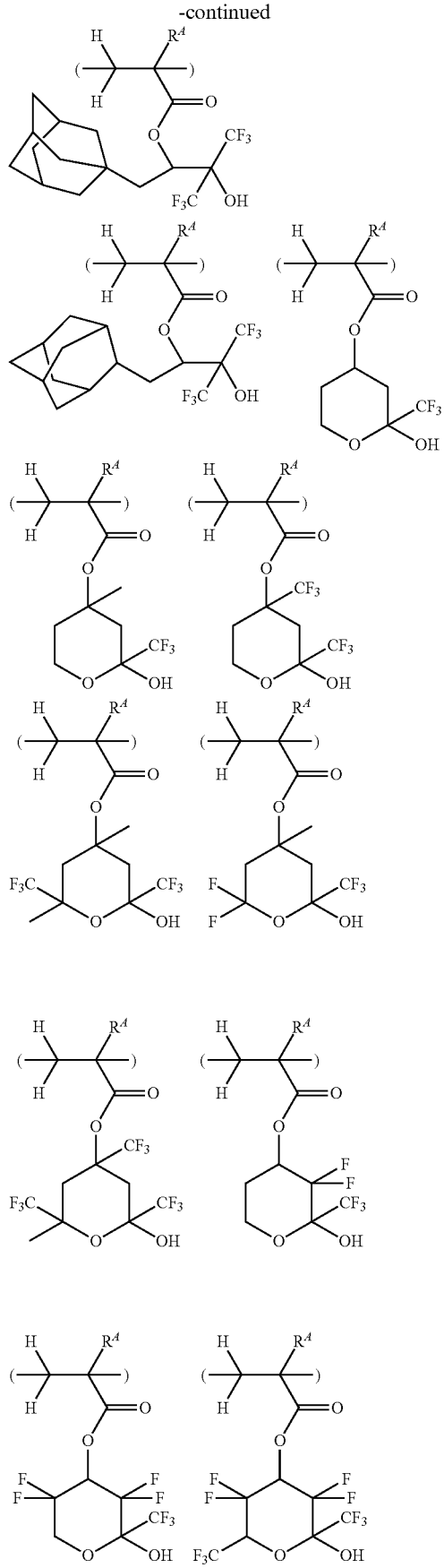
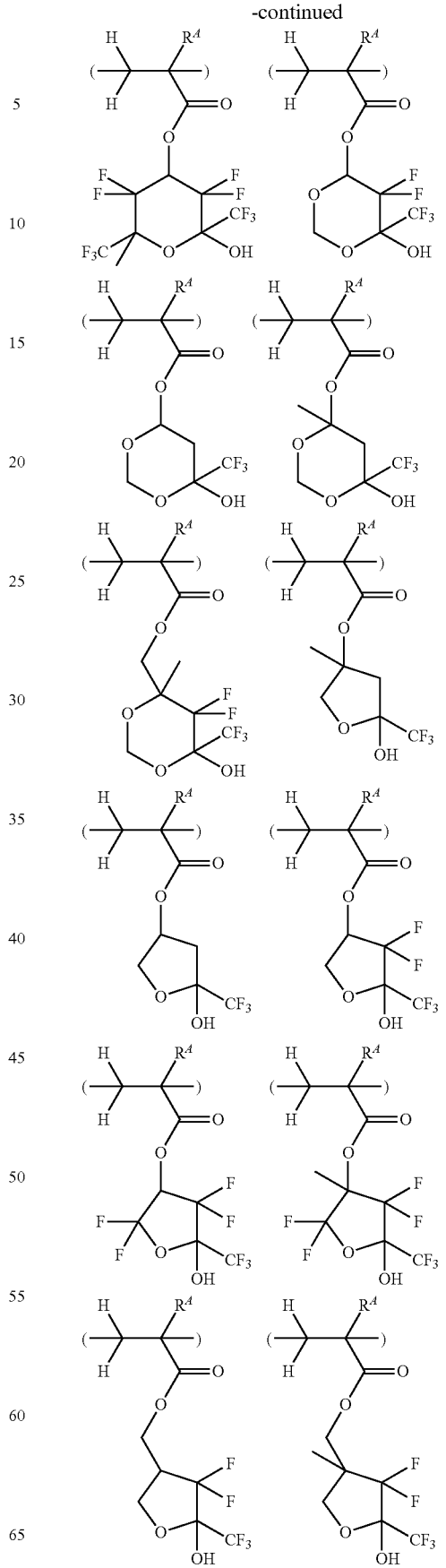

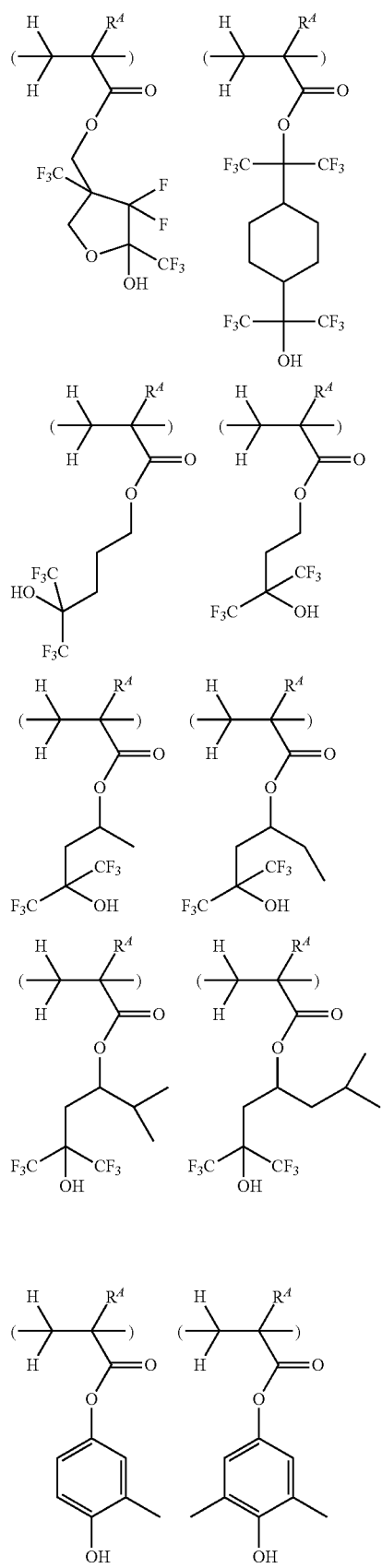
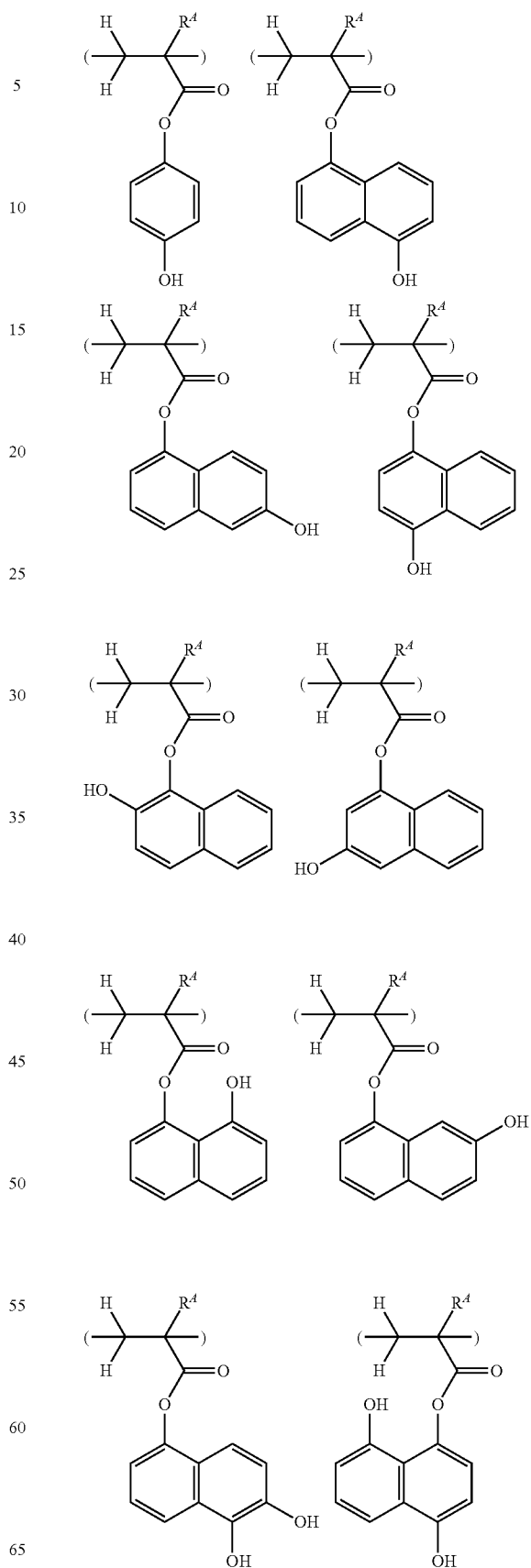

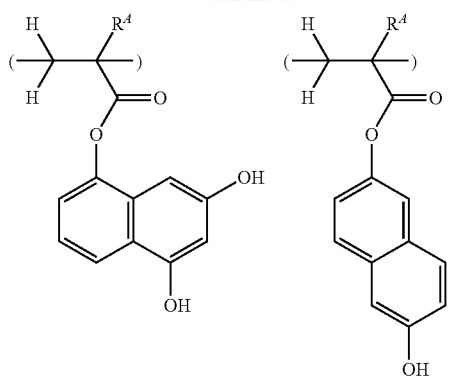
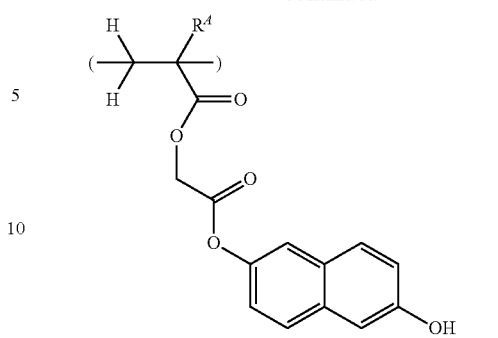
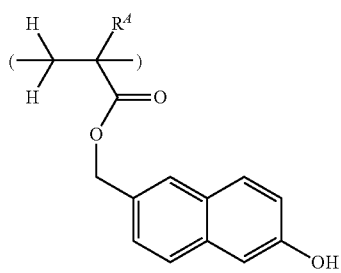
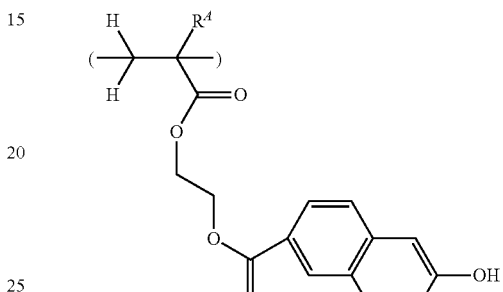
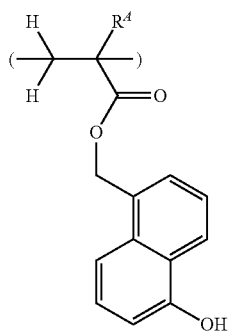
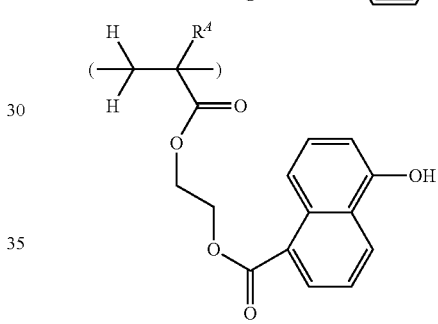
Of the recurring units having formula (3), those units having a lactone ring as the polar group are most preferred.
In addition to the recurring units having formulae (2) and (3), the base resin may further comprise recurring units having the formula (d1) or (d2).
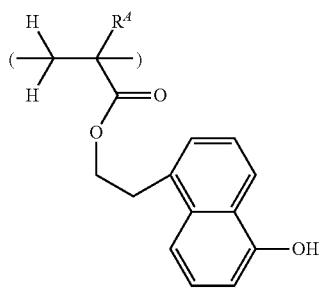
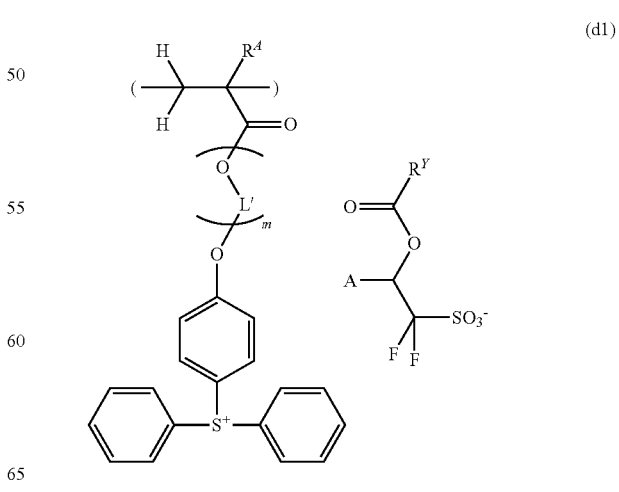
(d1)
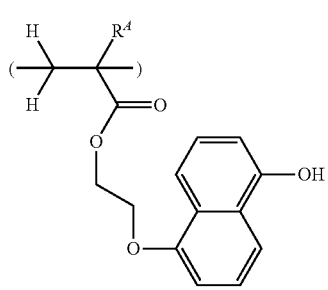

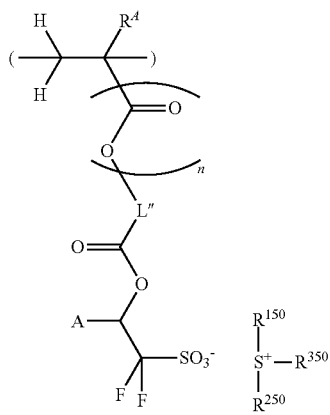

(d2)

In formulae (d1) and (d2), $R^A$ is as defined above. L' is a $C_2$-$C_5$ alkylene group, examples of which include ethylene, propylene and butylene. A is hydrogen or trifluoromethyl, preferably trifluoromethyl. L" is a single bond or a linear, branched or cyclic $C_1$-$C_{20}$ divalent hydrocarbon group which may contain a heteroatom. Suitable divalent hydrocarbon groups include linear alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; saturated cyclic divalent hydrocarbon groups such as cyclopentanediyl, cyclohexanediyl, norbornanediyl, and adamantanediyl; and unsaturated divalent hydrocarbon groups such as phenylene and naphthylene. Also included are the foregoing groups in which at least one hydrogen atom is replaced by an alkyl group such as methyl, ethyl, propyl, n-butyl or t-butyl, or in which at least one hydrogen atom is replaced by a radical containing a heteroatom such as oxygen, sulfur, nitrogen or halogen, or in which a radical containing a heteroatom such as oxygen, sulfur or nitrogen intervenes between carbon atoms, so that a hydroxyl radical, cyano radical, carbonyl radical, ether bond, ester bond, sulfonic acid ester bond, carbonate bond, lactone ring, sultone ring, carboxylic acid anhydride or haloalkyl radical may be contained.

$R^Y$ is hydrogen or a linear, branched or cyclic $C_1$-$C_{20}$ monovalent hydrocarbon group which may contain a heteroatom. Suitable monovalent hydrocarbon groups include alkyl groups such as methyl, ethyl, n-propyl, isopropyl, n-butyl, t-butyl, cyclopropyl, cyclopentyl, cyclohexyl, cyclopropylmethyl, 4-methylcyclohexyl, cyclohexylmethyl, norbornyl, and adamantyl; alkenyl groups such as vinyl, allyl, propenyl, butenyl, hexenyl, and cyclohexenyl; aryl groups such as phenyl, naphthyl and thienyl; and aralkyl groups such as benzyl, 1-phenylethyl, and 2-phenylethyl. Inter alia, aryl groups are preferred. Also included are the foregoing groups in which at least one hydrogen atom is replaced by a radical containing a heteroatom such as oxygen, sulfur, nitrogen or halogen, or in which a radical containing a heteroatom such as oxygen, sulfur or nitrogen intervenes between carbon atoms, so that a hydroxyl radical, cyano radical, carbonyl radical, ether bond, ester bond, sulfonic acid ester bond, carbonate bond, lactone ring, sultone ring, carboxylic acid anhydride or haloalkyl radical may be contained.

$R^{150}$, $R^{250}$ and $R^{350}$ are each independently hydrogen or a straight, branched or cyclic $C_1$-$C_{20}$ monovalent hydrocarbon group which may contain a heteroatom. Suitable monovalent hydrocarbon groups are as exemplified above for $R^Y$. Any two or more of $R^{150}$, $R^{250}$ and $R^{350}$ may bond together to form a ring with the sulfur atom to which they are attached. The subscript m is 0 or 1, n is 0 or 1, with the proviso that n must be 0 when L" is a single bond.

The anion moiety in formula (d1) is exemplified by those structures illustrated in JP-A 2010-113209 and JP-A 2007-145797. The anion moiety in formula (d2) wherein A is hydrogen is exemplified by those structures illustrated in JP-A 2010-116550. The anion moiety in formula (d2) wherein A is trifluoromethyl is exemplified by those structures illustrated in JP-A 2010-077404.

The base resin may have further copolymerized therein recurring units of the structure having a hydroxyl group protected with an acid labile group. The recurring unit of the structure having a hydroxyl group protected with an acid labile group is not particularly limited as long as it has one or more protected hydroxyl-bearing structure such that the protective group may be decomposed to generate a hydroxyl group under the action of acid. Inter alia, recurring units of the structure having the following formula (e1) are preferred.

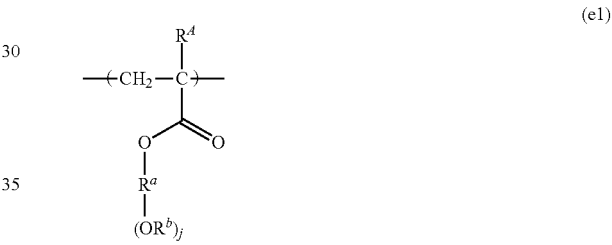

(e1)

Herein $R^A$ is as defined above; $R^a$ is a straight, branched or cyclic $C_1$-$C_{20}$ di- to tetra-valent hydrocarbon group which may contain a heteroatom; $R^b$ is an acid labile group; and j is an integer of 1 to 3.

Examples of the recurring unit of formula (e1) are shown below, but not limited thereto. Notably $R^A$ and $R^b$ are as defined above.

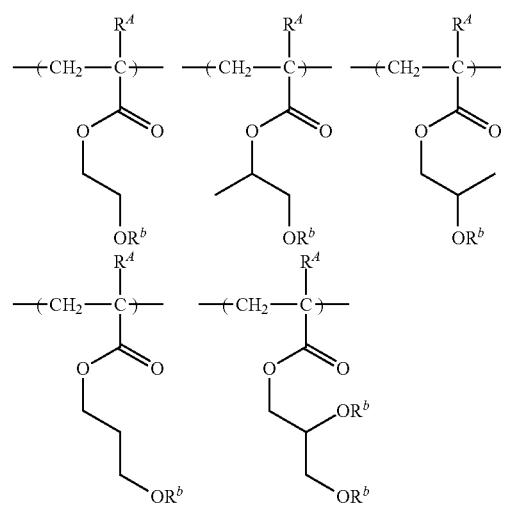

-continued
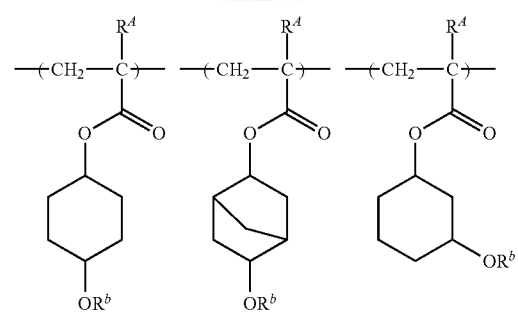
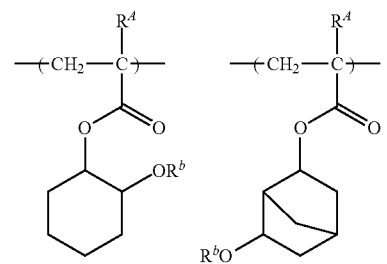
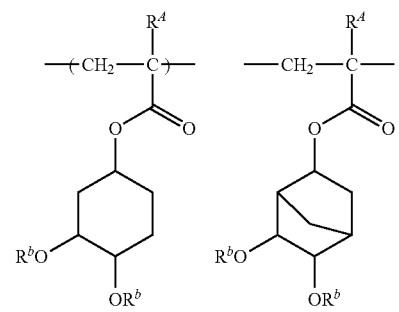
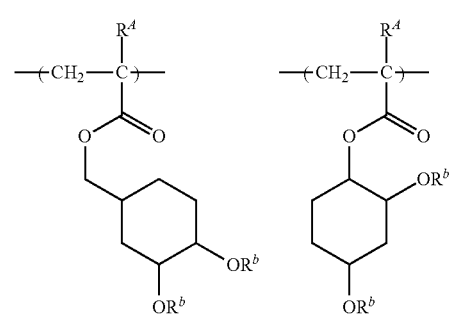
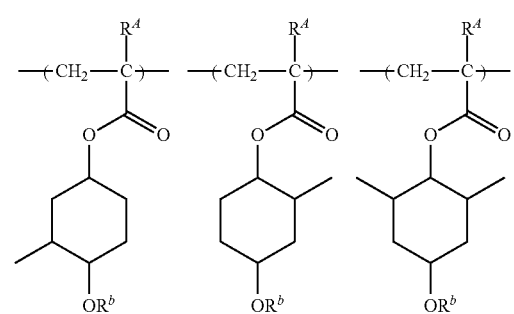
-continued
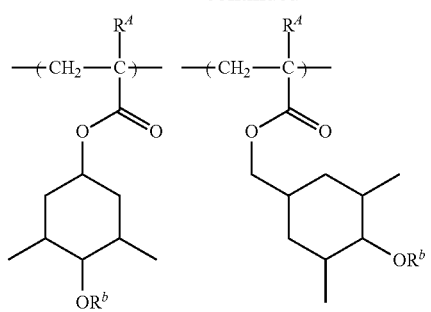
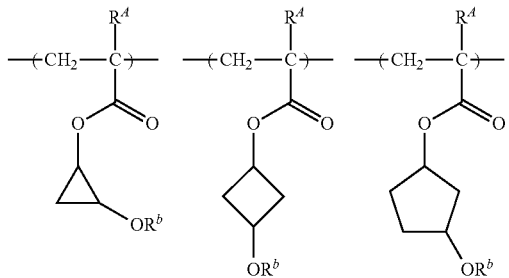
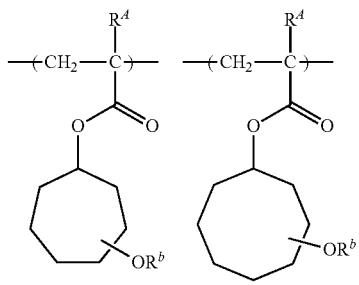
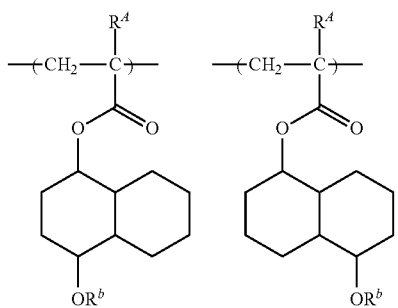
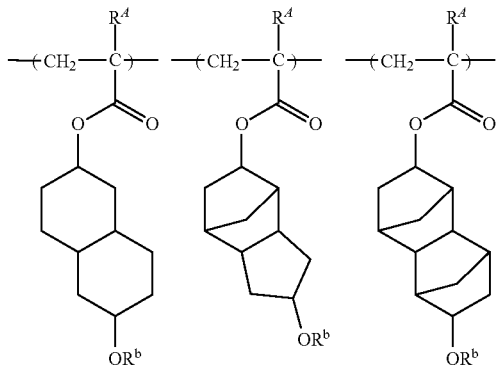

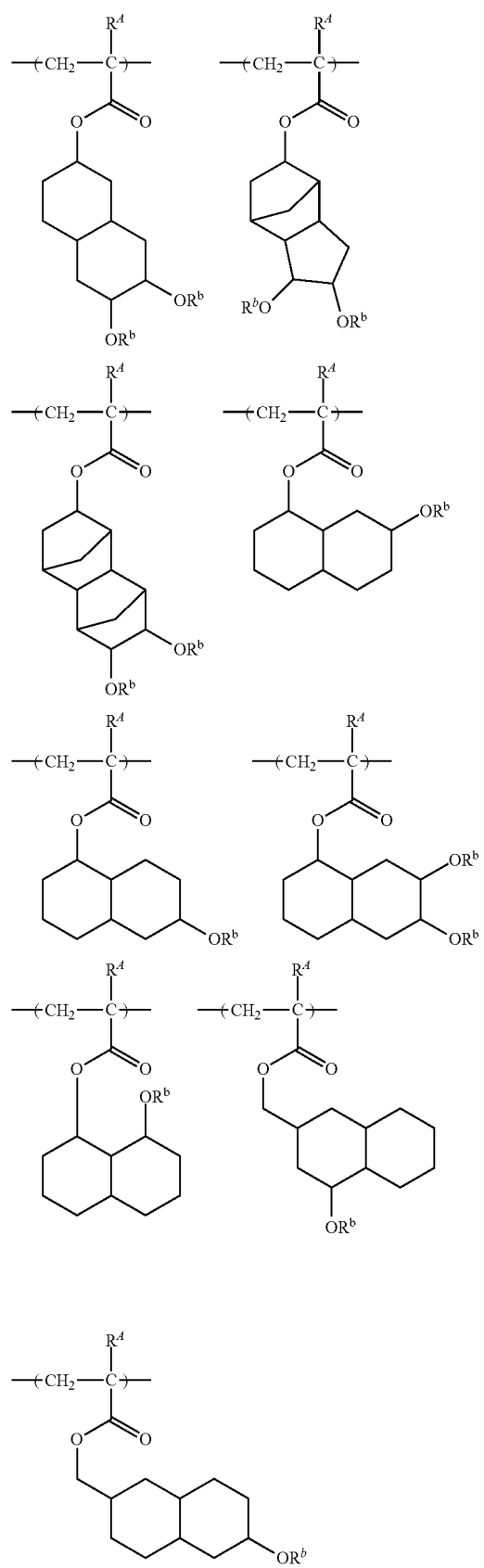
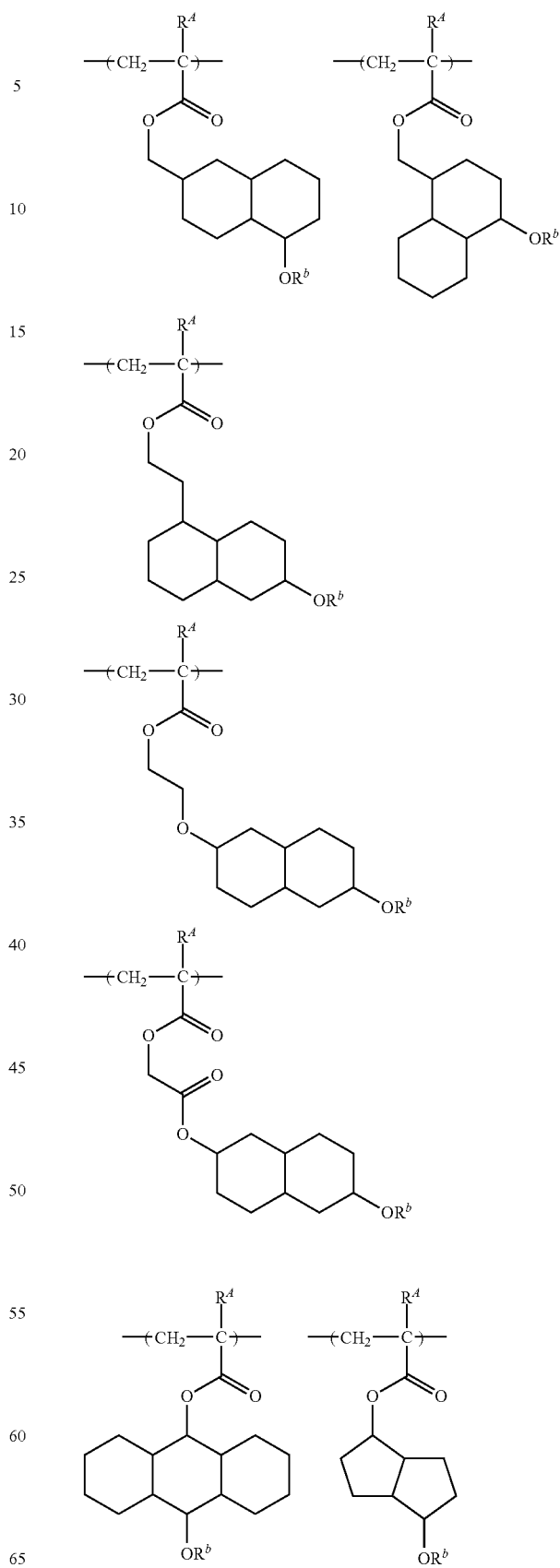

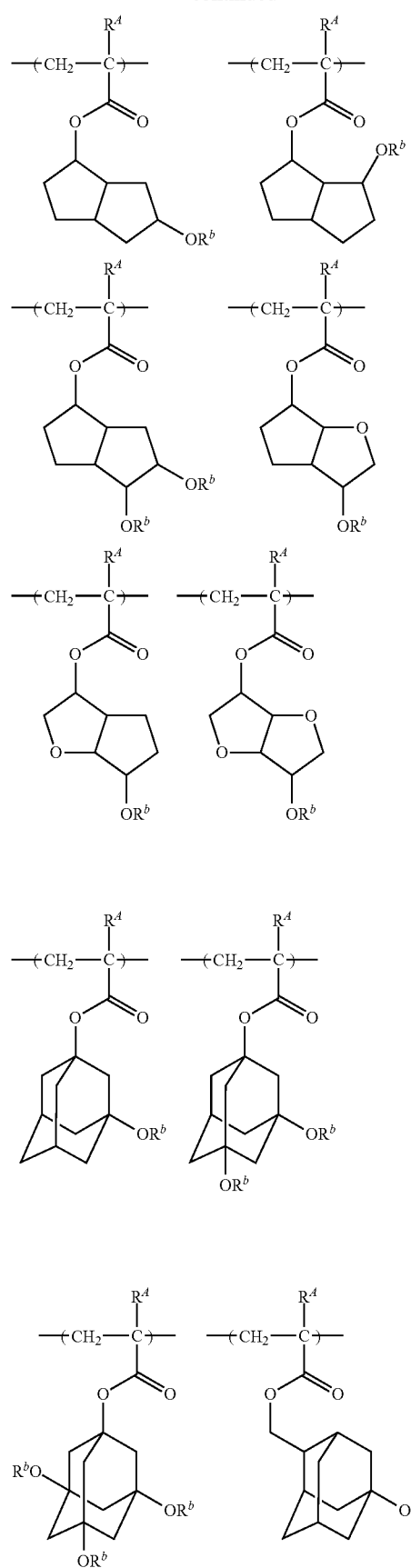
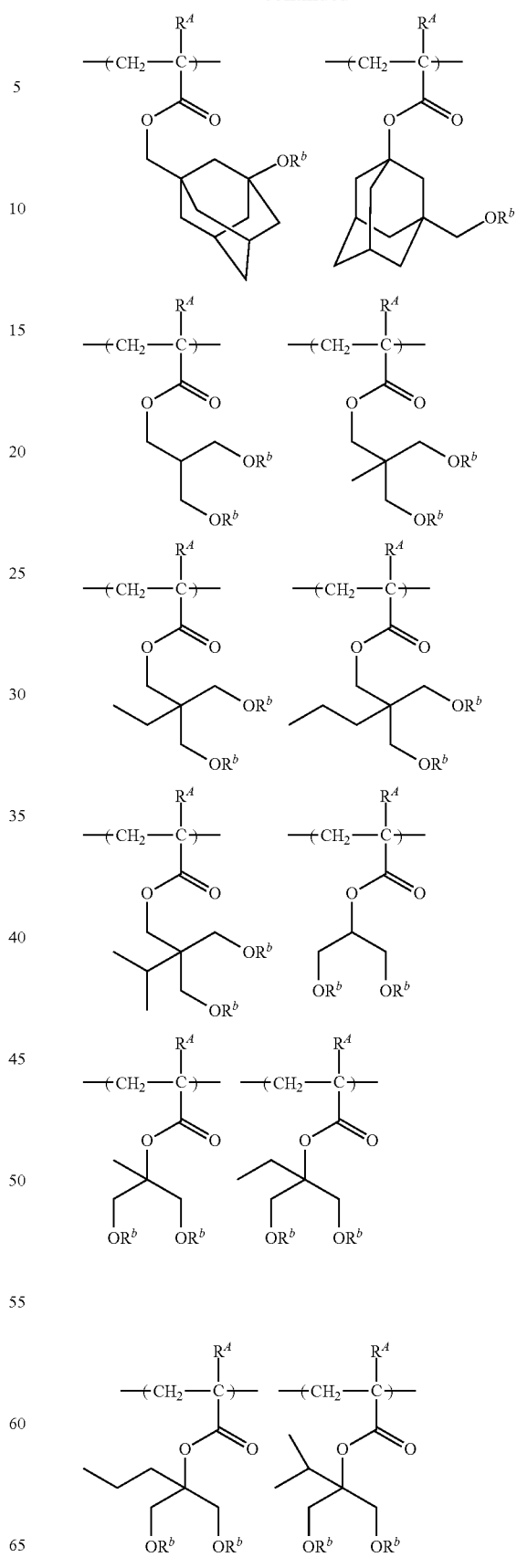

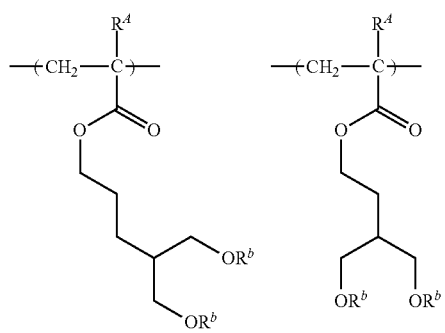

The structure of the acid labile group $R^b$ in formula (e1) is not particularly limited as long as it is deprotected to generate a hydroxyl group under the action of acid. Typical acid labile groups are groups of acetal or ketal structure and alkoxycarbonyl groups, with their examples being shown below.

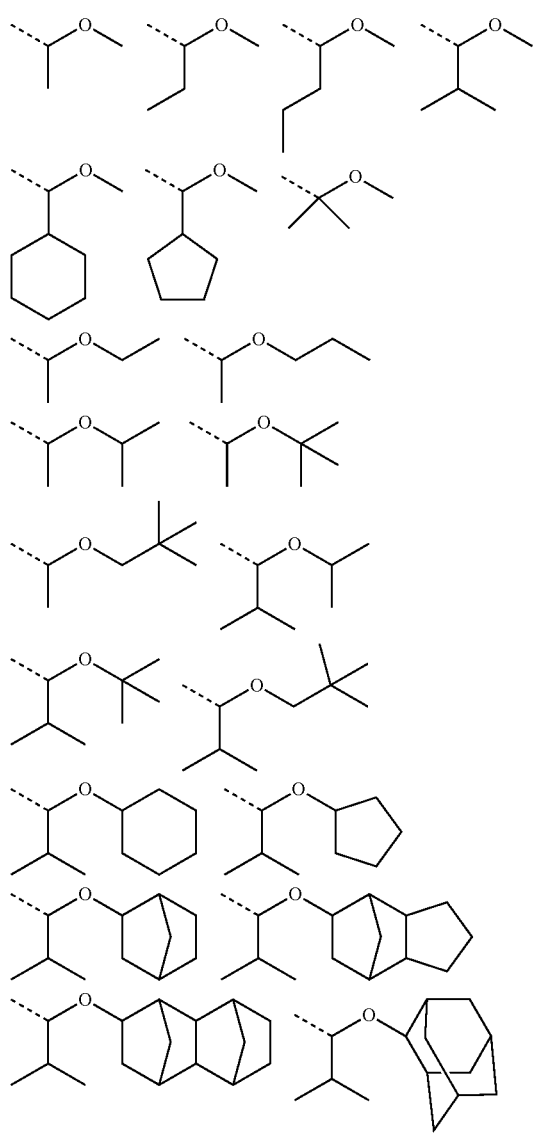

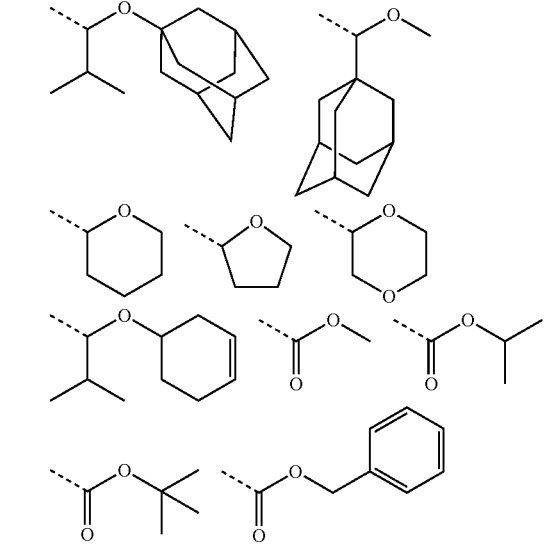

Of the acid labile group $R^b$ in formula (e1), preferred are alkoxymethyl groups having the general formula (e2):

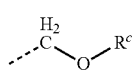 (e2)

wherein $R^c$ is a straight, branched or cyclic $C_1$-$C_{15}$ monovalent hydrocarbon group.

Examples of the acid labile group of formula (e2) are shown below, but not limited thereto.

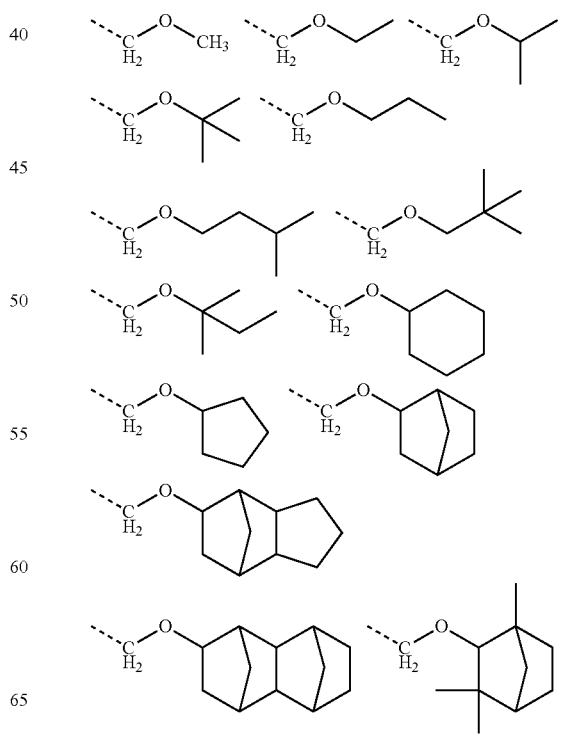

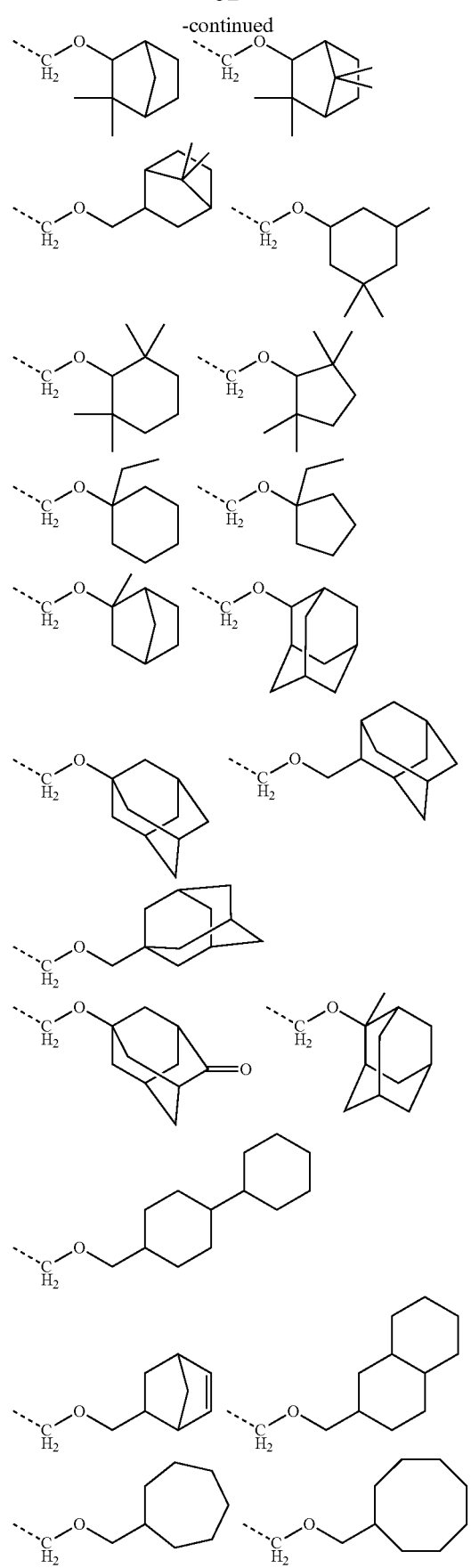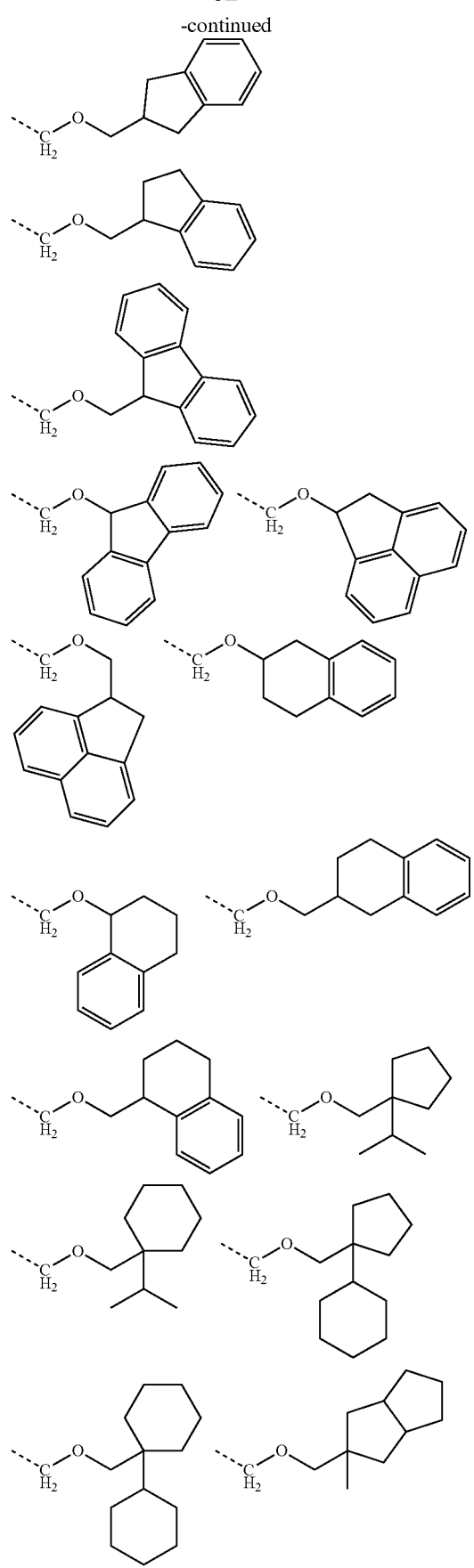

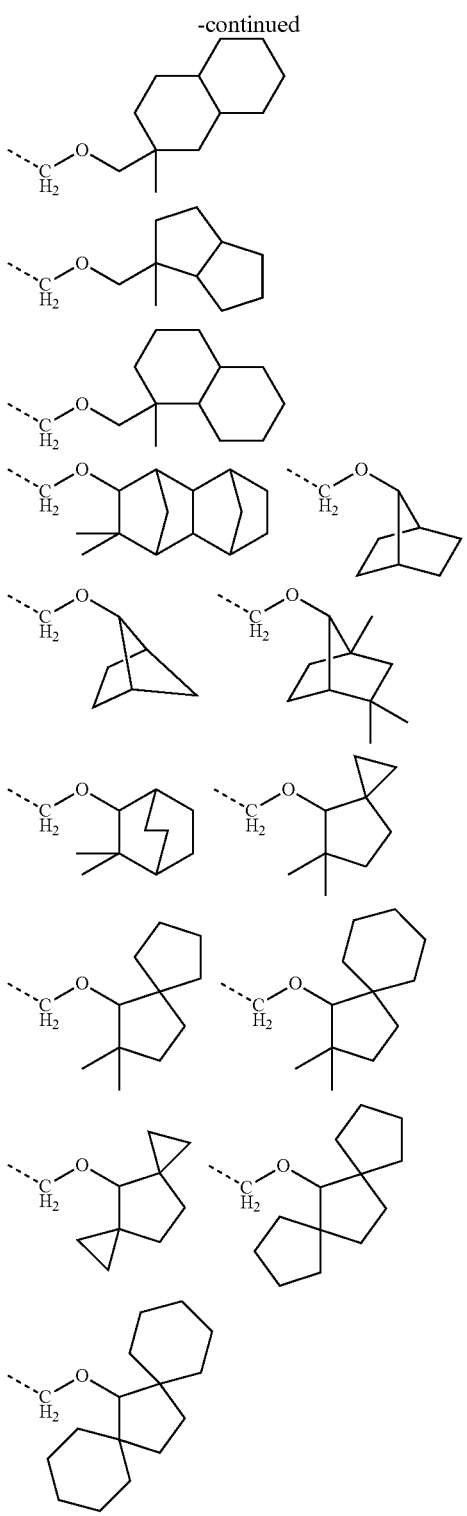

drides such as itaconic anhydride, and other monomers. Also, hydrogenated ROMP polymers as described in JP-A 2003-066612 may be used.

The base resin (B) preferably has a weight average molecular weight (Mw) of 1,000 to 500,000, and more preferably 3,000 to 100,000, as measured by gel permeation chromatography (GPC) versus polystyrene standards using tetrahydrofuran solvent. Outside the range, there may result an extreme drop of etch resistance, and a drop of resolution due to difficulty to gain a dissolution rate difference before and after exposure.

The general method of synthesizing the base resin for example, by dissolving one or more unsaturated bond-bearing monomers in an organic solvent, adding a radical initiator, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C., and the reaction time is 2 to 100 hours, more preferably 5 to 20 hours. The acid labile group that has been incorporated in the monomer may be kept as such, or polymerization may be followed by protection or partial protection.

While the base resin (B) comprises recurring units derived from monomers, the molar fractions of respective units preferably fall in the following range (mol %), but are not limited thereto:

(I) 1 to 60 mol %, more preferably 5 to 50 mol %, even more preferably 10 to 50 mol % of constituent units of at least one type having formula (2), (II) 40 to 99 mol %, more preferably 50 to 95 mol %, even more preferably 50 to 90 mol % of constituent units of at least one type having formula (3), and optionally, (III) 0 to 30 mol %, more preferably 0 to 20 mol %, and even more preferably 0 to 10 mol % of constituent units of at least one type having formula (d1) or (d2), and optionally, (IV) 0 to 80 mol %, more preferably 0 to 70 mol %, and even more preferably 0 to 50 mol % of constituent units of at least one type derived from another monomer(s).

Component C

The resist composition contains (C) a photoacid generator. Preferably the PAG (C) has the formula (4).

$$M^+X^- \qquad (4)$$

In formula (4), $M^+$ is a sulfonium cation of the formula (4a) or iodonium cation of the formula (4b).

(4a)

(4b)

In addition to the foregoing units, the base resin (B) may further comprise recurring units derived from other monomers, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[6.2.1.1$^{3,6}$.0$^{2,7}$]dodecene derivatives, unsaturated acid anhy- Herein $R^{100}$, $R^{200}$ and $R^{300}$ are each independently a straight, branched or cyclic $C_1$-$C_{20}$ monovalent hydrocarbon group which may contain a heteroatom, any two or more of $R^{100}$, $R^{200}$ and $R^{300}$ may bond together to form a ring with the sulfur atom to which they are attached. $R^{400}$ and $R^{500}$ are each independently a straight, branched or cyclic $C_1$-$C_{20}$ monovalent hydrocarbon group which may contain a heteroatom.

In formula (4), X⁻ is an anion selected from the formulae (4c) to (4f).

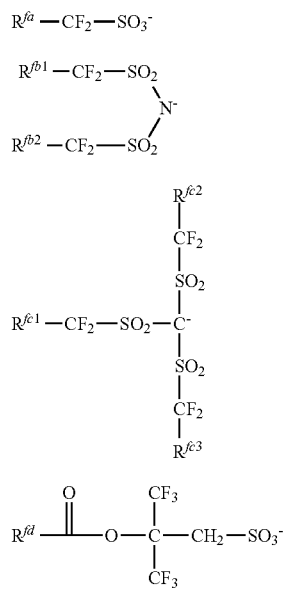

In formula (4c), $R^{fa}$ is fluorine or a straight, branched or cyclic $C_1$-$C_{40}$ monovalent hydrocarbon group which may contain a heteroatom.

Of the anions of formula (4c), a structure having formula (4c') is preferred.

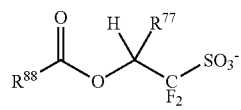

In formula (4c'), $R^{77}$ is hydrogen or trifluoromethyl. $R^{58}$ is a straight, branched or cyclic $C_1$-$C_{38}$ monovalent hydrocarbon group which may contain a heteroatom. Suitable heteroatoms include oxygen, nitrogen, sulfur and halogen, with oxygen being preferred. Of the monovalent hydrocarbon groups, those of 6 to 30 carbon atoms are preferred because a high resolution is available in fine pattern formation. Suitable monovalent hydrocarbon groups include methyl, ethyl, propyl, isopropyl, n-butyl, s-butyl, t-butyl, t-pentyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0²,⁶]decanyl, and adamantyl. Also included are the foregoing groups in which at least one hydrogen is replaced by a radical containing a heteroatom such as oxygen, sulfur, nitrogen or halogen, or in which a radical containing a heteroatom such as oxygen, sulfur or nitrogen intervenes between carbon atoms, so that the group may contain a hydroxyl radical, cyano radical, carbonyl radical, ether bond, ester bond, sulfonic acid ester bond, carbonate bond, lactone ring, sultone ring, carboxylic acid anhydride or haloalkyl radical.

With respect to the synthesis of the sulfonium salt having an anion of formula (4c'), reference is made to JP-A 2007-145797, JP-A 2008-106045, JP-A 2009-007327, and JP-A 2009-258695. Also useful are the sulfonium salts described in JP-A 2012-041320, JP-A 2012-106986, and JP-A 2012-153644.

Examples of the sulfonium salt having an anion of formula (4c) are shown below, but not limited thereto.

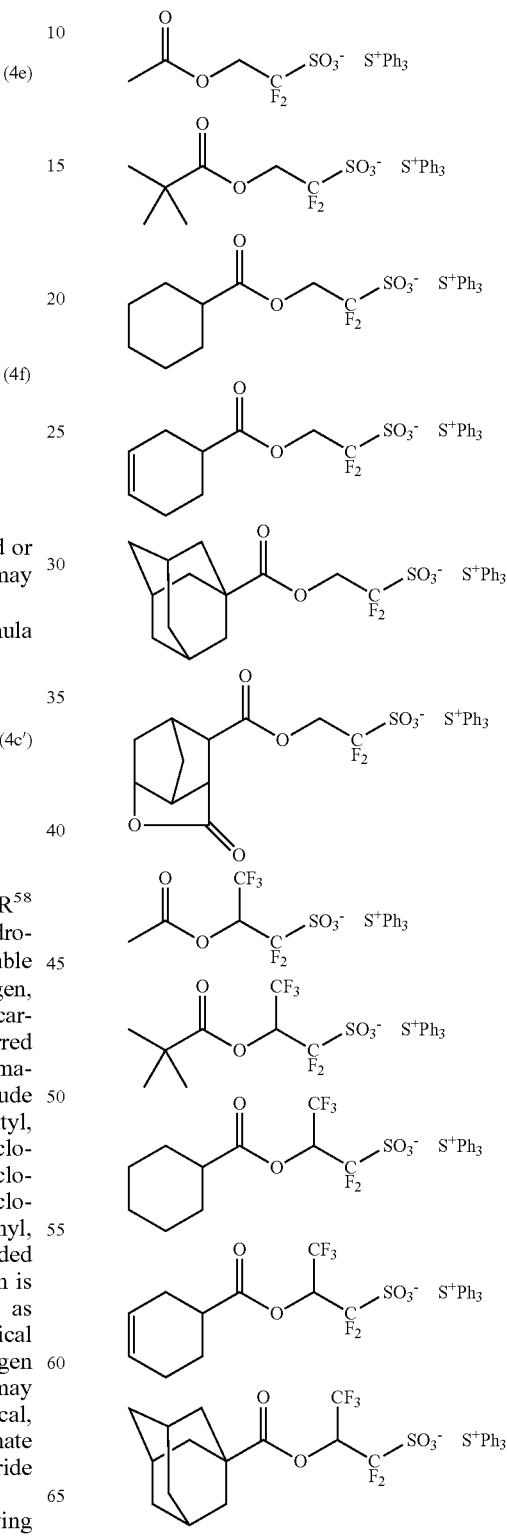

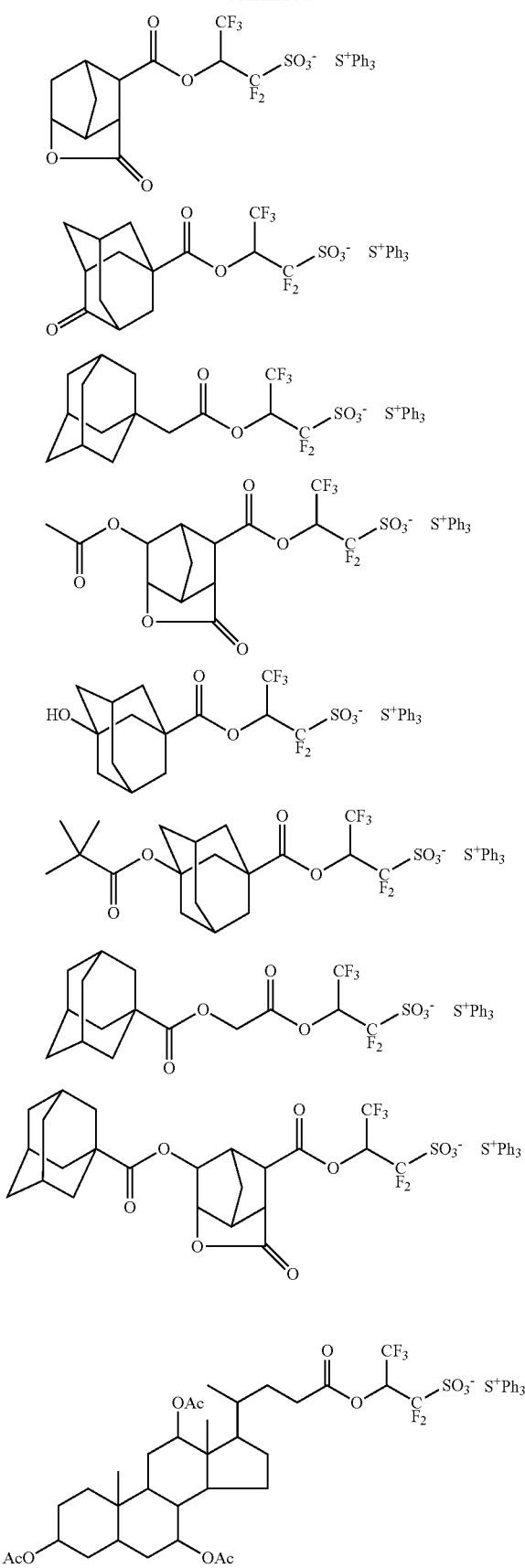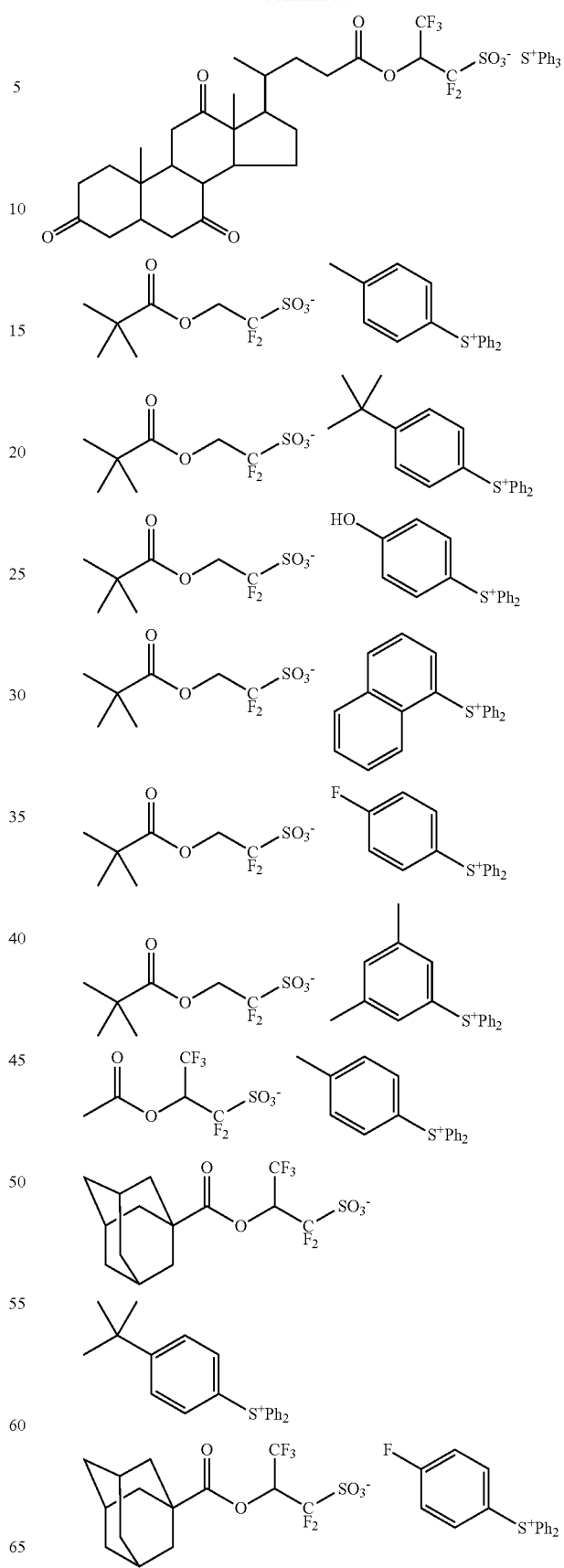

-continued

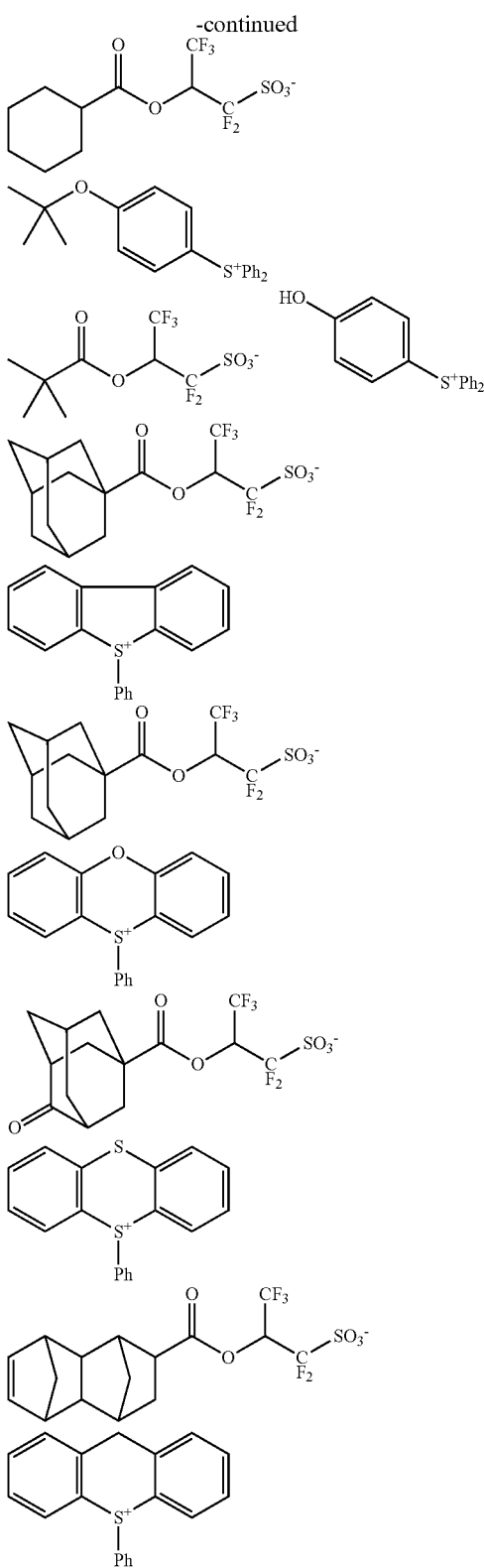

In formula (4d), $R^{fb1}$ and $R^{fb2}$ are each independently fluorine or a straight, branched or cyclic $C_1$-$C_{40}$ monovalent hydrocarbon group which may contain a heteroatom. Suitable monovalent hydrocarbon groups are as exemplified above for $R^{88}$. Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage (—$CF_2$—$SO_2$—$N^-$—$SO_2$—$CF_2$—) to which they are attached, and preferably the pair is a fluorinated ethylene or fluorinated propylene group forming a ring structure.

In formula (4e), $R^{fc1}$, $R^{fc2}$ and $R^{fc3}$ are each independently fluorine or a straight, branched or cyclic $C_1$-$C_{40}$ monovalent hydrocarbon group which may contain a heteroatom. Suitable monovalent hydrocarbon groups are as exemplified above for $R^{88}$. Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage (—$CF_2$—$SO_2$—$C^-$—$SO_2$—$CF_2$—) to which they are attached, and preferably the pair is a fluorinated ethylene or fluorinated propylene group forming a ring structure.

In formula (4f), $R^{fd}$ is a straight, branched or cyclic $C_1$-$C_{40}$ monovalent hydrocarbon group which may contain a heteroatom. Suitable monovalent hydrocarbon groups are as exemplified above for $R^{88}$.

With respect to the synthesis of the sulfonium salt having an anion of formula (4f), reference is made to JP-A 2010-215608 and JP-A 2014-133723.

Examples of the sulfonium salt having an anion of formula (4f) are shown below, but not limited thereto.

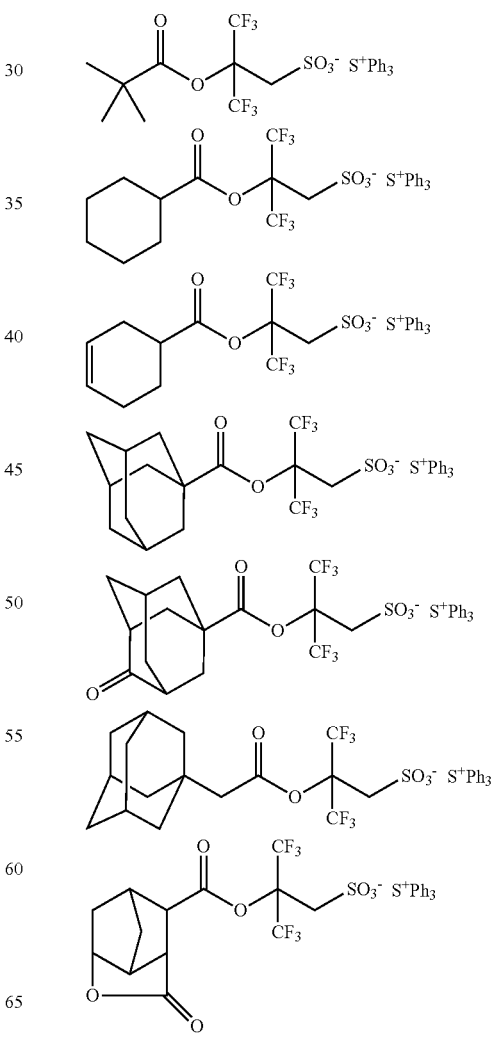

-continued
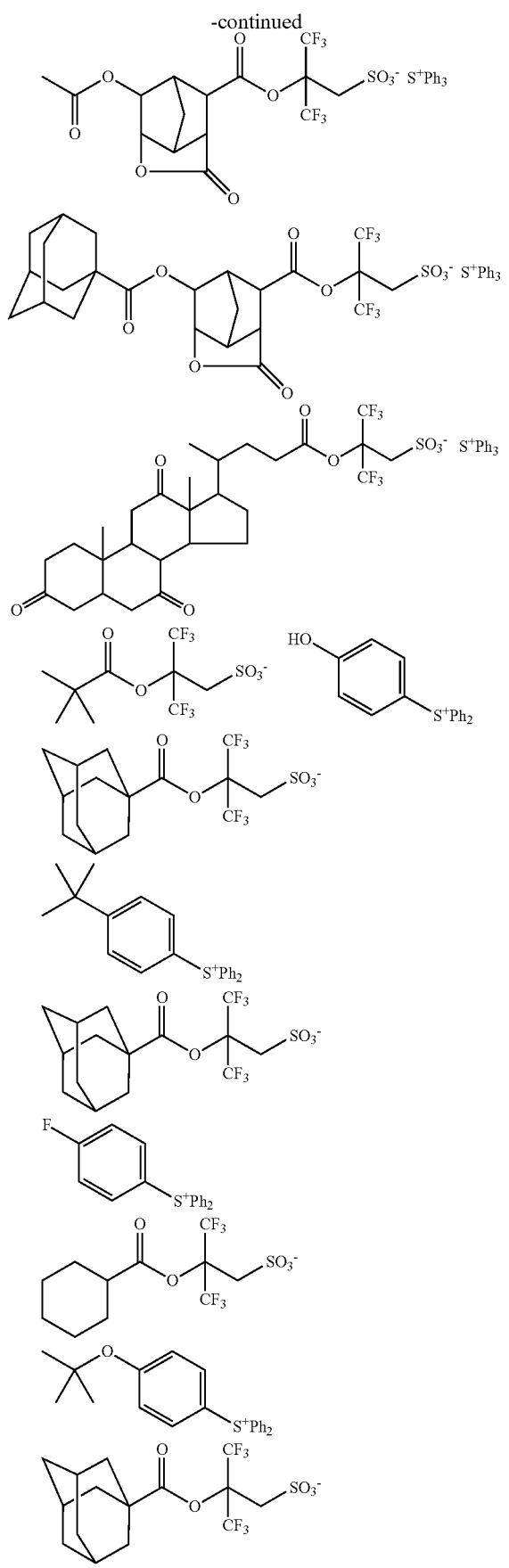
-continued
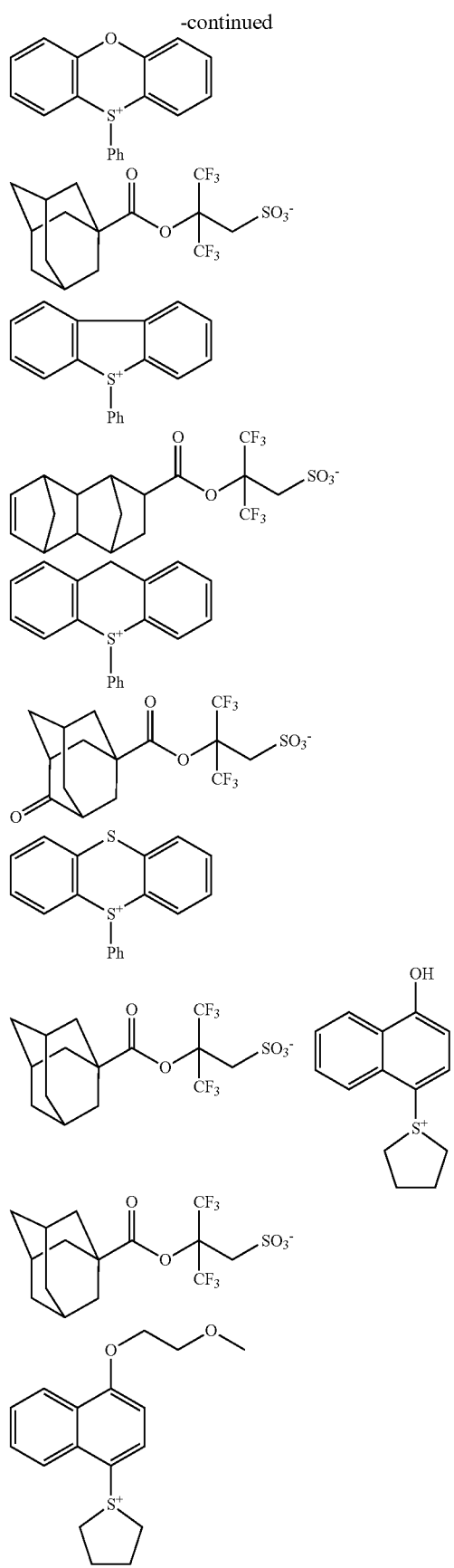

The compound having the anion of formula (4f) has a sufficient acid strength to cleave acid labile groups in the resist polymer because it is free of fluorine at α-position of sulfa group, but has two trifluoromethyl groups at β-position. Thus the compound is a useful PAG.

Of the PACs mentioned above, those having an anion of formula (4c') or (4f) are preferred because of slow acid diffusion and high solubility in the resist solvent.

Also preferably the PAG (C) has the formula (5).

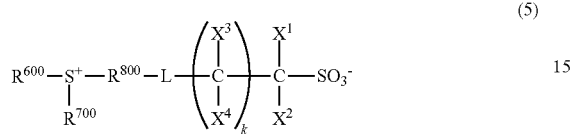

(5)

In formula (5), $R^{600}$ and $R^{700}$ are each independently a straight, branched or cyclic $C_1$-$C_{20}$ monovalent hydrocarbon group which may contain a heteroatom. Suitable monovalent hydrocarbon groups include $C_1$-$C_{20}$ alkyl groups, $C_2$-$C_{20}$ alkenyl groups, $C_1$-$C_{20}$ oxoalkyl groups, $C_6$-$C_{20}$ aryl groups, $C_7$-$C_{20}$ aralkyl groups, and $C_7$-$C_{20}$ aryloxoalkyl groups.

Suitable alkyl groups include methyl, ethyl, propyl, isopropyl, n-butyl, s-butyl, t-butyl, t-pentyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl. Also included are the foregoing groups in which at least one hydrogen is replaced by a radical containing a heteroatom such as oxygen, sulfur, nitrogen or halogen, or in which a radical containing a heteroatom such as oxygen, sulfur or nitrogen intervenes between carbon atoms, so that the group may contain a hydroxyl radical, cyano radical, carbonyl radical, ether bond, ester bond, sulfonic acid ester bond, carbonate bond, lactone ring, sultone ring, carboxylic acid anhydride or haloalkyl radical.

Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, thienyl, alkoxyphenyl groups (e.g., 4-hydroxyphenyl, 4-methoxyphenyl, 3-methoxyphenyl, 2-methoxyphenyl, 4-ethoxyphenyl, 4-t-butoxyphenyl, 3-t-butoxyphenyl), alkylphenyl groups (e.g., 2-methylphenyl, 3-methylphenyl, 4-methylphenyl, 4-ethylphenyl, 4-t-butylphenyl, 4-n-butylphenyl, 2,4-dimethylphenyl), alkylnaphthyl groups (e.g., methylnaphthyl, ethylnaphthyl), alkoxynaphthyl groups (e.g., methoxynaphthyl, ethoxynaphthyl, n-propoxynaphthyl, n-butoxynaphthyl), dialkylnaphthyl groups (e.g., dimethylnaphthyl, diethylnaphthyl), and dialkoxynaphthyl groups (e.g., dimethoxynaphthyl, diethoxynaphthyl). Suitable aralkyl groups include benzyl, 1-phenylethyl, and 2-phenylethyl. Suitable aryloxoalkyl groups are 2-aryl-2-oxoethyl groups including 2-phenyl-2-oxoethyl, 2-(1-naphthyl)-2-oxoethyl, and 2-(2-naphthyl)-2-oxoethyl.

$R^{600}$ and $R^{700}$ may bond together to form a ring with the sulfur atom to which they are attached. Suitable ring structures are shown below, but not limited thereto.

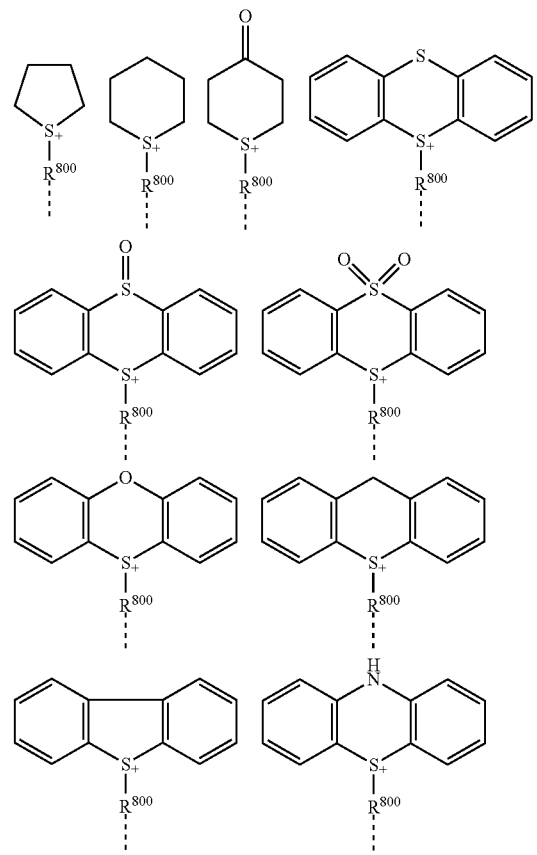

Herein $R^{800}$ is as defined above.

In formula (5), $R^{800}$ is a straight, branched or cyclic $C_1$-$C_{20}$ divalent hydrocarbon group which may contain a heteroatom. Suitable heteroatoms include oxygen, nitrogen, sulfur and halogen, with oxygen being preferred. Suitable divalent hydrocarbon groups include linear alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; saturated cyclic divalent hydrocarbon groups such as cyclopentanediyl, cyclohexanediyl, norbornanediyl, and adamantanediyl; and unsaturated cyclic divalent hydrocarbon groups such as phenylene and naphthylene. Also included are the foregoing groups in which at least one hydrogen atom is replaced by an alkyl group such as methyl, ethyl, propyl, n-butyl or t-butyl, or in which at least one hydrogen atom is replaced by a radical containing a heteroatom such as oxygen, sulfur, nitrogen or halogen, or in which a radical containing a heteroatom such as oxygen, sulfur or nitrogen intervenes between carbon atoms, so that a hydroxyl radical, cyano radical, carbonyl radical, ether bond, ester bond, sulfonic acid ester bond, carbonate bond, lactone ring, sultone ring, carboxylic acid anhydride or haloalkyl radical may be contained.

$R^{600}$ and $R^{800}$ may bond together to form a ring with the sulfur atom to which they are attached. Suitable ring structures are shown below, but not limited thereto.

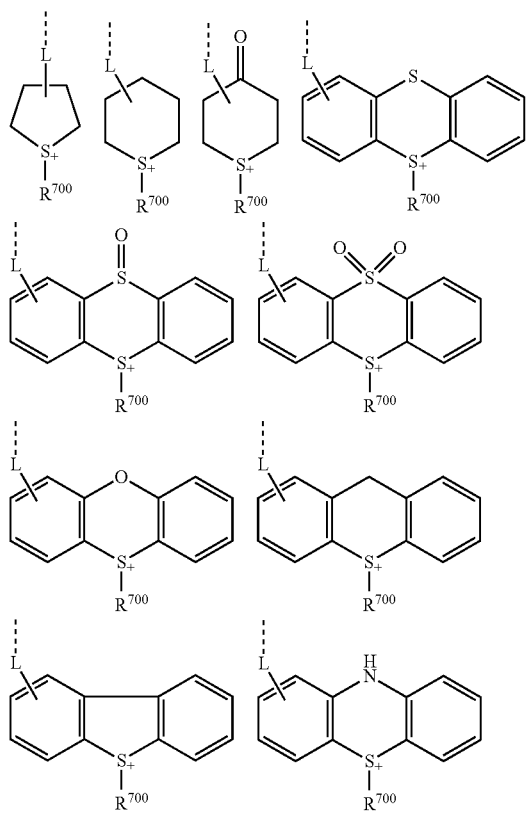

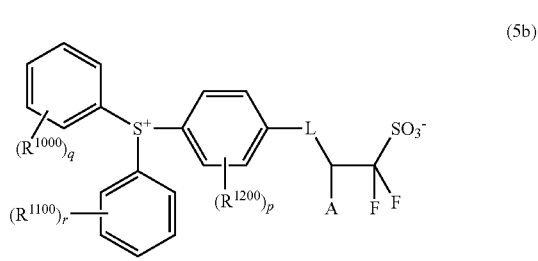

In formula (5b), A is hydrogen or trifluoromethyl, $R^{1000}$, $R^{1100}$, $R^{1200}$, p, q, r, and L are as defined above.

Examples of the PAG having formula (5) are shown below, but not limited thereto. In the formulae, A is as defined above.

Herein $R^{700}$ is as defined above.

In formula (5), L is a single bond or linking group. Suitable linking groups include an ether bond, ester bond, sulfonic acid ester bond, carbonate bond and amide bond, but are not limited thereto.

In formula (5), $X^1$ and $X^2$ are each independently fluorine or trifluoromethyl. $X^3$ and $X^4$ are each independently hydrogen, fluorine or trifluoromethyl, and k is an integer of 0 to 3.

Of the PACs having formula (5), those having formula (5a) are preferred.

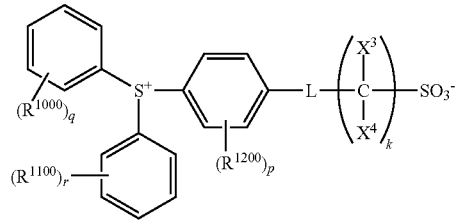

In formula (5a), $R^{1000}$, $R^{1100}$ and $R^{1200}$ are each independently hydrogen or a straight, branched or cyclic $C_1$-$C_{20}$ monovalent hydrocarbon group which may contain a heteroatom. Suitable monovalent hydrocarbon groups are as exemplified above for $R^{88}$. Preferred monovalent hydrocarbon groups are methyl, methoxy, t-butyl and t-butoxy.

In formula (5a), q and r each are an integer of 0 to 5, preferably 0 or 1, p is an integer of 0 to 4, preferably 0 to 2. L, $X^3$, $X^4$, and k are as defined above.

Of the PAGS having formula (5a), those having formula (5b) are more preferred.

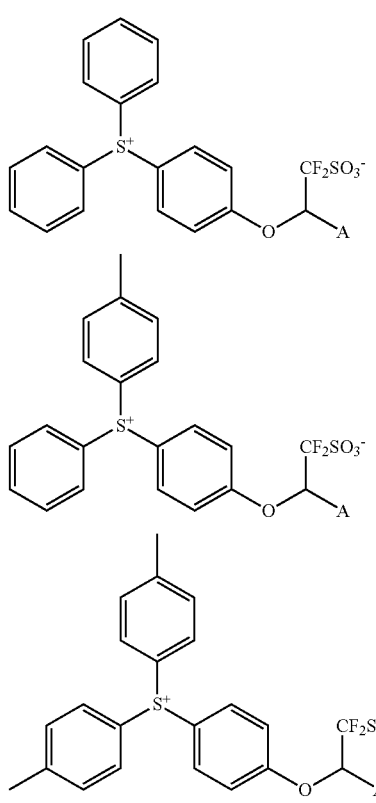

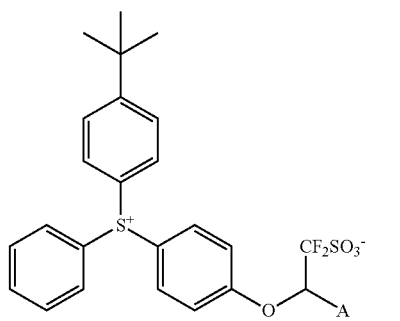

77
-continued
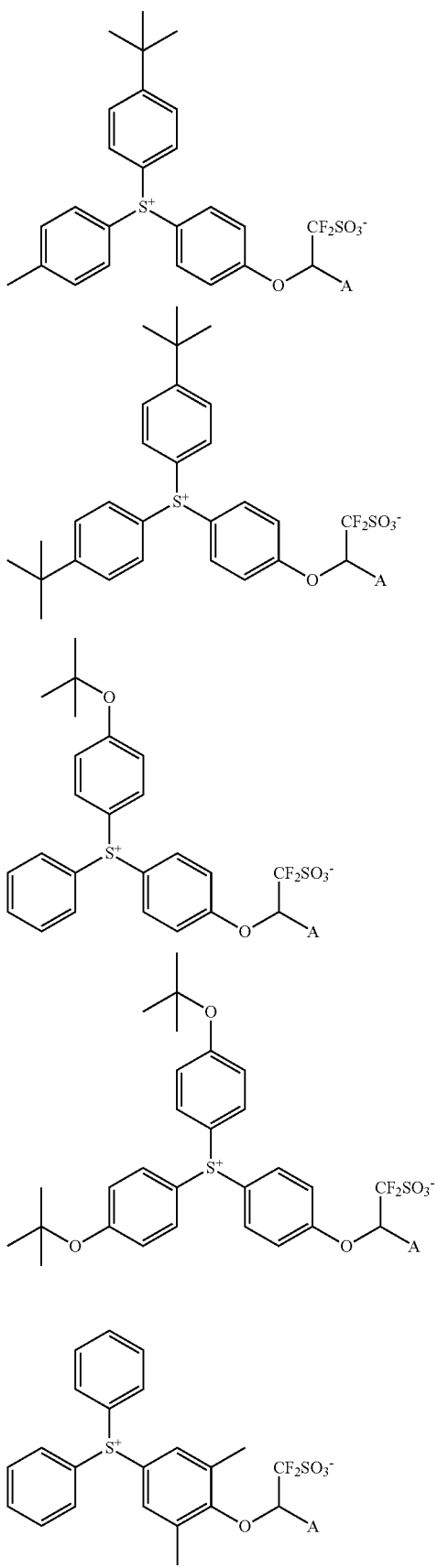
78
-continued
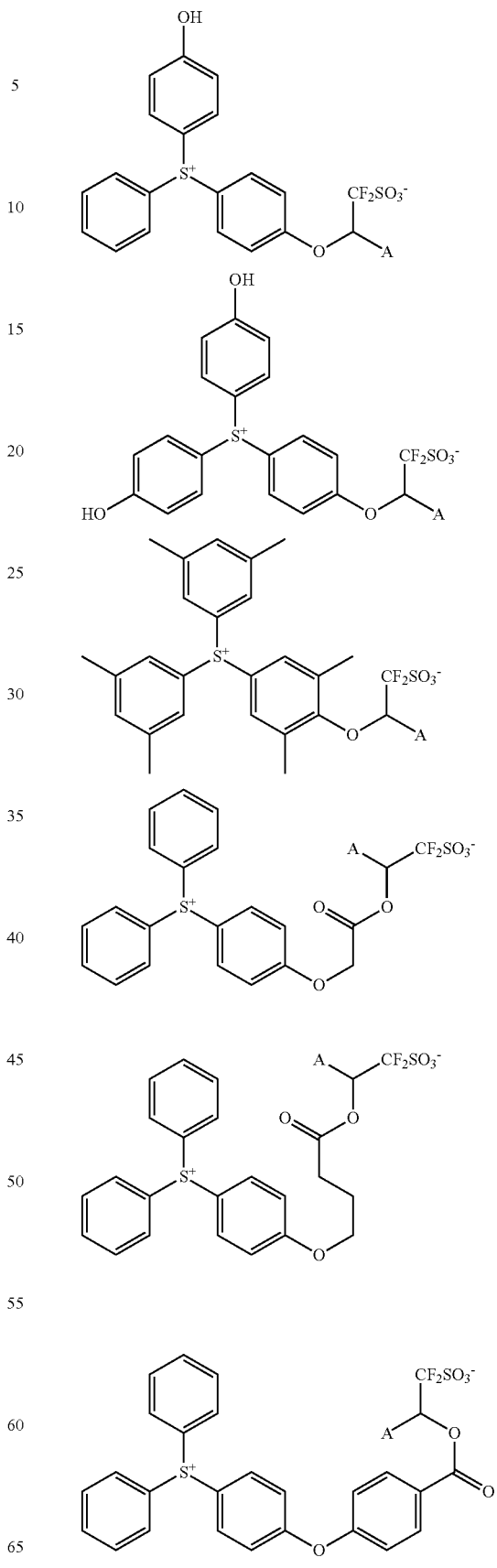

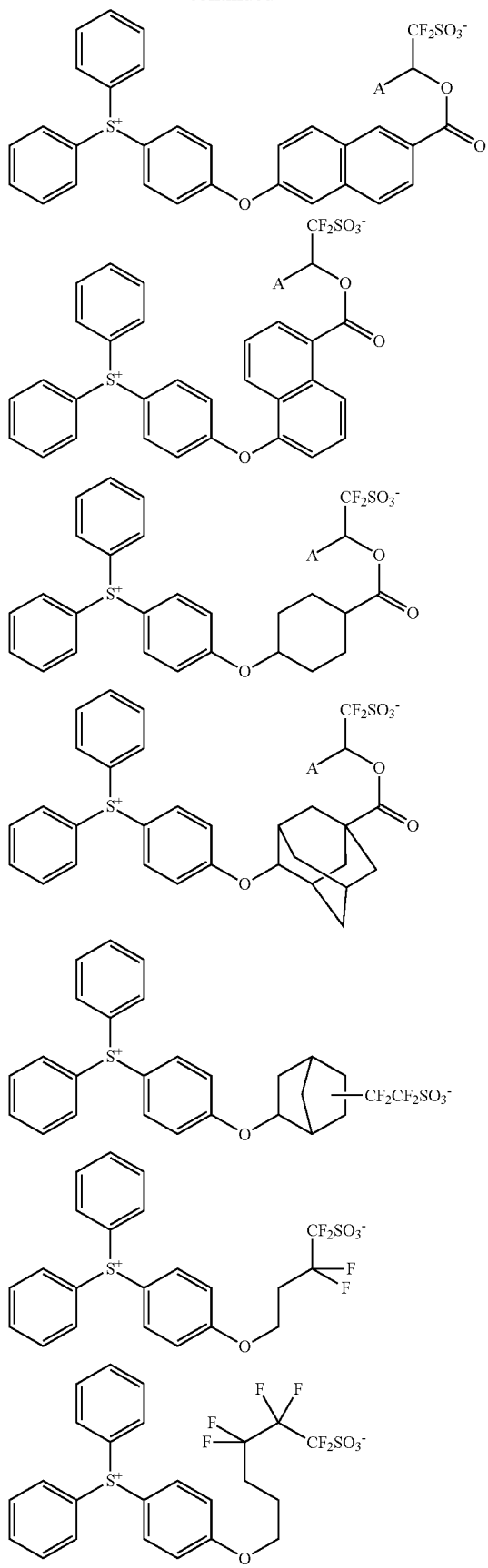

An appropriate amount of the PAG (C) added is 0.01 to 40 parts, more preferably 0.1 to 40 parts, and even more preferably 0.1 to 20 parts by weight per 100 parts by weight of the base resin (B). An amount in the range ensures good resolution and leaves no foreign particles after resist development or during separation.

While the PAG is essential for the inventive resist composition, the composition may further comprise another PAG (other than the PAG having formula (4) or (5)). The other PAG may be any compound capable of generating an acid upon exposure to high-energy radiation. Suitable other PAGs include sulfonium salts, iodonium salts, sulfonyldiazomethane, N-sulfonyloxyimide, and oxime-O-sulfonate acid generators, which may be used alone or in admixture. Examples of the other PAG are described in SF-A 2008-111103, paragraphs [0123] to [0138] (U.S. Pat. No. 7,537,880).

Component D

The resist composition may further comprise (D) an organic solvent. The organic solvent used herein is not particularly limited as long as the base resin, PAG, acid diffusion regulator (or quencher) and other additives are soluble therein. Examples of the organic solvent (D) are described in JP-A 2008-111103, paragraphs [0144] to [0145]. Exemplary solvents include ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, and mixtures thereof. Where the acid labile group used is of acetal type, a high-boiling alcohol solvent may be added for accelerating deprotection reaction of acetal, for example, diethylene glycol, propylene glycol, glycerol, 1,4-butane diol, and 1,3-butane diol. Of the foregoing organic solvents, 1-ethoxy-2-propanol, PGMEA, cyclohexanone, γ-butyrolactone, and mixtures thereof are preferred since the PAG (C) is highly soluble therein.

The organic solvent (D) is preferably used in an amount of 200 to 5,000 parts, more preferably 400 to 3,000 parts by weight per 100 parts by weight of the base resin (B).

Component E

The resist composition may further comprise (E) a hydrophobic fluoro-resin. The hydrophobic fluoro-resin is a surfactant which is insoluble or substantially insoluble in water, but soluble in a developer. When applied to the ArF immersion lithography using no resist protective film, the hydrophobic fluoro-resin segregates on the surface of resist film as spin coated and functions to substantially prevent water from penetrating or leaching. Thus the hydrophobic fluoro-resin is effective for preventing water-soluble components from being leached out of the resist film, thereby reducing any damage to the exposure tool. In addition, the hydrophobic fluoro-resin is dissolved away during development following exposure and PEB, leaving few foreign particles which become defects. As the hydrophobic fluoro-resin, those resins which are water repellent and enhance water slippage are preferred.

The preferred hydrophobic fluoro-resin (E) is a resin comprising recurring units of at least one type selected from the following recurring units.

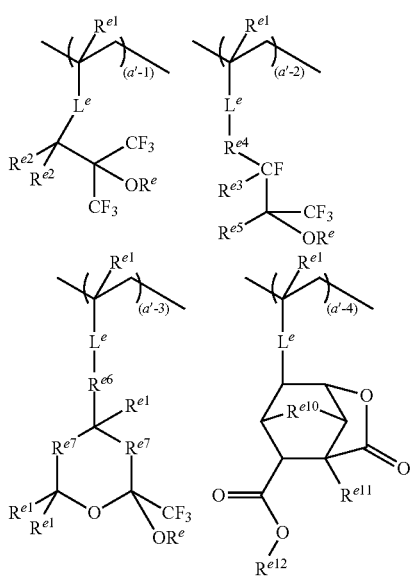

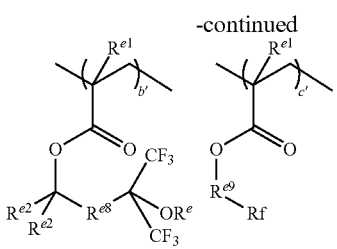

Herein. $R^{e1}$ is each independently hydrogen, fluorine, methyl or trifluoromethyl. $R^{e2}$ is each independently hydrogen or a straight, branched or cyclic $C_1$-$C_2$ alkyl or fluoroalkyl group. Groups $R^{e2}$ within a common unit may bond together to form a ring with the carbon atom to which they are attached, and in this case, they together represent a straight, branched or cyclic alkylene or fluoroalkylene group having 2 to 20 carbon atoms in total.

$R^{e3}$ is fluorine or hydrogen, or bonds with $R^{e4}$ to form a $C_3$-$C_{10}$ non-aromatic ring with the carbon atom to which they are attached. $R^{e4}$ is a straight, branched or cyclic $C_1$-$C_5$ alkylene group in which at least one hydrogen may be substituted by fluorine. $R^{e5}$ is a straight or branched $C_1$-$C_{10}$ alkyl group in which at least one hydrogen is substituted by fluorine. $R^{e4}$ and $R^{e5}$ may bond together to form a non-aromatic ring with the carbon atoms to which they are attached, and in this case, $R^{e4}$, $R^{e5}$ and the carbon atoms together form a $C_3$-$C_{12}$ trivalent organic group.

$R^{e6}$ is a single bond or $C_1$-$C_4$ alkylene group. $R^{e7}$ is each independently a single bond or —$CR^{e1}R^{e1}$—.

$R^{e8}$ is a straight $C_1$-$C_4$ or branched $C_1$-$C_4$ alkylene group, or may bond with $R^{e2}$ in a common unit to form a $C_3$-$C_6$ non-aromatic ring with the carbon atom to which they are attached.

$R^{a9}$ is a straight or branched $C_1$-$C_{10}$ alkylene group. $R^{e10}$ is a methylene group or oxygen. $R^{e11}$ hydrogen, methyl or trifluoromethyl. $R^{e12}$ is a straight, branched or cyclic $C_2$-$C_{20}$ fluoroalkyl group. $R^e$ is hydrogen, a straight, branched or cyclic $C_1$-$C_{15}$ monovalent hydrocarbon or fluorinated hydrocarbon group, or an acid labile group. In the monovalent hydrocarbon group represented by $R^e$, any constituent —$CH_2$— may be replaced by —O— or —C(=O)—.

Rf is a $C_3$-$C_6$ straight perfluoroalkyl group such as 3H-perfluoropropyl, 4H-perfluorobutyl, 5H-perfluoropentyl or 6H-perfluorohexyl. $L^e$ is each independently —C(=O)—O—, —O—, or —C(=O)—$R^{e13}$—C(=O)—O— wherein $R^{e13}$ is a straight, branched or cyclic $C_1$-$C_{10}$ alkylene group.

The subscripts are numbers falling in the range:
$0 \le (a'-1) \le 1$, $0 \le (a'-2) \le 1$, $0 \le (a'-3) \le 1$, $0 \le (a'-4) \le 1$, $0 \le b' \le 1$, $0 \le c' \le 1$, $0 < (a'-1)+(a'-2)+(a'-3)+(a'-4)+b'+c' \le 1$.

Illustrative, non-limiting examples of the above recurring units are shown below. Notably, $R^{e1}$ is as defined above.

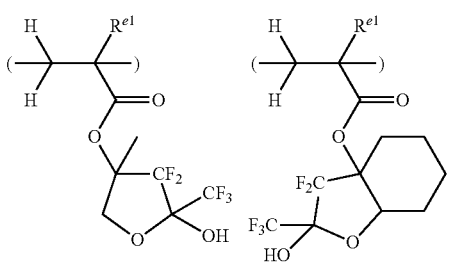

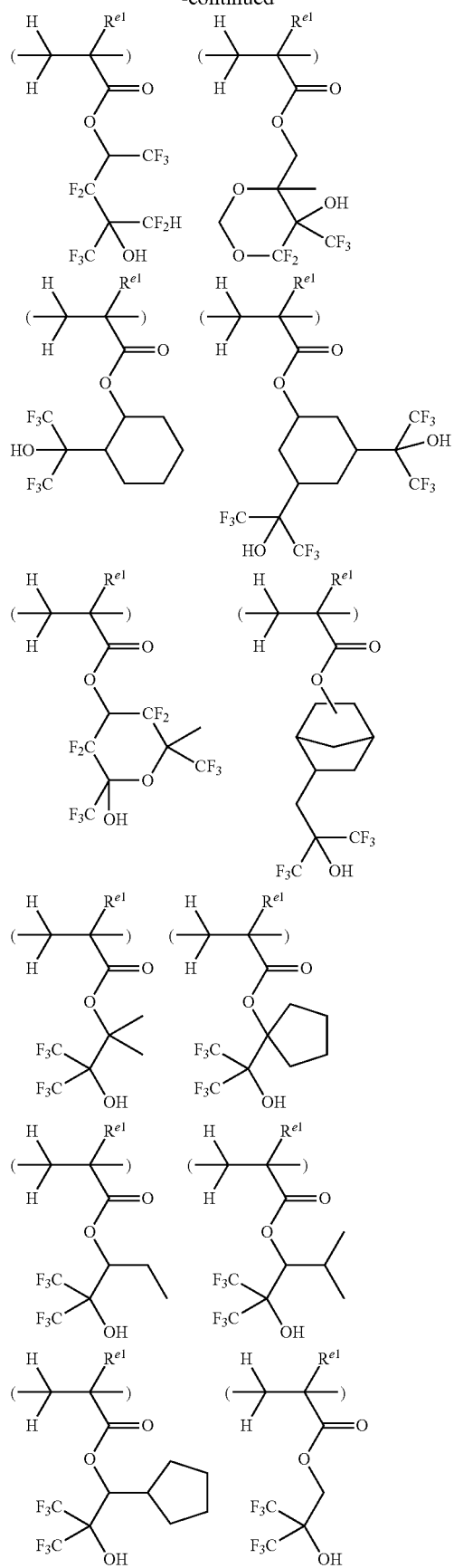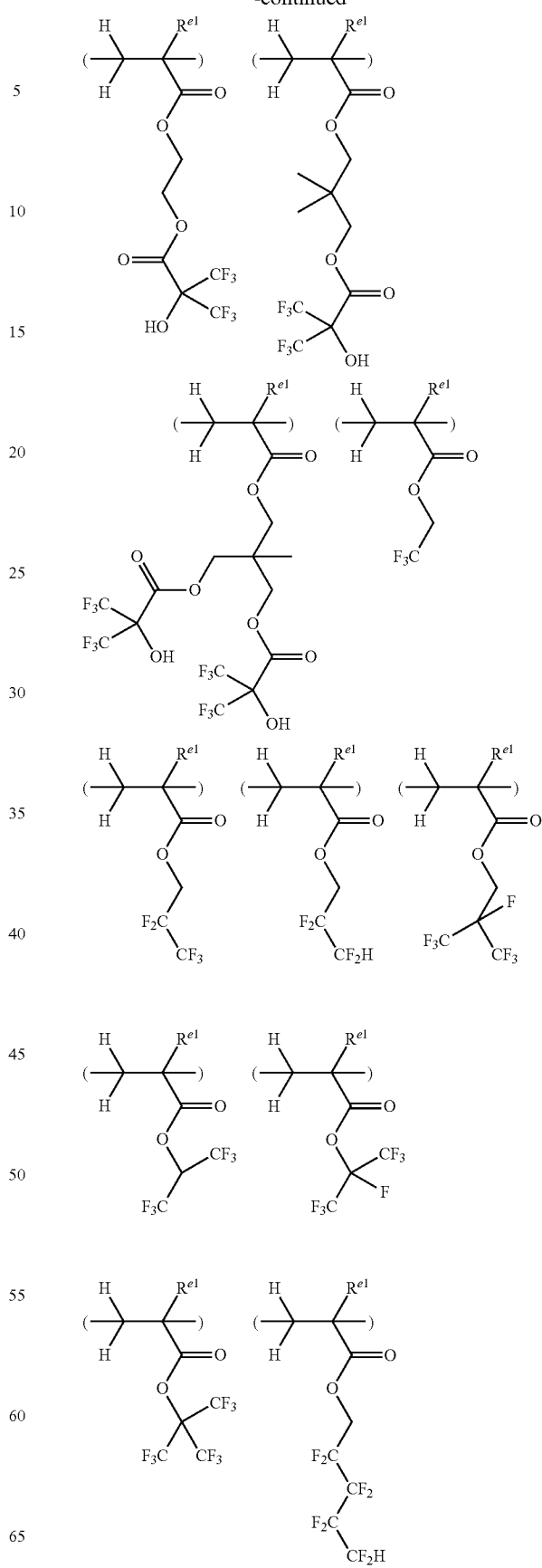

85
-continued
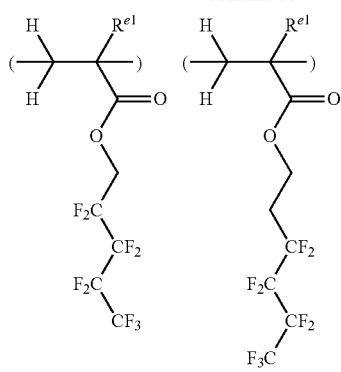
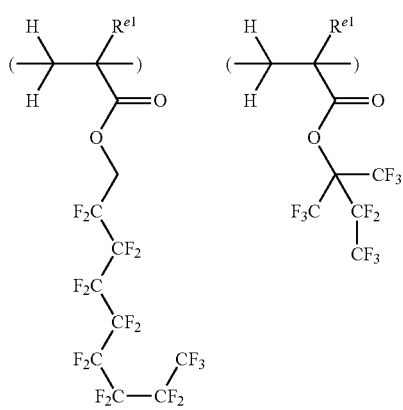
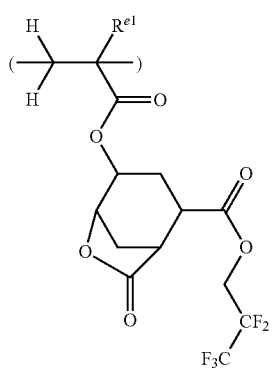
86
-continued
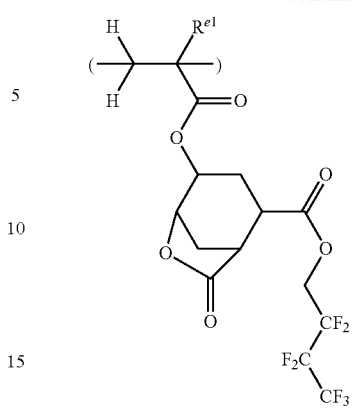
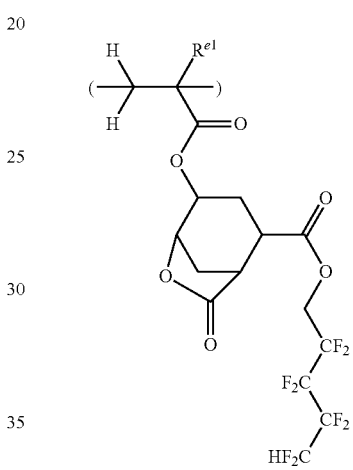
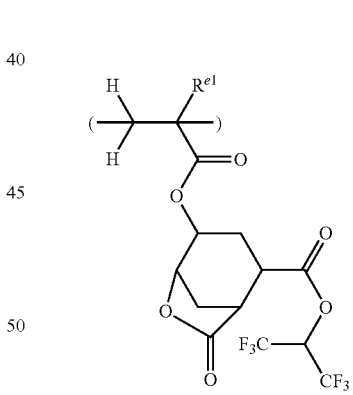
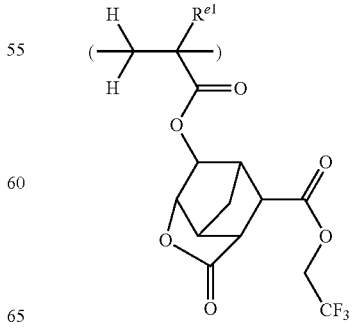

-continued
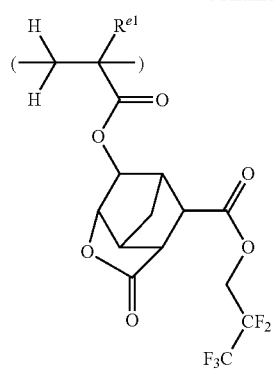
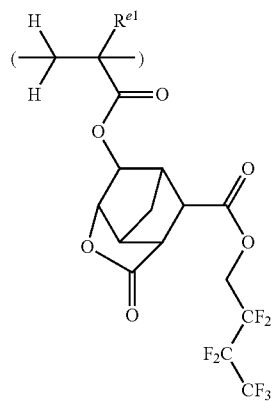
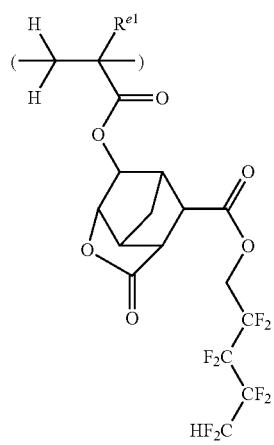
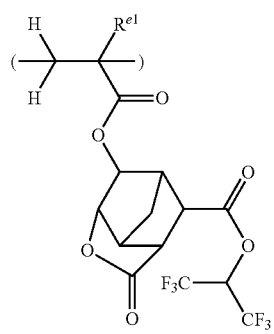
-continued
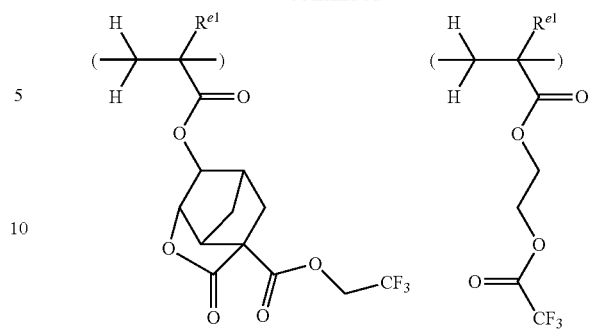
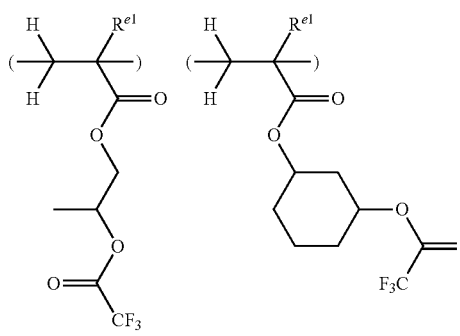
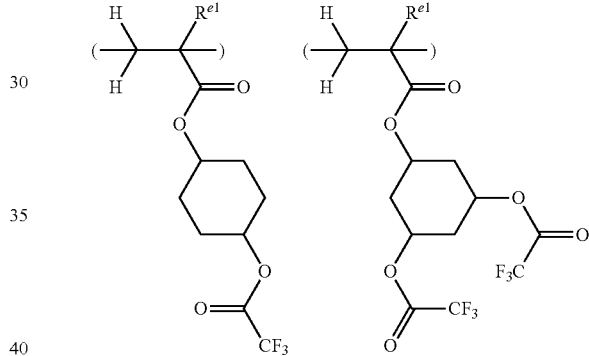
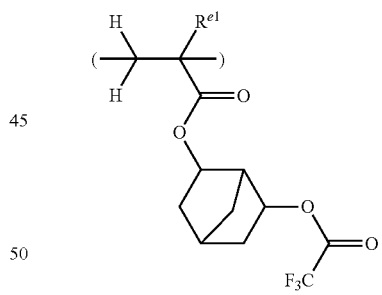
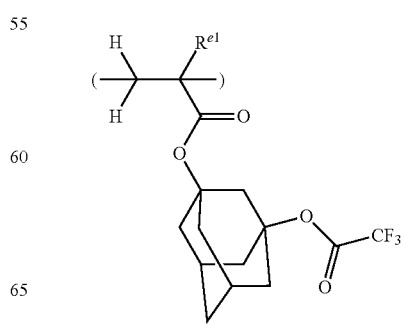

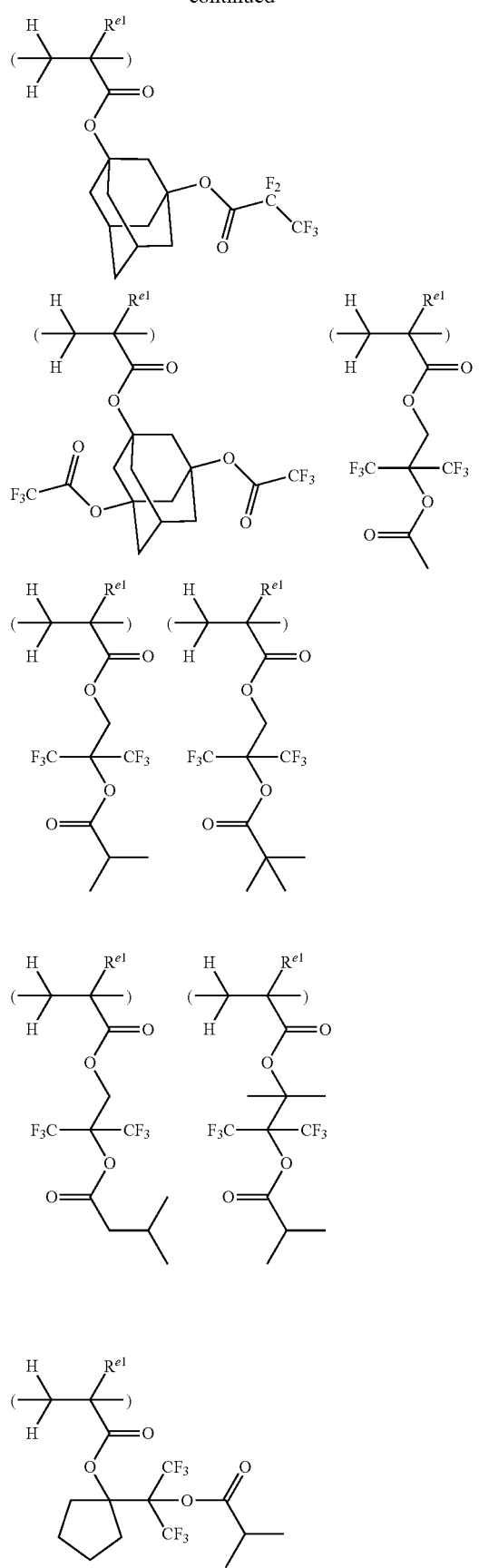
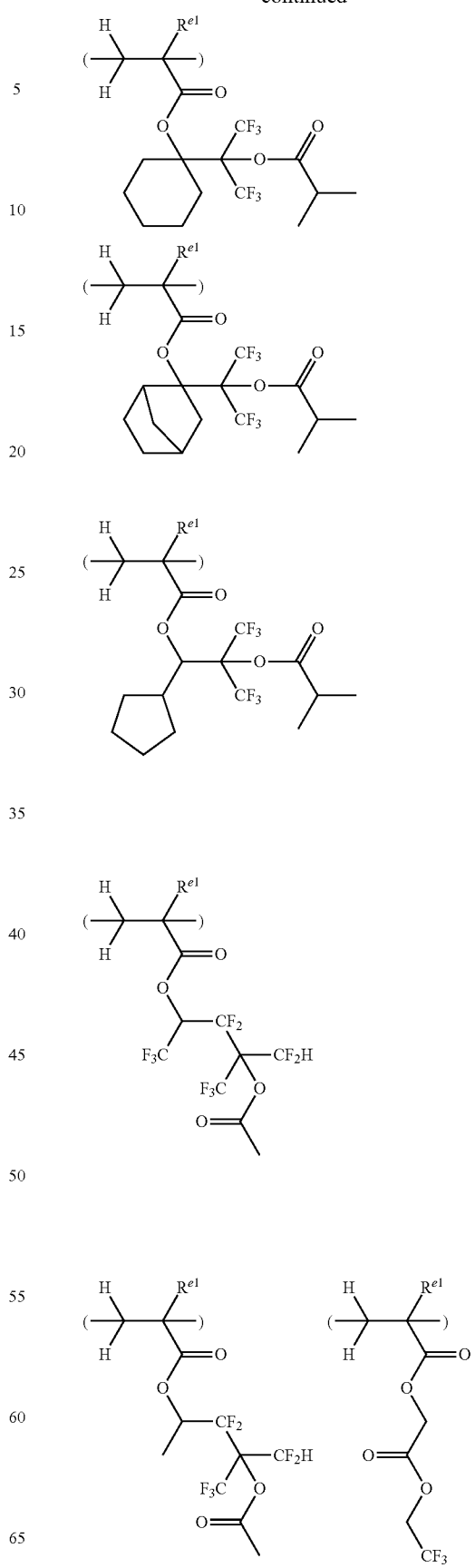

-continued
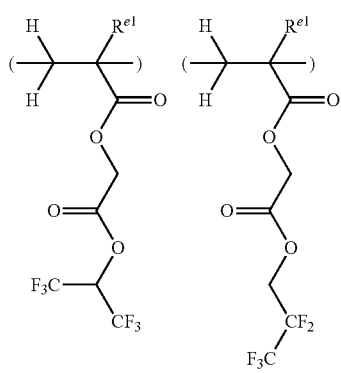
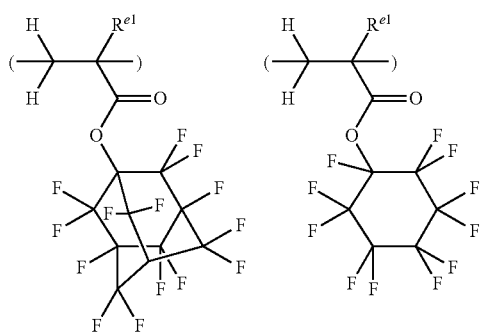
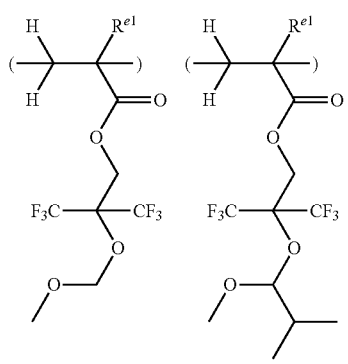
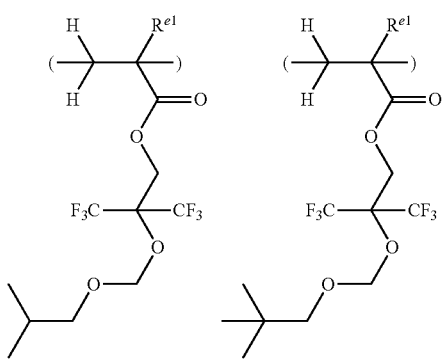
-continued
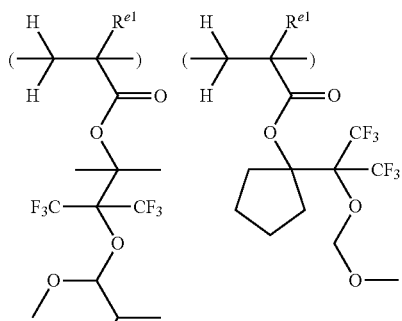
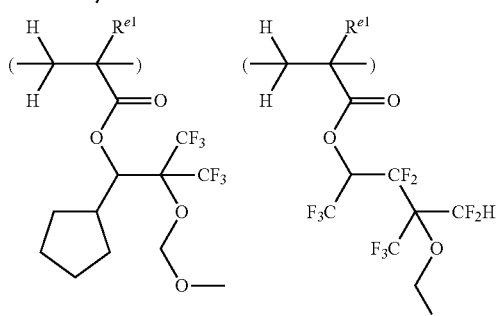
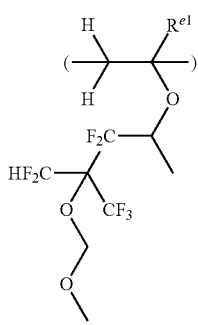
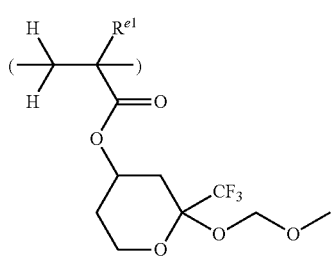
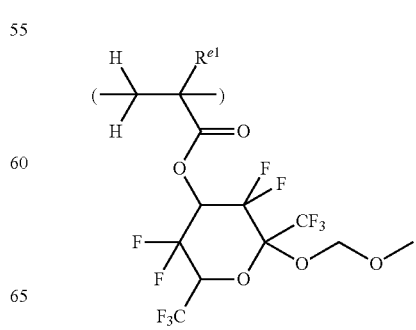

93
-continued
94
-continued
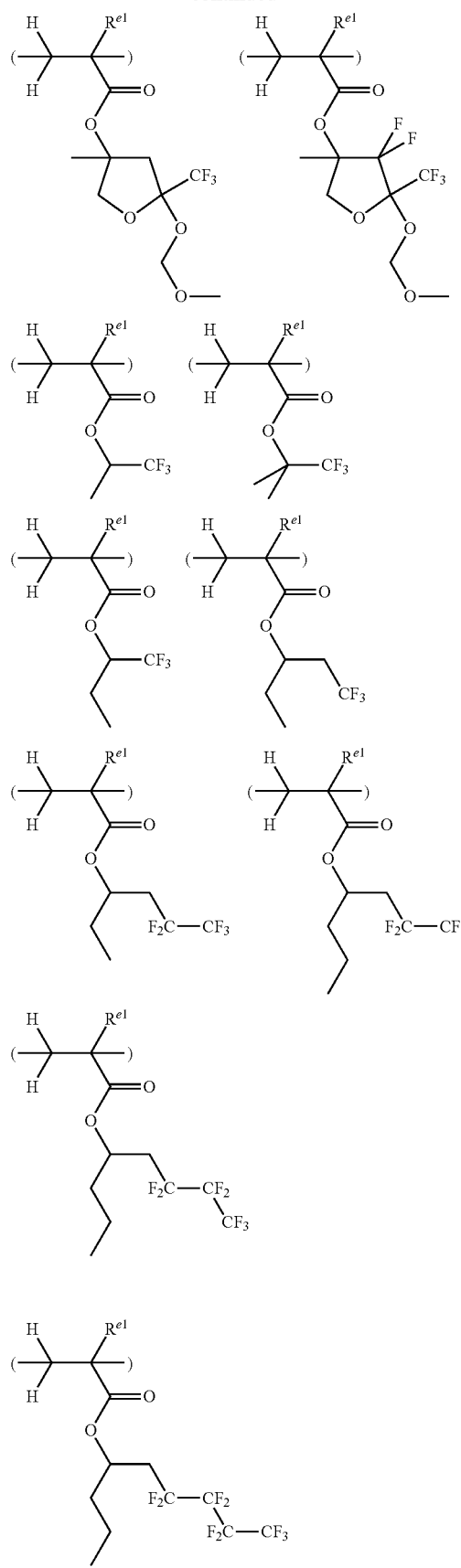
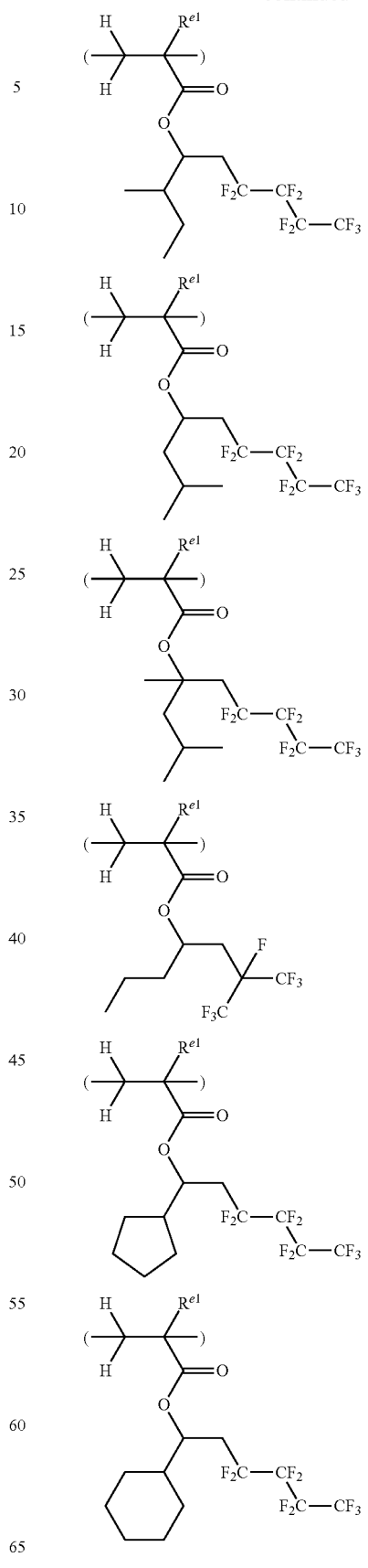

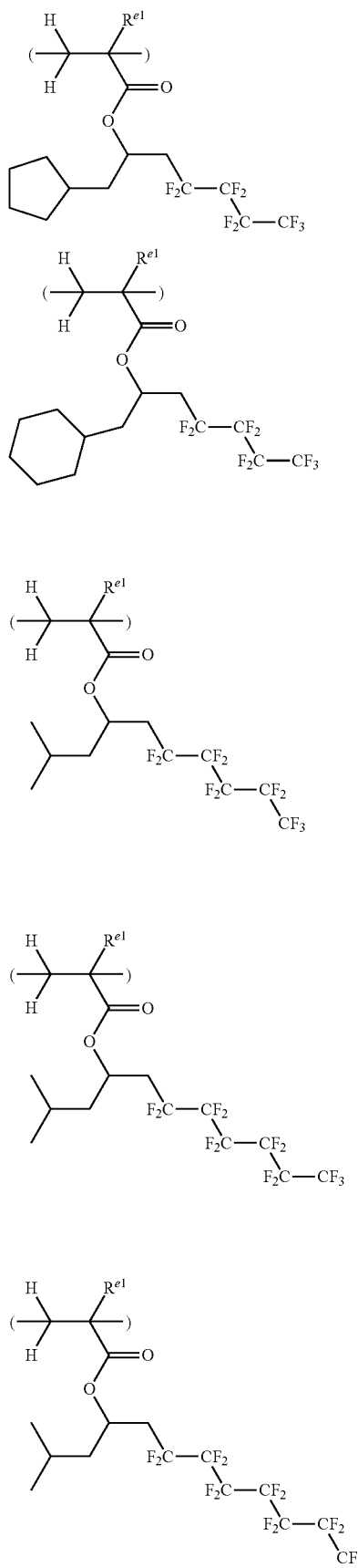
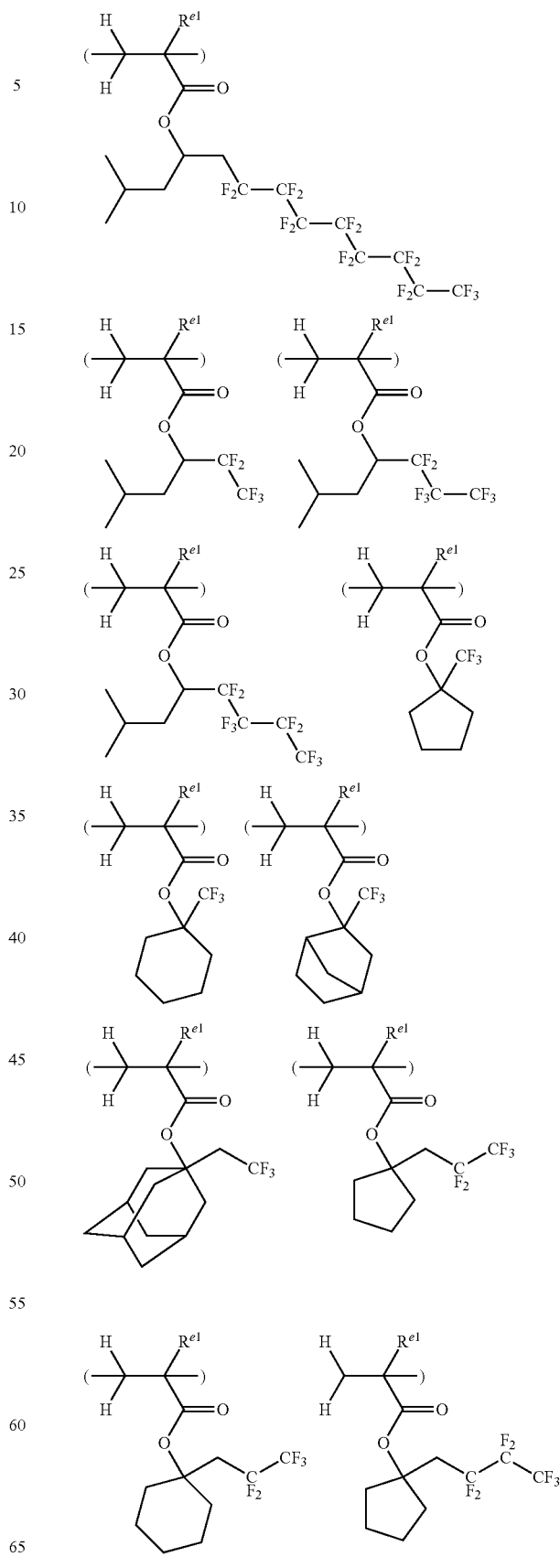

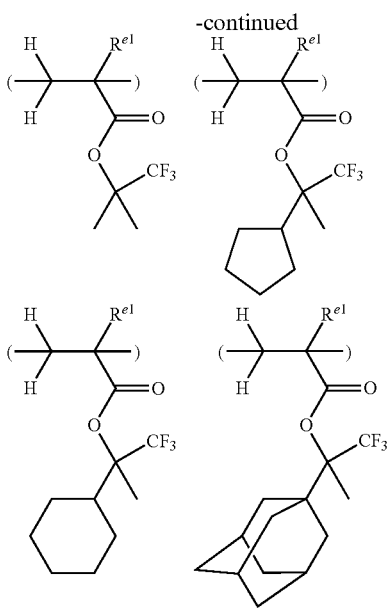

The hydrophibic fluoro-resin is described in detail in JP-A 2010-215608. Reference is also made to JP-A 2008-111103, 2008-122932, 2009-098638, 2009-191151, 2009-192784, 2009-276363, 2010-107695, 2010-134012, 2010-250105, and 2011-042789.

The hydrophibic fluoro-resin (E) should preferably have a Mw of 1,000 to 50,000, more preferably 2,000 to 20,000. This Mw range ensures that a resin exerts a satisfactory surface-modifying effect and causes no development defects.

An appropriate amount of the hydrophibic fluoro-resin (E) used is 0 to 20 parts, more preferably 0.001 to 20 parts, and even more preferably 0.01 to 10 parts by weight per 100 parts by weight of the base resin (B). When added in the range, the resin is fully dissolved in the developer, leaving no or few development defects.

Component F

The resist composition may further comprise (F) a compound having the following formula (6a), (6b) or (6c).

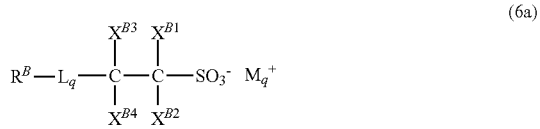

(6a)

(6b)

(6c)

Herein $M_q^+$ is a sulfonium cation of the formula (4a), iodonium cation of the formula (4b), or ammonium cation. $R^B$ is a straight, branched or cyclic $C_1$-$C_{40}$ monovalent hydrocarbon group which may contain a heteroatom. Suitable monovalent hydrocarbon groups are as exemplified above for $R^{B0}$. $X^{B1}$, $X^{B2}$, $X^{B3}$ and $X^{B4}$ are each independently hydrogen or a straight, branched or cyclic $C_1$-$C_{40}$ monovalent hydrocarbon group which may contain a heteroatom. Suitable monovalent hydrocarbon groups are as exemplified above for $R^{B8}$. For a carbon count of 1, trifluoromethyl is excluded. Lq is a single bond or linking group. Suitable linking groups include an ether bond, ester bond, sulfonic acid ester bond, carbonate bond and amide bond. Ar is an optionally substituted aromatic ring.

Examples of the compounds having formulae (6a), (6b) and (6c) include alkane sulfonic acid onium salts as described in JP-A 2003-005376, aromatic sulfonic acid onium salts as described in JP-A 2004-302081 and JP-A 2007-057709, and carboxylic acid onium salts as described in JP-A 2002-122994 and JP-A 2013-037092. They may be used in combination as the quencher.

The anion in formula (6a), (6b) or (6c) is a conjugated base of weak acid. As used herein, the "weak acid" refers to an acid strength insufficient to deprotect the acid labile group on the acid labile group-containing units incorporated in the base resin. In this sense, the onium salt having formula (6a), (6b) or (6c) functions as a quencher when used in combination with an onium salt type PAG having as the counter anion a conjugated base of strong acid such as an α-fluorinated sulfonic acid.

Specifically, in a system using a mixture of an onium salt capable of generating a strong acid such as an α-fluorinated sulfonic acid and an onium salt capable of generating a weak acid such as non-fluorinated sulfonic acid or carboxylic acid, if the strong acid generated by the PAG upon exposure to high-energy radiation collides with the unreacted onium salt having an weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If a PAG capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

An appropriate amount of component (F) used is 0 to 40 parts, more preferably 0.1 to 40 parts, and even more preferably 0.1 to 20 parts by weight per 100 parts by weight of the base resin (B).

Component G

The resist composition may further comprise (G) a nonionic nitrogen-containing compound. Suitable nitrogen-containing compounds include primary, secondary and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives. The nonionic nitrogen-containing compounds which can be used herein are described in JP-A 2008-111103, paragraphs [0146] to [0164] (U.S. Pat. No. 7,537,880).

The nitrogen-containing compounds may be used alone or in admixture of two or more. The nitrogen-containing compound (G) is preferably used in an amount of 0 to 12 parts, more preferably 0.001 to 12 parts, even more preferably 0.01 to 8 parts by weight per 100 parts by weight of the base resin (B).

Also, a sulfonium salt of sulfonic acid having a nitrogen-containing substituent may be used as the acid diffusion controlling agent. This compound is a so-called photo-degradable base which functions as quencher in the unexposed region, but loses quencher ability through neutralization with the acid generated by itself, in the exposed region. The use of photo-degradable base is effective for enhancing the contrast between exposed and unexposed regions. With respect to the photo-degradable base, reference may be made to JP-A 2009-109595 and JP-A 2012-046501, for example.

Component H

The resist composition may further comprise (H) a surfactant. Suitable surfactants are described in JP-A 2011-016746. Inter alia, those surfactants which are insoluble or substantially insoluble in water and alkaline developer are preferred.

While many examples of the surfactant which is insoluble or substantially insoluble in water and alkaline developer are described in JP-A 2011-016746, preferred examples are FC-4430, Surflon S-381, Surfynol E1004, KH-20 and KH-30, which may be used alone or in admixture. Partially fluorinated oxetane ring-opened polymers having the structural formula (surf-1) are also useful.

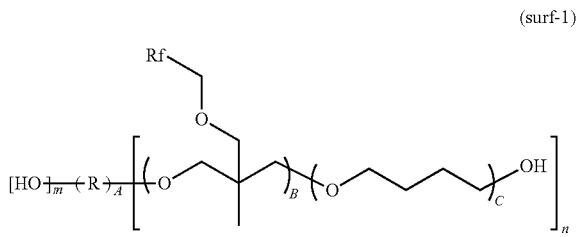

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

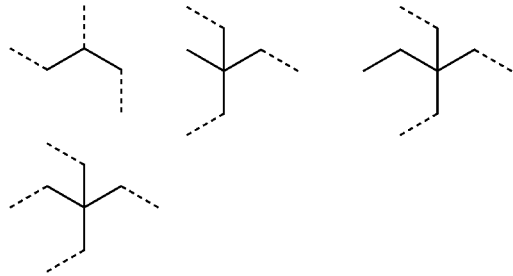

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either blockwise or randomly. For the preparation of surfactants in the form of partially fluorinated oxetane ring-opened polymers, reference should be made to U.S. Pat. No. 5,650,483, for example.

Other Components

In the resist composition, other components may be added, for example, an acid amplifier compound, organic acid derivative, fluorinated alcohol, and a compound with a Mw of up to 3,000 adapted to change its solubility in developer under the action of acid, also referred to as dissolution inhibitor. With respect to the acid amplifier compound, reference should be made to JP-A 2009-269953 and JP-A 2010-215608. The acid amplifier compound is preferably added in an amount of 0 to 2 parts, more preferably 0 to 1 part by weight per 100 parts by weight of the base resin (B). Excessive amounts of the acid amplifier compound make diffusion control difficult, leading to degradation of resolution and pattern profile. With respect to the organic acid derivative, fluorinated alcohol and dissolution inhibitor, reference should be made to JP-A 2009-269953 and JP-A 2010-215608.

Process

Another embodiment of the invention is a pattern forming process using the resist composition defined above. A pattern may be formed from the resist composition using any well-known lithography process. The preferred pattern forming process comprises the steps of coating a resist composition onto a substrate, prebaking the resist composition to form a resist film, exposing a selected region of the resist film to high-energy radiation, PEB, and developing the exposed resist film in an organic solvent base developer so that the unexposed region of resist film is dissolved and the exposed region of resist film is left, thereby forming a negative tone resist pattern such as a hole or trench pattern.

FIG. 1 illustrates the pattern forming process of the invention. First, the resist composition is coated on a substrate to form a resist film thereon. Specifically, a resist film 40 of a resist composition is formed on a processable layer 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C. especially 70 to 150° C. for a time as of 10 to 300 seconds, especially 15 to 200 seconds.

The substrate 10 used herein is generally a silicon substrate. The processable layer (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. In the exposure step, a photomask may be used if necessary. For the exposure, preference is given to high-energy radiation having a wavelength of 140 to 250 nm, EUV having a wavelength of 13.5 nm, and EB, and especially ArF excimer laser radiation of 193 nm. The exposure may be done either in a dry atmosphere such as air or nitrogen stream or by immersion lithography.

The immersion lithography uses deionized water or liquids having a refractive index of at least 1 and highly transparent to the exposure wavelength such as alkanes as the immersion solvent. In the immersion lithography, the resist film as prebaked is exposed to light through a projection lens while the liquid, typically water is introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer which is soluble in the developer, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue, for example. While the protective film must dissolve in the organic solvent developer, the polymer comprising recurring units having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2007-025634 and JP-A 2008-003569 readily dissolve in organic solvent developers.

In the protective film-forming composition, an amine compound or a polymer comprising recurring units containing an amino group or ammonium salt may be used. This component is effective for controlling diffusion of the acid generated in the exposed region of the photoresist film to the unexposed region for thereby preventing any hole opening failure. Useful protective film materials having an amine compound added thereto are described in JP-A 2008-003569, and useful polymers comprising recurring units having an amino group are described in JP-A 2007-316448. The amine compound may be selected from the compounds enumerated above as component (G). An appropriate amount of the amine compound or ammonium salt added is 0 to 10 parts, preferably 0.01 to 10 parts, more preferably 0.02 to 8 parts by weight per 100 parts by weight of the base resin.

The solvent in the protective film-forming composition is preferably selected from alcohols of at least 4 carbon atoms, ethers of 8 to 12 carbon atoms, and mixtures thereof. Suitable alcohols of at least 4 carbon atoms include 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether.

After formation of the resist film, rinsing or post-soaking) may be carried out for extracting the acid generator and the like from the film surface or washing away particles, or after exposure, rinsing for post-soaking) may be carried out for removing water droplets left on the resist film.

Exposure is preferably performed in an exposure dose of about 1 to 200 mJ/cm$^3$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Thereafter the exposed resist film is developed in an organic solvent base developer for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1C.

The developer used herein is based on an organic solvent which is preferably selected from among ketones such as 2-octanone, 3-octanone, 4-octanone, 2-nonanone, 3-nonanone, 4-nonanone, 5-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, 2-ethylcyclohexanone, 3-ethylcyclohexanone, 4-ethylcyclohexanone, acetophenone, 2'-methylacetophenone, 4'-methylacetophenone, 2'-ethylacetophenone, 4'-ethylacetophenone, ethyl n-butyl ketone, di-n-butyl ketone; esters such as propyl acetate, butyl acetate, isobutyl acetate, pentyl acetate, isopentyl acetate, butenyl acetate, phenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, 2-phenylethyl acetate, 2-methylbutyl acetate, hexyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, t-butyl valerate, pentyl valerate, isopentyl valerate, ethyl isovalerate, propyl isovalerate, isopropyl isovalerate, butyl isovalerate, isobutyl isovalerate, t-butyl isovalerate, isopentyl isovalerate, ethyl 2-methylvalerate, butyl 2-methylvalerate, ethyl pivalate, propyl pivalate, isopropyl pivalate, butyl pivalate, t-butyl pivalate, ethyl pentenoate, propyl pentenoate, isopropyl pentenoate, butyl pentenoate, t-butyl pentenoate, propyl crotonate, isopropyl crotonate, butyl crotonate, t-butyl crotonate, butyl propionate, isobutyl propionate, t-butyl propionate, ethyl hexanoate, allyl hexanoate, propyl butyrate, butyl butyrate, isobutyl butyrate, 3-methylbutyl butyrate, t-butyl butyrate, ethyl 2-methylbutyrate, isopropyl 2-methylbutyrate, propyl benzoate, butyl benzoate; alcohols such as 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 4-methyl-1-pentanol, 4-methyl-2-pentanol, 4-methyl-3-pentanol, cyclohexanol, and 1-octanol.

Of these, preferred are ketones such as 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone and 4'-methylacetophenone, and esters such as propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

These solvents may be used alone or in admixture of two or more. The organic solvent or solvents are preferably present in a total amount of at least 60% by weight of the developer. More preferably the organic solvent(s) accounts for 80 to 100% by weight of the developer. A surfactant may be added to the developer while it may be selected from the same list of compounds as exemplified for the surfactant to be added to the resist composition. The surfactant is preferably added in an amount of 0 to 10%, more preferably 0.01 to 5% by weight of the developer.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. The solvents may be used alone or in admixture. Besides the foregoing solvents, aromatic solvents may be used, for example, toluene, xylene, ethylbenzene, isopropylbenzene, t-butylbenzene and mesitylene.

EXAMPLE

Synthesis Examples, Examples and Comparative Examples are given below by way of illustration and not by way of limitation. The abbreviation "pbw" is parts by weight. For all polymers, Mw and Mn are determined by GPC versus polystyrene standards using tetrahydrofuran solvent.

1) Synthesis of Base Resin

Synthesis Example 1

Synthesis of Polymer P-1

In a flask under nitrogen atmosphere, 22 g of 1-t-butyl-cyclopentyl methacrylate, 17 g of 2-oxotetrahydrofuran-3-yl methacrylate, 0.48 g of dimethyl 2,2'-azobis(2-methylpropionate) (V-601 by Wako Pure Chemical Industries, Ltd.), 0.41 g of 2-mercaptoethanol, and 50 g of methyl ethyl ketone were combined to form a monomer/initiator solution. Another flask in nitrogen atmosphere was charged with 23 g of methyl ethyl ketone, which was heated at 80° C. with stirring. With stirring, the monomer/initiator solution was added dropwise to the flask over 4 hours. After the completion of dropwise addition, the polymerization solution was continuously stirred for 2 hours while maintaining the temperature of 80° C. The polymerization solution was cooled to room temperature, whereupon it was added dropwise to 640 g of methanol with vigorous stirring. The precipitate was collected by filtration, washed twice with 240 g of methanol, and vacuum dried at 50° C. for 20 hours, obtaining 36 g of a copolymer in white powder form (yield 90%). On GPC analysis, the copolymer had a Mw of 8,755 and a dispersity Mw/Mn of 1.94.

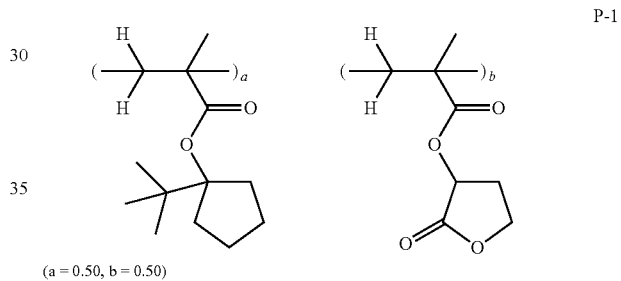

(a = 0.50, b = 0.50)

Synthesis Examples 2 to 24

Synthesis of Polymers P-2 to P-24

Polymers were synthesized by the same procedure as in Synthesis Example 1 aside from changing the type and amount of monomers. Table 1 shows the proportion (in molar ratio) of units incorporated in these polymers.

TABLE 1

| Resin | Unit 1 (molar ratio) | Unit 2 (molar ratio) | Unit 3 (molar ratio) | Unit 4 (molar ratio) | Unit 5 (molar ratio) |
|---|---|---|---|---|---|
| P-1 | A-8 (0.50) | B-1 (0.50) | — | — | — |
| P-2 | A-3 (0.50) | B-4 (0.50) | — | — | — |
| P-3 | A-2 (0.20) | A-1 (0.20) | B-1 (0.50) | B-5 (0.10) | — |
| P-4 | A-2 (0.20) | A-1 (0.20) | B-2 (0.50) | B-5 (0.10) | — |
| P-5 | A-4 (0.20) | A-1 (0.20) | B-2 (0.50) | B-5 (0.10) | — |
| P-6 | A-5 (0.20) | A-1 (0.20) | B-2 (0.50) | B-5 (0.10) | — |
| P-7 | A-2 (0.25) | A-6 (0.25) | B-1 (0.20) | B-3 (0.20) | B-5 (0.10) |
| P-8 | A-3 (0.25) | A-6 (0.25) | B-1 (0.20) | B-3 (0.20) | B-5 (0.10) |
| P-9 | A-2 (0.25) | A-8 (0.25) | B-1 (0.20) | B-3 (0.20) | B-5 (0.10) |
| P-10 | A-3 (0.25) | A-8 (0.25) | B-1 (0.20) | B-3 (0.20) | B-5 (0.10) |
| P-11 | A-2 (0.25) | A-7 (0.25) | B-1 (0.20) | B-3 (0.20) | B-5 (0.10) |
| P-12 | A-3 (0.25) | A-7 (0.25) | B-1 (0.20) | B-3 (0.20) | B-5 (0.10) |
| P-13 | A-4 (0.25) | A-6 (0.25) | B-1 (0.35) | B-5 (0.15) | — |
| P-14 | A-4 (0.25) | A-7 (0.25) | B-1 (0.35) | B-5 (0.15) | — |
| P-15 | A-4 (0.25) | A-8 (0.25) | B-1 (0.35) | B-5 (0.15) | — |

TABLE 1-continued
| Resin | Unit 1 (molar ratio) | Unit 2 (molar ratio) | Unit 3 (molar ratio) | Unit 4 (molar ratio) | Unit 5 (molar ratio) |
|---|---|---|---|---|---|
| P-16 | A-1 (0.35) | B-2 (0.55) | B-5 (0.10) | — | — |
| P-17 | A-1 (0.05) | A-6 (0.45) | B-1 (0.30) | B-3 (0.20) | — |
| P-18 | A-1 (0.10) | A-6 (0.40) | B-1 (0.20) | B-3 (0.20) | B-5 (0.10) |
| P-19 | A-1 (0.05) | A-7 (0.45) | B-1 (0.30) | B-3 (0.20) | — |
| P-20 | A-1 (0.10) | A-7 (0.40) | B-1 (0.20) | B-3 (0.20) | B-5 (0.10) |
| P-21 | A-7 (0.50) | B-1 (0.30) | B-3 (0.20) | — | — |
| P-22 | A-7 (0.50) | B-1 (0.20) | B-3 (0.20) | B-5 (0.10) | — |
| P-23 | A-1 (0.20) | A-8 (0.20) | B-2 (0.55) | C-1 (0.05) | — |
| P-24 | A-1 (0.20) | A-8 (0.20) | B-1 (0.30) | B-3 (0.25) | C-1 (0.05) |
The structure of recurring unit C-1 is shown below while the structure of other recurring units is shown in Tables 2 and 3.
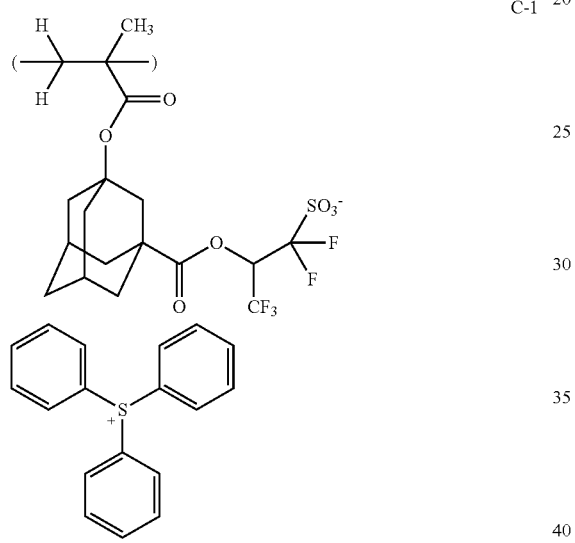
C-1
TABLE 2
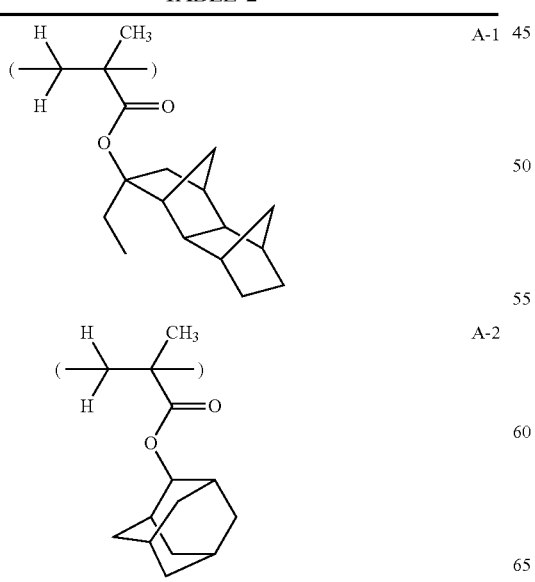
A-3
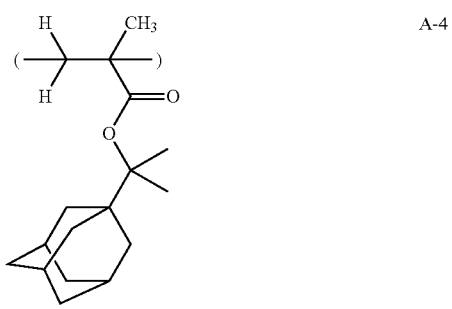
A-4
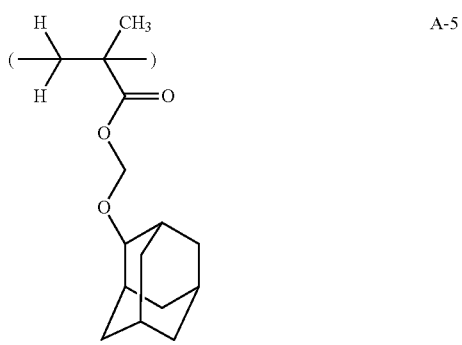
A-5
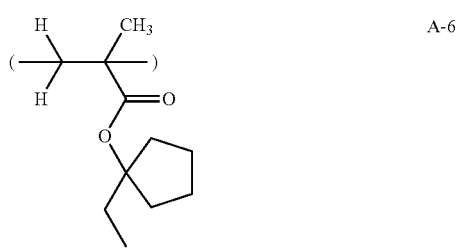
A-6
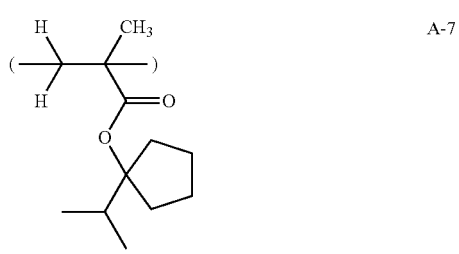
A-7

TABLE 2-continued

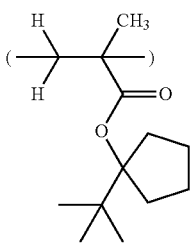 [SMILES: CCC(C)(C)C(=O)OC1(C(C)(C)C)CCCC1]
A-8

TABLE 3

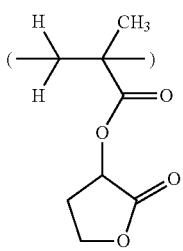
B-1

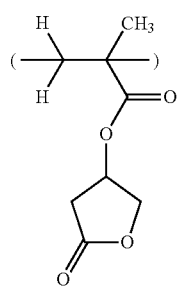
B-2

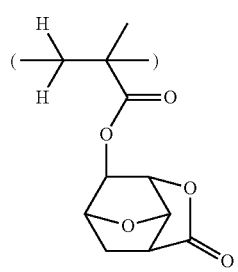 [SMILES: CCC(C)(C)C(=O)OC1C2CC3C(=O)OC1C3O2]
B-3

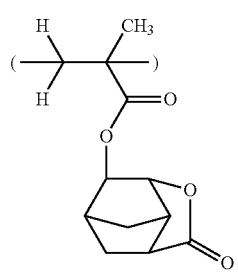 [SMILES: CCC(C)(C)C(=O)OC1C2CC3C(=O)OC1C3C2]
B-4

TABLE 3-continued

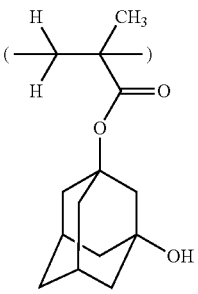 [SMILES: CCC(C)(C)C(=O)OC12CC3CC(CC(O)(C3)C1)C2]
B-5

2) Preparation of Resist Composition

Examples 1-1 to 1-36 & Comparative Examples 1-1 to 1-24

Resist compositions (R-1 to R-56) in solution form were prepared by dissolving a PPD inhibitor (AA-1 to AA-3), acid diffusion regulator (Q-1), base resin (Polymers P-1 to P-24), photoacid generator (PAG-X to PAG-Z), and alkali-soluble surfactant (SF-1) in an organic solvent containing 0.01 wt % of surfactant A, and filtering through a Teflon® filter with a pore size of 0.2 µm. Tables 4 to 6 show the formulation of the resulting resist compositions.

The solvent, PPD inhibitor (AA-1 to AA-3), photoacid generator (PAG-X to PAG-Z), acid diffusion regulator (Q-1), alkali-soluble surfactant (SF-1), and surfactant A used herein are identified below.

PGMEA: propylene glycol monomethyl ether acetate
GBL: γ-butyrolactone

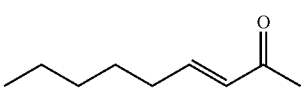
AA-1

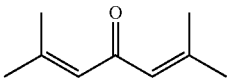
AA-2

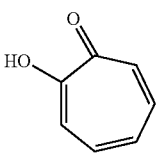
AA-3

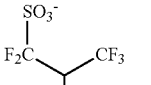
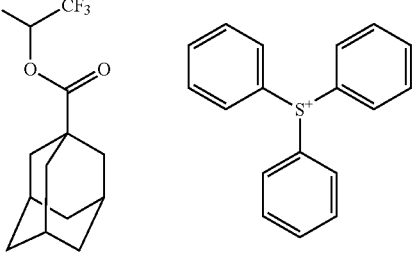
PAG-X

PAG-Y

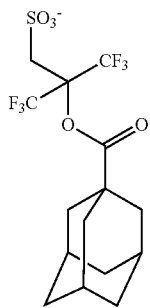
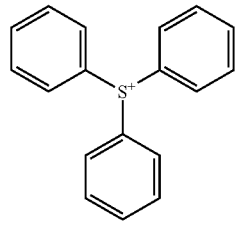
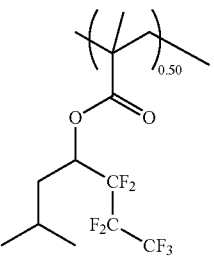
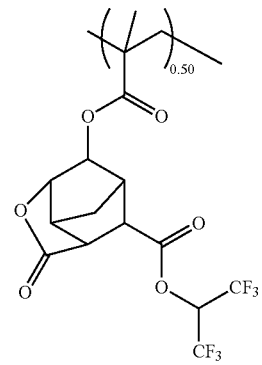

(SF-1)

PAG-Z

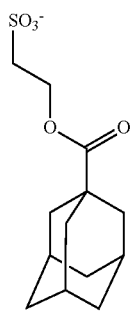
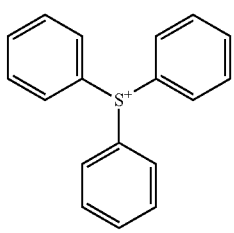

Surfactant A: 3-methyl-3-(2,2,2-trifluoroethoxymethyl)-oxetane/tetrahydrofuran/2,2-dimethyl-1,3-propanediol copolymer (Omnova Solutions, Inc.)

Q-1

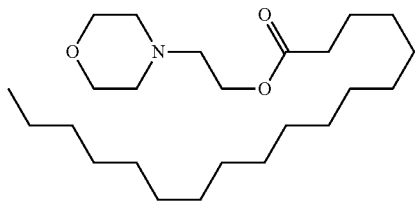

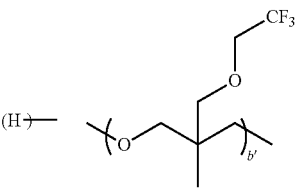
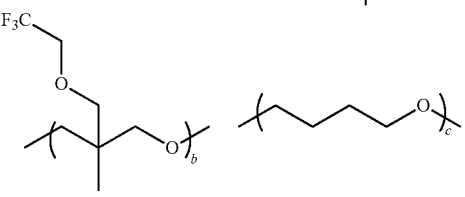
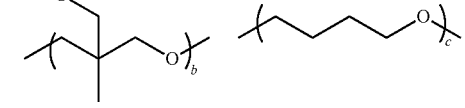

Hydrophobic fluoro-resin (SF-1): poly(2,2,3,3,4,4,4-heptafluoro-1-isobutyl-1-butyl methacrylate/9-(2,2,2-trifluoro-1-trifluoroethyloxycarbonyl)-4-oxatricyclo-[4.2.1.0$^{3,7}$]nonan-5-on-2-yl methacrylate)

Mw=7,700
Mw/Mn=1.82 a:(b+b'):(c+c')=1:4-7:0.01-1 (molar ratio)
Mw=1,500

TABLE 4

|  |  | Resist composition | Resin (pbw) | Acid generator 1 (pbw) | Acid generator 2 (pbw) | Diffusion regulator (pbw) | Surfactant (pbw) | Solvent 1 (pbw) | Solvent 2 (pbw) | PPD inhibitor (pbw) |
|---|---|---|---|---|---|---|---|---|---|---|
| Example | 1-1 | R-1 | P-1 (80) | PAG-X (8.0) | PAG-Z (3.0) | Q-1 (5.0) | SF-1 (3.0) | PGMEA (1,728) | GBL (192) | AA-1 (10.0) |
|  | 1-2 | R-2 | P-2 (80) | PAG-X (8.0) | PAG-Z (3.0) | Q-1 (5.0) | SF-1 (3.0) | PGMEA (1,728) | GBL (192) | AA-1 (10.0) |
|  | 1-3 | R-3 | P-3 (80) | PAG-X (8.0) | PAG-Z (3.0) | Q-1 (5.0) | SF-1 (3.0) | PGMEA (1,728) | GBL (192) | AA-1 (10.0) |
|  | 1-4 | R-4 | P-4 (80) | PAG-X (8.0) | PAG-Z (3.0) | Q-1 (5.0) | SF-1 (3.0) | PGMEA (1,728) | GBL (192) | AA-1 (10.0) |
|  | 1-5 | R-5 | P-5 (80) | PAG-X (8.0) | PAG-Z (3.0) | Q-1 (5.0) | SF-1 (3.0) | PGMEA (1,728) | GSL (192) | AA-1 (10.0) |
|  | 1-6 | R-6 | P-6 (80) | PAG-X (8.0) | PAG-Z (3.0) | Q-1 (5.0) | SF-1 (3.0) | PGMEA (1,728) | GSL (192) | AA-1 (10.0) |
|  | 1-7 | R-7 | P-7 (80) | PAG-X (8.0) | PAG-Z (3.0) | Q-1 (5.0) | SF-1 (3.0) | PGMEA (1,728) | GBL (192) | AA-1 (10.0) |
|  | 1-8 | R-8 | P-8 (80) | PAG-X (8.0) | PAG-Z (3.0) | Q-1 (5.0) | SF-1 (3.0) | PGMEA (1,728) | GBL (192) | AA-1 (10.0) |
|  | 1-9 | R-9 | P-9 (80) | PAG-X (8.0) | PAG-Z (3.0) | Q-1 (5.0) | SF-1 (3.0) | PGMEA (1,728) | GBL (192) | AA-1 (10.0) |

TABLE 4-continued

| | Resist composition | Resin (pbw) | Acid generator 1 (pbw) | Acid generator 2 (pbw) | Diffusion regulator (pbw) | Surfactant (pbw) | Solvent 1 (pbw) | Solvent 2 (pbw) | PPD inhibitor (pbw) |
|---|---|---|---|---|---|---|---|---|---|
| 1-10 | R-10 | P-10 (80) | PAG-X (8.0) | PAG-Z (3.0) | Q-1 (5.0) | SF-1 (3.0) | PGMEA (1,728) | GSL (192) | AA-1 (10.0) |
| 1-11 | R-11 | P-11 (80) | PAG-X (8.0) | PAG-Z (3.0) | Q-1 (5.0) | SF-1 (3.0) | PGMEA (1,728) | GSL (192) | AA-1 (10.0) |
| 1-12 | R-12 | P-12 (80) | PAG-X (8.0) | PAG-Z (3.0) | Q-1 (5.0) | SF-1 (3.0) | PGMEA (1,728) | GBL (192) | AA-1 (10.0) |
| 1-13 | R-13 | P-13 (80) | PAG-X (8.0) | PAG-Z (3.0) | Q-1 (5.0) | SF-1 (3.0) | PGMEA (1,728) | GBL (192) | AA-1 (10.0) |
| 1-14 | R-14 | P-14 (80) | PAG-X (8.0) | PAG-Z (3.0) | Q-1 (5.0) | SF-1 (3.0) | PGMEA (1,728) | GBL (192) | AA-1 (10.0) |
| 1-15 | R-15 | P-15 (80) | PAG-X (8.0) | PAG-Z (3.0) | Q-1 (5.0) | SF-1 (3.0) | PGMEA (1,728) | GEL (192) | AA-1 (10.0) |
| 1-16 | R-16 | P-16 (30) | PAG-X (8.0) | PAG-Z (3.0) | Q-1 (5.0) | SF-1 (3.0) | PGMEA (1,728) | GBL (192) | AA-1 (10.0) |
| 1-17 | R-17 | P-17 (80) | PAG-X (8.0) | PAG-Z (3.0) | Q-1 (5.0) | SF-1 (3.0) | PGMEA (1,728) | GBL (192) | AA-1 (10.0) |
| 1-18 | R-18 | P-18 (80) | PAG-X (8.0) | PAG-Z (3.0) | Q-1 (5.0) | SF-1 (3.0) | PGMEA (1,728) | GBL (192) | AA-1 (10.0) |
| 1-19 | R-19 | P-19 (80) | PAG-X (8.0) | PAG-Z (3.0) | Q-1 (5.0) | SF-1 (3.0) | PGMEA (1,728) | GBL (192) | AA-1 (10.0) |
| 1-20 | R-20 | P-20 (80) | PAG-X (8.0) | PAG-Z (3.0) | Q-1 (5.0) | SF-1 (3.0) | PGMEA (1,728) | GBL (192) | AA-1 (10.0) |

TABLE 5

| | | Resist composition | Resin (pbw) | Acid generator 1 (pbw) | Acid generator 2 (pbw) | Diffusion regulator (pbw) | Surfactant (pbw) | Solvent 1 (pbw) | Solvent 2 (pbw) | PPD inhibitor (pbw) |
|---|---|---|---|---|---|---|---|---|---|---|
| Example | 1-21 | R-21 | P-21 (80) | PAG-X (8.0) | PAG-Z (3.0) | Q-1 (5.0) | SF-1 (3.0) | PGMEA (1,728) | GBL (192) | AA-1 (10.0) |
| | 1-22 | R-22 | P-22 (80) | PAG-X (8.0) | PAG-Z (3.0) | Q-1 (5.0) | SF-1 (3.0) | PGMEA (1,728) | GBL (192) | AA-1 (10.0) |
| | 1-23 | R-23 | P-23 (80) | PAG-Z (3.0) | — | Q-1 (5.0) | SF-1 (3.0) | PGMEA (1,728) | GBL (192) | AA-1 (10.0) |
| | 1-24 | R-24 | P-24 (80) | PAG-Z (3.0) | — | Q-1 (5.0) | SF-1 (3.0) | PGMEA (1,728) | GBL (192) | AA-1 (10.0) |
| | 1-25 | R-25 | P-1 (80) | PAG-X (8.0) | PAG-Z (3.0) | Q-I (5.0) | SF-1 (3.0) | PGMEA (1,728) | GBL (192) | AA-2 (10.0) |
| | 1-26 | R-26 | P-2 (80) | PAG-X (8.0) | PAG-Z (3.0) | Q-1 (5.0) | SF-1 (3.0) | PGMEA (1,728) | GBL (192) | AA-2 (10.0) |
| | 1-27 | R-27 | P-9 (80) | PAG-X (8.0) | PAG-Z (3.0) | Q-1 (5.0) | SF-1 (3.0) | PGMEA (1,728) | GBL (192) | AA-2 (10.0) |
| | 1-28 | R-28 | P-16 (80) | PAG-X (8.0) | PAG-Z (3.0) | Q-1 (5.0) | SF-1 (3.0) | PGMEA (1,728) | GBL (192) | AA-2 (10.0) |
| | 1-29 | R-29 | P-21 (80) | PAG-X (8.0) | PAG-Z (3.0) | Q-1 (5.0) | SF-1 (3.0) | PGMEA (1,728) | GBL (192) | AA-2 (10.0) |
| | 1-30 | R-30 | P-23 (80) | PAG-X (8.0) | — | Q-1 (5.0) | SF-1 (3.0) | PGMEA 1,728) | GBL (192) | AA-2 (10.0) |
| | 1-31 | R-31 | P-1 (80) | PAG-X (8.0) | PAG-Z (3.0) | Q-1 (5.0) | SF-1 (3.0) | PGMEA (1,728) | GBL (192) | AA-3 (10.0) |
| | 1-32 | 3. 32 | P-2 (80) | PAG-X (8.0) | PAG-Z (3.0) | Q-1 (5.0) | SF-1 (3.0) | PGMEA (1,728) | GBL (192) | AA-3 (10.0) |
| | 1-33 | R-33 | P-9 (80) | PAG-X (8.0) | PAG-Z (3.0) | Q-1 (5.0) | SF-1 (3.0) | PGMEA (1,728) | GBL (192) | AA-3 (10.0) |
| | 1-34 | R-34 | P-16 (80) | PAG-X (8.0) | PAG-Z (3.0) | Q-1 (5.0) | SF-1 (3.0) | PGMEA (1,728) | GBL (192) | AA-3 (10.0) |
| | 1-35 | R-35 | P-21 (80) | PAG-X (8.0) | PAG-Z (3.0) | Q-1 (5.0) | SF-1 (3.0) | PGMEA (1,728) | GBL (192) | AA-3 (10.0) |
| | 1-36 | R-36 | P-23 (80) | PAG-X (8.0) | — | Q-1 (5.0) | SF-1 (3.0) | PGMEA (1,728) | GBL (192) | AA-3 (10.0) |

TABLE 6

| | | Resist composition | Resin (pbw) | Acid generator 1 Acid | Acid generator 2 (pbw) | Diffusion regulator (pbw) | Surfactant (pbw) | Solvent 1 (pbw) | Solvent 2 (pbw) | PPD inhibitor (pbw) |
|---|---|---|---|---|---|---|---|---|---|---|
| Comparative Example | 1-1 | R-33 | P-1 (80) | PAG-X (8.0) | PAG-Z (3.0) | Q-1 (5.0) | SF-1 (3.0) | PGMEA (1,728) | GBL (192) | — |

TABLE 6-continued

| Resist composition | Resin (pbw) | Acid generator 1 Acid (pbw) | Acid generator 2 (pbw) | Diffusion regulator (pbw) | Surfactant (pbw) | Solvent 1 (pbw) | Solvent 2 (pbw) | PPD inhibitor (pbw) |
|---|---|---|---|---|---|---|---|---|
| 1-2 R-34 | P-2 (80) | PAG-X (8.0) | PAG-Z (3.0) | Q-1 (5.0) | SF-1 (3.0) | PGMEA (1,728) | GBL (192) | — |
| 1-3 R-35 | P-3 (80) | PAG-X (8.0) | PAG-Z (3.0) | Q-1 (5.0) | SF-1 (3.0) | PGMEA (1,728) | GBL (192) | — |
| 1-4 R-36 | P-4 (80) | PAG-X (8.0) | PAG-Z (3.0) | Q-1 (5.0) | SF-1 (3.0) | PGMEA (1,728) | GBL (192) | — |
| 1-5 R-37 | P-5 (80) | PAG-X (8.0) | PAG-Z (3.0) | Q-1 (5.0) | SF-1 (3.0) | PGMEA (1,728) | GBL (192) | — |
| 1-6 R-38 | P-6 (80) | PAG-X (8.0) | PAG-Z (3.0) | Q-1 (5.0) | SF-1 (3.0) | PGMEA (1,728) | GBL (192) | — |
| 1-7 R-39 | P-7 (80) | PAG-X (8.0) | PAG-Z (3.0) | Q-1 (5.0) | SF-2 (3.0) | PGMEA (1,728) | GBL (192) | — |
| 1-8 R-40 | P-8 (80) | PAG-X (8.0) | PAG-Z (3.0) | Q-1 (5.0) | SF-1 (3.0) | PGMEA (1,728) | GBL (192) | — |
| 1-9 R-41 | P-9 (80) | PAG-X (8.0) | PAG-Z (3.0) | Q-1 (5.0) | SF-1 (3.0) | PGMEA (1,728) | GBL (192) | — |
| 1-10 R-42 | P-10 (80) | PAG-X (8.0) | PAG-Z (3.0) | Q-1 (5.0) | SF-1 (3.0) | PGMEA (1,728) | GBL (192) | — |
| 1-11 R-43 | P-11 (80) | PAG-X (8.0) | PAG-Z (3.0) | Q-1 (5.0) | SF-1 (3.0) | PGMEA (1,728) | GBL (192) | — |
| 1-12 R-44 | P-12 (80) | PAG-X (8.0) | PAG-Z (3.0) | Q-1 (5.0) | SF-1 (3.0) | PGMEA (1,728) | GBL (192) | — |
| 1-13 R-45 | P-13 (80) | PAG-X (8.0) | PAG-Z (3.0) | Q-1 (5.0) | SF-1 (3.0) | PGMEA (1,728) | GBL (192) | — |
| 1-14 R-46 | P-14 (80) | PAG-X (8.0) | PAG-Z (3.0) | Q-1 (5.0) | SF-1 (3.0) | PGMEA (1,728) | GBL (192) | — |
| 1-15 R-47 | P-15 (80) | PAG-X (8.0) | PAG-Z (3.0) | Q-1 (5.0) | SF-1 (3.0) | PGMEA (1,728) | GBL (192) | — |
| 1-16 R-48 | P-16 (80) | PAG-X (8.0) | PAG-Z (3.0) | Q-1 (5.0) | SF-1 (3.0) | PGMEA (1,728) | GBL (192) | — |
| 1-17 R-49 | P-17 (80) | PAG-X (8.0) | PAG-Z (3.0) | Q-1 (5.0) | SF-1 (3.0) | PGMEA (1,728) | GBL (192) | — |
| 1-18 R-50 | P-18 (80) | PAG-X (8.0) | PAG-Z (3.0) | Q-1 (5.0) | SF-1 (3.0) | PGMEA (1,728) | GBL (192) | — |
| 1-19 R-51 | P-19 (80) | PAG-X (8.0) | PAG-Z (3.0) | Q-1 (5.0) | SF-1 (3.0) | PGMEA (1,728) | GBL (192) | — |
| 1-20 R-52 | P-20 (80) | PAG-X (8.0) | PAG-Z (3.0) | Q-1 (5.0) | SF-1 (3.0) | PGMEA (1,728) | GBL (192) | — |
| 1-21 R-53 | P-21 (80) | PAG-X (8.0) | PAG-Z (3.0) | Q-1 (5.0) | SF-1 (3.0) | PGMEA (1,728) | GBL (192) | — |
| 1-22 R-54 | P-22 (80) | PAG-X (8.0) | PAG-Z (3.0) | Q-1 (5.0) | SF-1 (3.0) | PGMEA 1,728 | GBL (192) | — |
| 1-23 R-55 | P-23 (80) | PAG-Z (3.0) | — | Q-1 (5.0) | SF-1 (3.0) | PGMEA (1,728) | GBL (192) | — |
| 1-24 R-56 | P-24 (80) | PAG-Z (3.0) | — | Q-1 (5.0) | SF-1 (3.0) | PGMEA (1,728) | GBL (192) | — |

3) ArF Lithography Patterning Test

Examples 2-1 to 2-36 and Comparative Examples 2-1 to 2-24

On a silicon wafer, a spin-on carbon film ODL-101 (Shin-Etsu Chemical Co., Ltd.) was deposited to a thickness of 180 nm, and a silicon-containing spin-on hard mask SHB-A940 (Shin-Etsu Chemical Co., Ltd.) was deposited thereon to a thickness of 40 nm. On this substrate for trilayer process, each of the resist compositions R-1 to R-56 was spin coated and baked on a hot plate at 100° C. for 60 seconds, forming a resist film of 90 nm thick. Using an ArF excimer laser immersion lithography scanner (NSR-610C by Nikon Corp., NA 1.30, a 0.90/0.70, annular illumination), the resist film was exposed through a 6% halftone phase shift mask in a sufficient dose to form a hole pattern having a pitch of 150 nm and a size of 50 nm, and baked (PEE) at 100° C. for 60 seconds. Immediately after the PEE (no delay, PPD=0 h), the wafer was puddle developed in n-butyl acetate for 30 seconds to form a hole pattern having a pitch of 150 nm and a size of 50 nm. In another run, the wafer which had been treated under the same conditions as above until the end of PEE was held for 6 hours (PPD=6 h) before it was developed in n-butyl acetate. The wafers of PPD=0 h and 6 h were observed under CD-SEM (CG-4000 by Hitachi, Ltd.), from which CD shrinkage amount and CD variation were determined. The results are shown in Tables 7 and 8.

TABLE 7

| | Resist composition | CD at PPD = 0 h (nm) | CD variation at PPD = 0 h (3σ, nm) | CD at PPD = 6 h (nm) | CD variation at PPD = 6 h (3σ, nm) | ΔPPD CD (nm) |
|---|---|---|---|---|---|---|
| Example 2-1 | R-1 | 50.2 | 6.0 | 46.6 | 5.8 | 3.6 |
| 2-2 | R-2 | 51.4 | 6.4 | 49.2 | 6.2 | 2.2 |

TABLE 7-continued

| | Resist composition | CD at PPD = 0 h (nm) | CD variation at PPD = 0 h (3σ, nm) | CD at PPD = 6 h (nm) | CD variation at PPD = 6 h (3σ, nm) | ΔPPD CD (nm) |
|---|---|---|---|---|---|---|
| 2-3 | R-3 | 49.9 | 6.5 | 48.2 | 6.3 | 1.7 |
| 2-4 | R-4 | 48.6 | 6.4 | 46.8 | 6.2 | 1.8 |
| 2-5 | R-5 | 50.5 | 6.3 | 48.9 | 6.1 | 1.6 |
| 2-6 | R-6 | 48.4 | 6.5 | 46.5 | 6.3 | 1.9 |
| 2-7 | R-7 | 50.1 | 6.3 | 48.6 | 6.2 | 1.5 |
| 2-8 | R-8 | 51.1 | 6.4 | 49.4 | 6.3 | 1.7 |
| 2-9 | R-9 | 49.5 | 6.1 | 47.9 | 6.0 | 1.6 |
| 2-10 | R-10 | 50.0 | 6.2 | 48.2 | 6.1 | 1.8 |
| 2-11 | R-11 | 52.2 | 6.3 | 50.4 | 6.1 | 1.8 |
| 2-12 | R-12 | 51.7 | 6.4 | 50.0 | 6.2 | 1.7 |
| 2-13 | R-13 | 50.5 | 6.6 | 48.6 | 6.4 | 1.9 |
| 2-14 | R-14 | 48.7 | 6.7 | 47.0 | 6.7 | 1.7 |
| 2-15 | R-15 | 50.3 | 6.5 | 48.6 | 6.4 | 1.7 |
| 2-16 | R-16 | 49.7 | 5.7 | 48.1 | 5.5 | 1.6 |
| 2-17 | R-17 | 48.2 | 5.8 | 46.2 | 5.7 | 2.0 |
| 2-18 | R-18 | 50.2 | 5.8 | 48.0 | 5.7 | 2.2 |
| 2-19 | R-19 | 51.3 | 6.0 | 49.4 | 5.8 | 1.9 |
| 2-20 | R-20 | 52.4 | 6.1 | 50.6 | 5.9 | 1.8 |
| 2-21 | R-21 | 49.4 | 6.3 | 47.4 | 6.2 | 2.0 |
| 2-22 | R-22 | 50.0 | 6.4 | 48.3 | 6.3 | 1.7 |
| 2-23 | R-23 | 48.7 | 5.6 | 47.4 | 5.5 | 1.3 |
| 2-24 | R-24 | 52.2 | 5.5 | 51.0 | 5.4 | 1.2 |
| 2-25 | R-25 | 50.3 | 6.2 | 46.4 | 6.0 | 3.9 |
| 2-26 | R-26 | 48.1 | 6.7 | 45.7 | 6.5 | 2.4 |
| 2-27 | R-27 | 53.1 | 6.3 | 51.6 | 6.1 | 1.5 |
| 2-28 | R-28 | 50.7 | 5.9 | 49.0 | 5.7 | 1.7 |
| 2-29 | R-29 | 48.4 | 6.4 | 46.0 | 6.2 | 2.4 |
| 2-30 | R-30 | 51.0 | 5.8 | 49.6 | 5.6 | 1.4 |
| 2-31 | R-31 | 50.2 | 6.3 | 46.5 | 6.1 | 3.7 |
| 2-32 | R-32 | 47.9 | 6.7 | 45.4 | 6.5 | 2.5 |
| 2-33 | R-33 | 51.2 | 6.4 | 49.5 | 6.2 | 1,7 |
| 2-34 | R-34 | 50.4 | 6.0 | 48.6 | 5.9 | 1.8 |
| 2-35 | R-35 | 48.8 | 6.4 | 46.9 | 6.2 | 1.9 |
| 2-36 | R-36 | 49.3 | 5.9 | 48.0 | 5.8 | 1.3 |

TABLE 8

| | | Resist composition | CD at PPD = 0 h (nm) | CD variation at PPD = 0 h (3σ, nm) | CD at PPD = 6 h (nm) | CD variation at PPD = 6 h (3σ, nm) | ΔPPD CD (nm) |
|---|---|---|---|---|---|---|---|
| Comparative Example | 2-1 | R-33 | 49.5 | 6.1 | 39.0 | 5.5 | 10.5 |
| | 2-2 | R-34 | 51.0 | 6.6 | 45.8 | 6.9 | 5.2 |
| | 2-3 | R-35 | 52.2 | 6.4 | 49.0 | 6.6 | 3.2 |
| | 2-4 | R-36 | 48.2 | 6.2 | 44.5 | 6.4 | 3.7 |
| | 2-5 | R-37 | 53.3 | 6.3 | 49.2 | 6.5 | 4.1 |
| | 2-6 | R-38 | 51.5 | 6.1 | 46.3 | 6.4 | 5.2 |
| | 2-7 | R-39 | 47.7 | 6.2 | 44.5 | 6.4 | 3.2 |
| | 2-8 | R-40 | 48.4 | 6.5 | 44.6 | 6.7 | 3.8 |
| | 2-9 | R-41 | 53.7 | 6.4 | 49.5 | 6.6 | 4.2 |
| | 2-10 | R-42 | 49.3 | 6.2 | 44.9 | 6.4 | 4.4 |
| | 2-11 | R-43 | 48.9 | 6.0 | 44.8 | 6.2 | 4.1 |
| | 2-12 | R-44 | 52.7 | 6.3 | 48.4 | 6.6 | 4.3 |
| | 2-13 | R-45 | 51.6 | 6.4 | 47.1 | 6.7 | 4.5 |
| | 2-14 | R-46 | 49.7 | 6.6 | 45.4 | 5.9 | 4.3 |
| | 2-15 | R-47 | 50.2 | 6.6 | 45.5 | 6.9 | 4.7 |
| | 2-16 | R-48 | 50.0 | 5.9 | 46.0 | 6.2 | 4.0 |
| | 2-17 | R-49 | 48.4 | 6.0 | 43.2 | 6.2 | 5.2 |
| | 2-18 | R-50 | 49.3 | 5.9 | 44.3 | 6.2 | 5.0 |
| | 2-19 | R-51 | 50.3 | 5.9 | 45.5 | 6.2 | 4.8 |
| | 2-20 | R-52 | 49.4 | 6.2 | 44.8 | 6.5 | 4.6 |
| | 2-21 | R-53 | 52.2 | 6.3 | 47.1 | 6.6 | 5.1 |
| | 2-22 | R-54 | 48.9 | 6.2 | 44.1 | 6.4 | 4.8 |
| | 2-23 | R-55 | 51.4 | 5.5 | 47.5 | 5.8 | 3.9 |
| | 2-24 | R-56 | 50.6 | 5.7 | 46.9 | 6.0 | 3.7 |

It is evident from Tables 7 and 8 that when the PPD inhibitor is added, the difference (ΔPPD CD) between CD at PPD=0 h and CD at PPD=6 h is reduced. It has been demonstrated that the PPD inhibitor is effective for mitigating the influence on CD shrinkage and patter profile of a delay (PPD) from post-exposure bake to organic solvent development.

While the invention has been illustrated and described in typical embodiments, it is not intended to be limited to the details shown. Any modified embodiments having substantially the same features and achieving substantially the same results as the technical idea disclosed herein are within the spirit and scope of the invention.

Japanese Patent Application No. 2015-091338 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (A) a compound, (B) a resin adapted to change its solubility in an organic solvent base developer under the action of acid, and (C) a photoacid generator, wherein the compound (A) is selected from the group consisting of the following formulae:

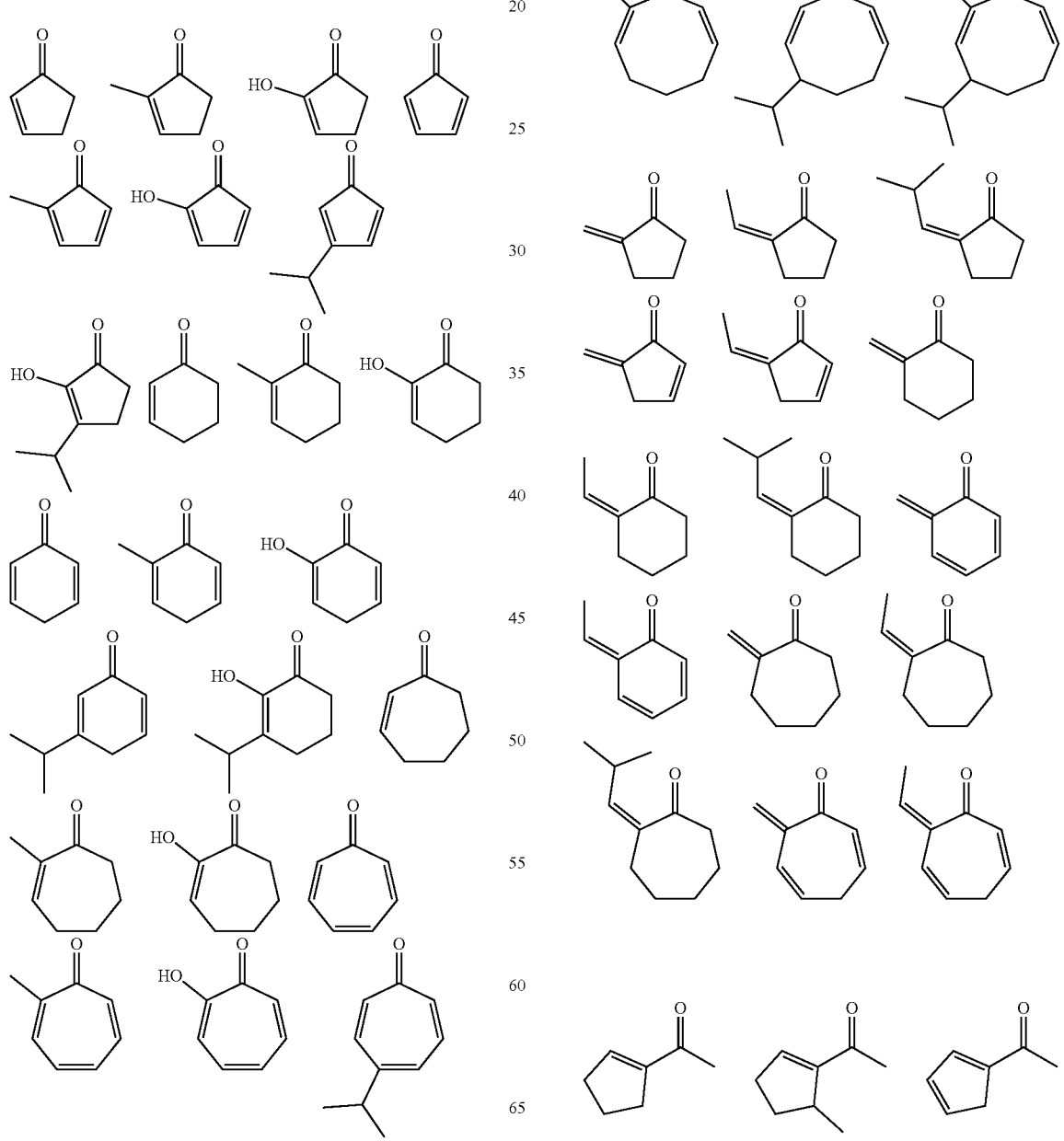

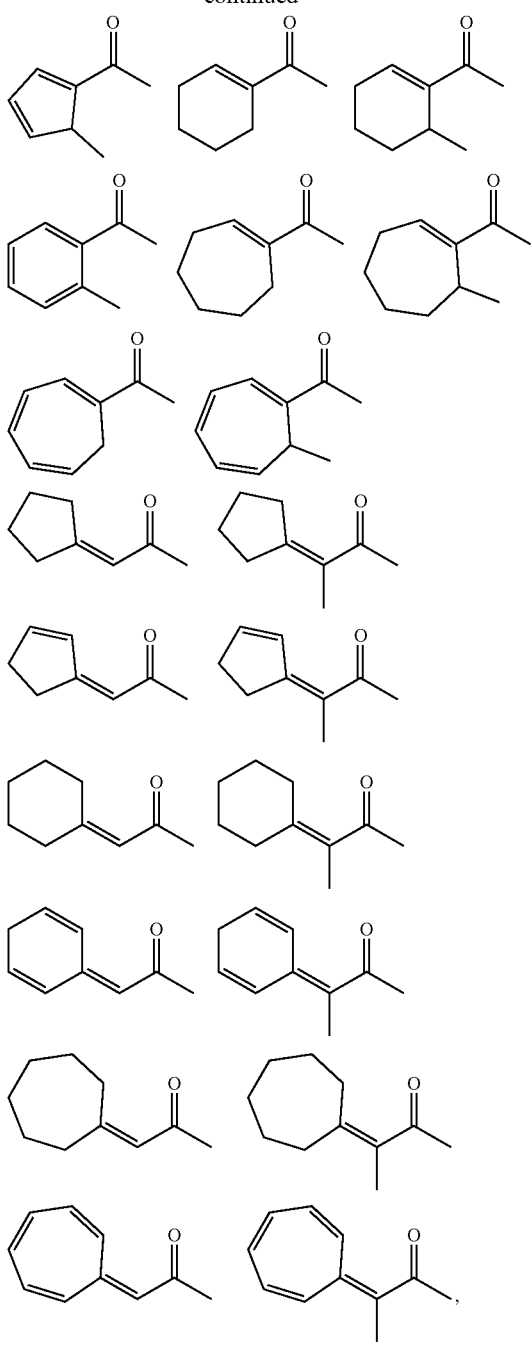

the resin (B) comprising recurring units having the formula (2) and recurring units having the formula (3):

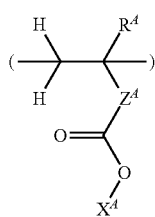
(2)

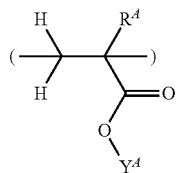
(3)

wherein $R^A$ is hydrogen, fluorine, methyl or trifluoromethyl, $Z^A$ is a single bond, phenylene, naphthylene, or —C(=O)—O—Z'—, Z' is a straight, branched or cyclic $C_1$-$C_{10}$ alkylene group which may contain a hydroxy moiety, ether bond, ester bond or lactone ring, or phenylene or naphthylene group, $X^A$ is an acid labile group, and $Y^A$ is hydrogen or a polar group having at least one structure selected from the group consisting of hydroxy, cyano, carbonyl, carboxyl, ether bond, ester bond, sulfonic acid ester bond, carbonate bond, lactone ring, sultone ring, and carboxylic acid anhydride.

2. The resist composition of claim 1 wherein the photoacid generator (C) has the formula (4) or (5):

$$M^+X^- \quad (4)$$

wherein $M^+$ is a sulfonium cation of the formula (4a) or iodonium cation of the formula (4b):

(4a)

(4b)

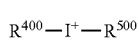

wherein $R^{100}$, $R^{200}$ and $R^{300}$ are each independently a straight, branched or cyclic $C_1$-$C_{20}$ monovalent hydrocarbon group which may contain a heteroatom, any two or more of $R^{100}$, $R^{200}$ and $R^{300}$ may bond together to form a ring with the sulfur atom to which they are attached, $R^{400}$ and $R^{500}$ are each independently a straight, branched or cyclic $C_1$-$C_{20}$ monovalent hydrocarbon group which may contain a heteroatom, and $X^-$ is an anion selected from the formulae (4c) to (4f):

$$R^{fa}—CF_2—SO_3^- \quad (4c)$$

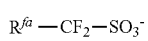
(4d)

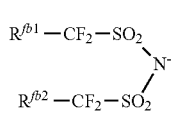

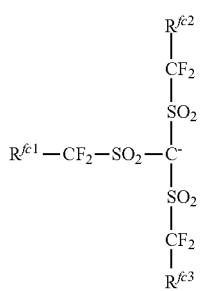
(4e)

-continued

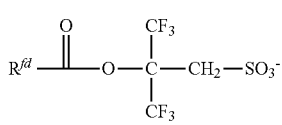
(4f)

wherein $R^{fa}$, $R^{fb1}$, $R^{fb2}$, $R^{fc1}$, $R^{fc2}$ and $R^{fc3}$ are each independently fluorine or a straight, branched or cyclic $C_1$-$C_{40}$ monovalent hydrocarbon group which may contain a heteroatom, or a pair of $R^{fb1}$ and $R^{fb2}$, or $R^{fc1}$ and $R^{fc2}$ may bond together to form a ring with the carbon atom to which they are attached and any intervening atoms, $R^{fd}$ is a straight, branched or cyclic $C_1$-$C_{40}$ monovalent hydrocarbon group which may contain a heteroatom,

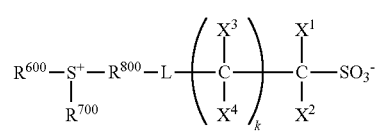
(5)

wherein $R^{600}$ and $R^{700}$ are each independently a straight, branched or cyclic $C_1$-$C_{20}$ monovalent hydrocarbon group which may contain a heteroatom, $R^{800}$ is a straight, branched or cyclic $C_1$-$C_{20}$ divalent hydrocarbon group which may contain a heteroatom, any two or more of $R^{600}$, $R^{700}$ and $R^{800}$ may bond together to form a ring with the sulfur atom to which they are attached, L is a single bond or linking group, $X^1$ and $X^2$ are each independently fluorine or trifluoromethyl, $X^3$ and $X^4$ are each independently hydrogen, fluorine or trifluoromethyl, and k is an integer of 0 to 3.

3. The resist composition of claim 1, further comprising (D) an organic solvent.

4. The resist composition of claim 1, further comprising (E) a hydrophobic fluoro-resin.

5. The resist composition of claim 1, further comprising (F) at least one compound selected from the formulae (6a), (6b) and (6c):

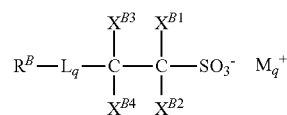
(6a)

Ar—SO$_3^-$ M$_q^+$ (6b)

$R^B$—CO$_2^-$ M$_q^+$ (6c)

wherein $M_q^+$ is a sulfonium cation of the formula (4a), iodonium cation of the formula (4b), or ammonium cation, $R^B$ is a straight, branched or cyclic $C_1$-$C_{40}$ monovalent hydrocarbon group which may contain a heteroatom, $X^{B1}$, $X^{B2}$, $X^{B3}$ and $X^{B4}$ are each independently hydrogen or a straight, branched or cyclic $C_1$-$C_{40}$ monovalent hydrocarbon group which may contain a heteroatom, exclusive of trifluoromethyl, $L_q$ is a single bond or linking group, and Ar is an optionally substituted aromatic ring,

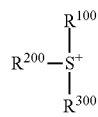
(4a)

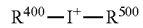
(4b)

wherein $R^{100}$, $R^{200}$ and $R^{300}$ are each independently a straight, branched or cyclic $C_1$-$C_{20}$ monovalent hydrocarbon group which may contain a heteroatom, any two or more of $R^{100}$, $R^{200}$ and $R^{300}$ may bond together to form a ring with the sulfur atom to which they are attached, $R^{400}$ and $R^{500}$ are each independently a straight, branched or cyclic $C_1$-$C_{20}$ monovalent hydrocarbon group which may contain a heteroatom.

6. The resist composition of claim 1, further comprising at least one basic compound selected from the group consisting of primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

7. A process for forming a pattern, comprising the steps of coating the resist composition of claim 1 onto a substrate, prebaking the coating to form a resist film, exposing the resist film to ArF excimer laser, EB or EUV, baking, and developing the resist film in a developer.

8. The process of claim 7 wherein the exposure step is performed by immersion lithography while keeping a liquid having a refractive index of at least 1.0 between the resist film and a projection lens.

9. The process of claim 8, further comprising the step of coating a protective film on the resist film, wherein the liquid is kept between the protective film and the projection lens.

10. The process of claim 7, wherein the developer comprises an organic solvent and the development step is to form a negative pattern.

11. The process of claim 10 wherein the organic solvent is at least one solvent selected from the group consisting of
2-octanone, 3-octanone, 4-octanone, 2-nonanone, 3-nonanone,
4-nonanone, 5-nonanone, 2-heptanone, 3-heptanone, 4-heptanone,
2-hexanone, 3-hexanone, diisobutyl ketone,
2-methylcyclohexanone, 3-methylcyclohexanone,
4-methylcyclohexanone, 2-ethylcyclohexanone,
3-ethylcyclohexanone, 4-ethylcyclohexanone, acetophenone,
2'-methylacetophenone, 4'-methylacetophenone,
2'-ethylacetophenone, 4'-ethylacetophenone,
ethyl n-butyl ketone, di-n-butyl ketone, propyl acetate,
butyl acetate, isobutyl acetate, pentyl acetate,
isopentyl acetate, butenyl acetate, phenyl acetate,
propyl formate, butyl formate, isobutyl formate,
pentyl formate, isopentyl formate, methyl valerate,
methyl pentenoate, methyl crotonate, ethyl crotonate,
methyl propionate, ethyl propionate, ethyl 3-ethoxypropionate,
methyl lactate, ethyl lactate, propyl lactate, butyl lactate,
isobutyl lactate, pentyl lactate, isopentyl lactate, methyl 2-hydroxyisobutyrate, ethyl 2-hydroxyisobutyrate,
methyl benzoate, ethyl benzoate, benzyl acetate,
methyl phenylacetate, benzyl formate, phenylethyl formate,
methyl 3-phenylpropionate, benzyl propionate,
ethyl phenylacetate, 2-phenylethyl acetate,
2-methylbutyl acetate, hexyl acetate, 2-ethylhexyl acetate,
cyclohexyl acetate, methylcyclohexyl acetate, hexyl formate,
ethyl valerate, propyl valerate, isopropyl valerate,
butyl valerate, isobutyl valerate, t-butyl valerate,
pentyl valerate, isopentyl valerate, ethyl isovalerate,
propyl isovalerate, isopropyl isovalerate, butyl isovalerate,
isobutyl isovalerate, t-butyl isovalerate,
isopentyl isovalerate, ethyl 2-methylvalerate,
butyl 2-methylvalerate, ethyl pivalate, propyl pivalate,
isopropyl pivalate, butyl pivalate, t-butyl pivalate,
ethyl pentenoate, propyl pentenoate, isopropyl pentenoate,
butyl pentenoate, t-butyl pentenoate, propyl crotonate,
isopropyl crotonate, butyl crotonate, t-butyl crotonate,
butyl propionate, isobutyl propionate, t-butyl propionate,
ethyl hexanoate, allyl hexanoate, propyl butyrate,
butyl butyrate, isobutyl butyrate, 3-methylbutyl butyrate,
t-butyl butyrate, ethyl 2-methylbutyrate,
isopropyl 2-methylbutyrate, propyl benzoate, butyl benzoate,
1-butyl alcohol, 2-butyl alcohol, isobutyl alcohol,
t-butyl alcohol, 1-pentanol, 2-pentanol, 3-pentanol,
t-pentyl alcohol, neopentyl alcohol, 2-methyl-1-butanol,
3-methyl-1-butanol, 3-methyl-3-pentanol, cyclopentanol,
1-hexanol, 2-hexanol, 3-hexanol, 2,3-dimethyl-2-butanol,
3,3-dimethyl-1-butanol, 3,3-dimethyl-2-butanol,
2,2-diethyl-1-butanol, 2-methyl-1-pentanol,
2-methyl-2-pentanol, 2-methyl-3-pentanol, 3-methyl-1-pentanol,
3-methyl-2-pentanol, 4-methyl-1-pentanol, 4-methyl-2-pentanol,
4-methyl-3-pentanol, cyclohexanol, and 1-octanol.

12. A resist composition comprising (A) a compound, (B) a resin adapted to change its solubility in an organic solvent base developer under the action of acid, and (C) a photoacid generator,
the compound (A) having the formula (1):

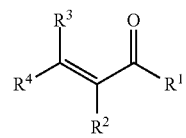

(1)

wherein $R^1$ to $R^4$ are each independently hydrogen, hydroxyl, or a straight, branched or cyclic $C_1$-$C_{20}$ monovalent hydrocarbon group which may contain a heteroatom, and $R^2$ and $R^3$ are not hydrogen at the same time,
the resin (B) comprising recurring units having the formula (2) and recurring units having the formula (3):

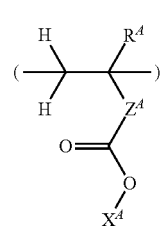

(2)

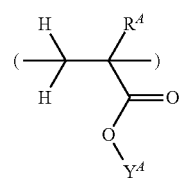

(3)

wherein $R^A$ is hydrogen, fluorine, methyl or trifluoromethyl, $Z^A$ is a single bond, phenylene, naphthylene, or —C(=O)—O—Z'—, Z' is a straight, branched or cyclic $C_1$-$C_{10}$ alkylene group which may contain a hydroxy moiety, ether bond, ester bond or lactone ring, or phenylene or naphthylene group, $X^A$ is an acid labile group, and $Y^A$ is hydrogen or a polar group having at least one structure selected from the group consisting of hydroxy, cyano, carbonyl, carboxyl, ether bond, ester bond, sulfonic acid ester bond, carbonate bond, lactone ring, sultone ring, and carboxylic acid anhydride.

* * * * *